(12) United States Patent
Ogawa et al.

(10) Patent No.: US 7,776,659 B2
(45) Date of Patent: Aug. 17, 2010

(54) SEMICONDUCTOR DEVICE MANUFACTURING METHOD

(75) Inventors: Hiroyuki Ogawa, Tokyo (JP); Hideyuki Kojima, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/627,941

(22) Filed: Nov. 30, 2009

(65) Prior Publication Data

US 2010/0136758 A1 Jun. 3, 2010

(30) Foreign Application Priority Data

Dec. 1, 2008 (JP) .............................. 2008-306677

(51) Int. Cl.
*H01L 21/82* (2006.01)
(52) U.S. Cl. ................. 438/128; 438/276; 438/381; 438/525; 257/E21.613; 257/E21.618; 257/E21.658
(58) Field of Classification Search ................. 438/329, 438/599; 257/E21.613, E21.662
See application file for complete search history.

(56) References Cited

U.S. PATENT DOCUMENTS

2004/0007729 A1 1/2004 Kokubun
2006/0009035 A1* 1/2006 Chen et al. .................. 438/684

FOREIGN PATENT DOCUMENTS

| JP | 2001-077361 A | 3/2001 |
| JP | 2004-047905 A | 2/2004 |
| JP | 2004-095385 A | 3/2004 |
| JP | 2006-147768 A | 6/2006 |

OTHER PUBLICATIONS

Y. Matsubara et al, "Fully Compatible Integration of High Density Embedded DRAM with 65nm CMOS Technology (CMOS5)", Electron Device Meeting, 2003, IEDM 2003 Technical Digest, IEEE International, Dec. 8-10, 2003, pp. 17.5.1-17.5.4.

* cited by examiner

*Primary Examiner*—Charles D Garber
*Assistant Examiner*—Cheung Lee
(74) *Attorney, Agent, or Firm*—Westerman, Hattori, Daniels & Adrian, LLP

(57) ABSTRACT

A method of manufacturing a semiconductor device having a first memory cell array region and a second memory cell array region, the method includes forming an active region on a surface layer of a semiconductor substrate, forming a first word line extending in a first direction on the gate insulating film in the first memory cell array region, and forming a second word line extending in a second direction crossing the first direction on the gate insulating film in the second memory cell array region, wherein the ion implantation into the active region is performed from a direction that is inclined from a direction vertical to the surface of the semiconductor substrate and is oblique with respect to both the first direction and the second direction.

12 Claims, 46 Drawing Sheets

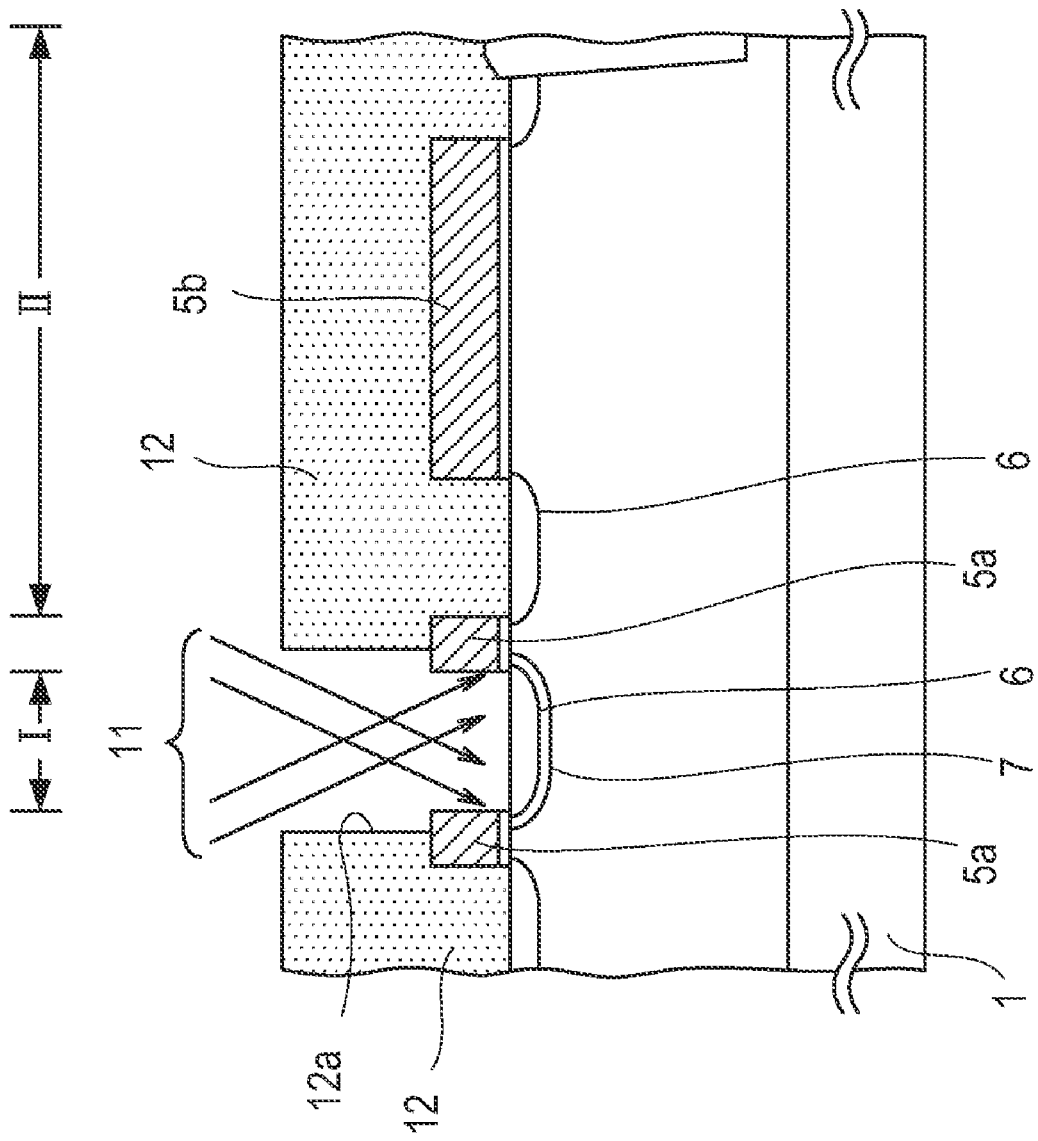

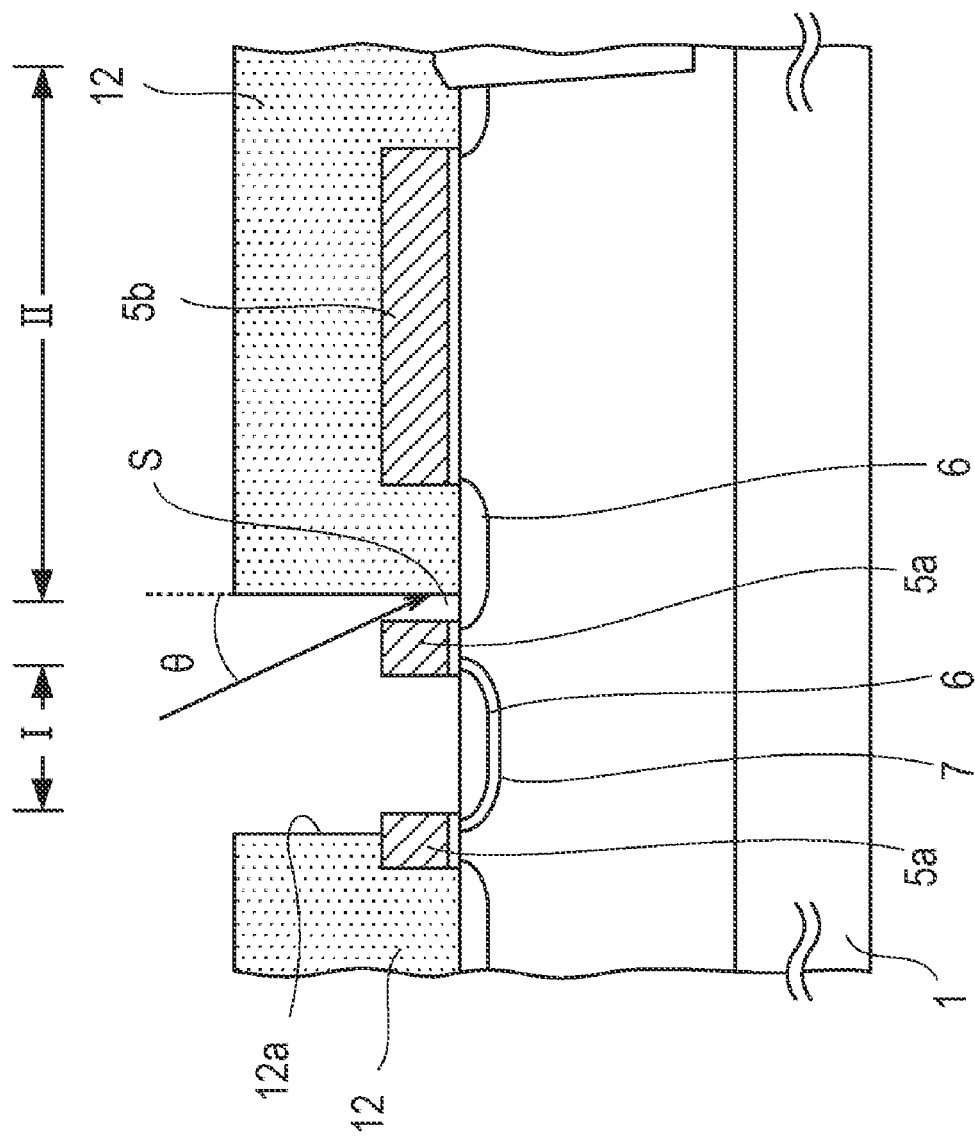

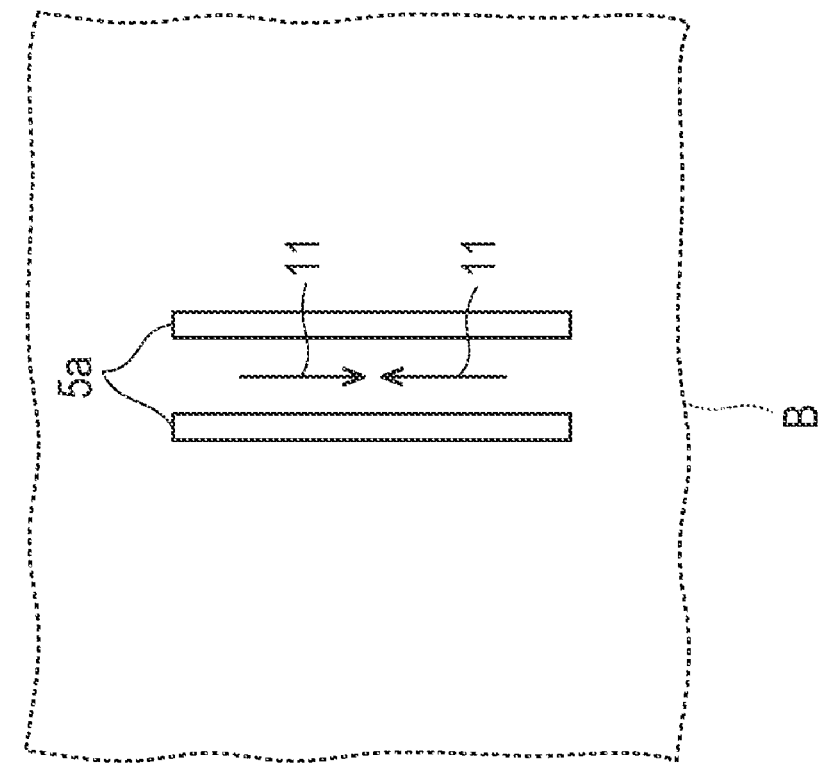
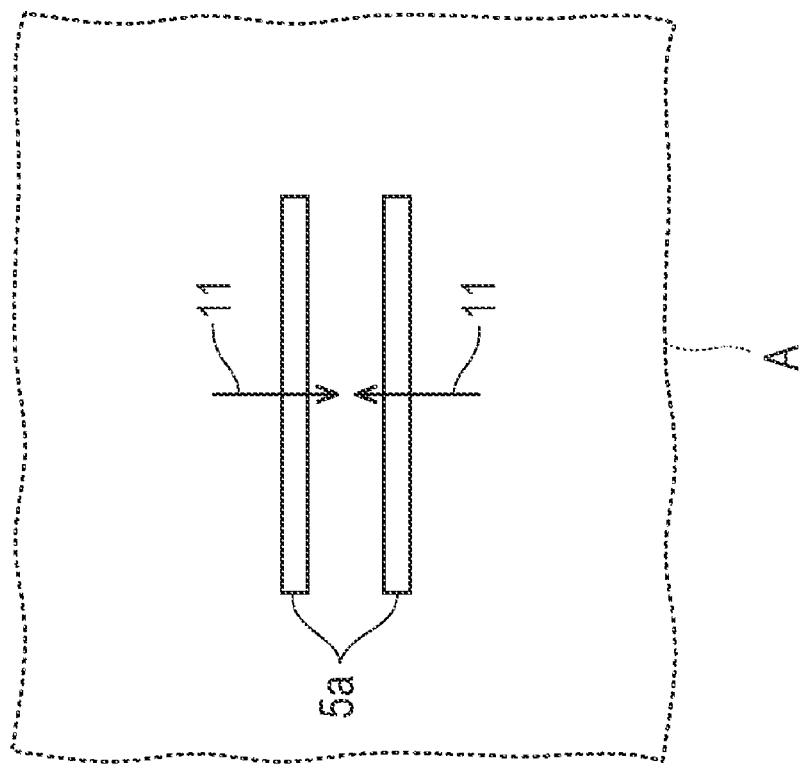

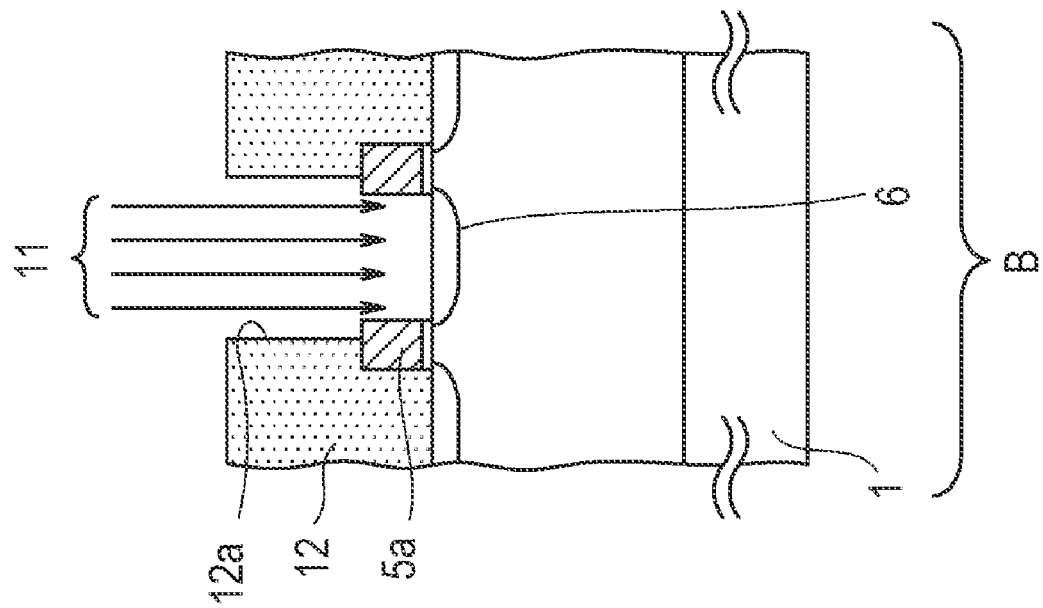
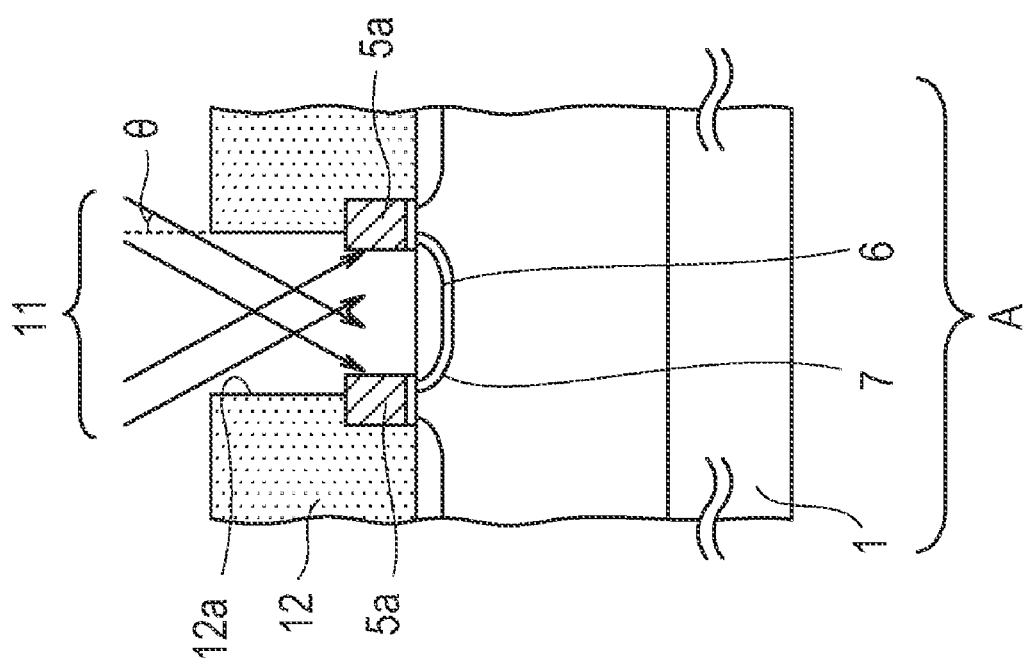

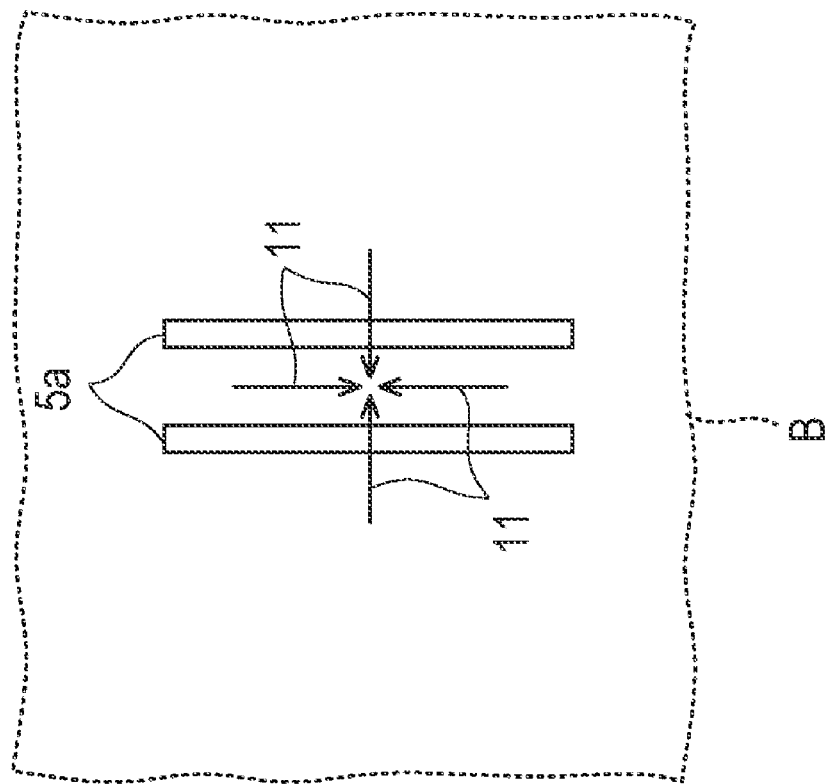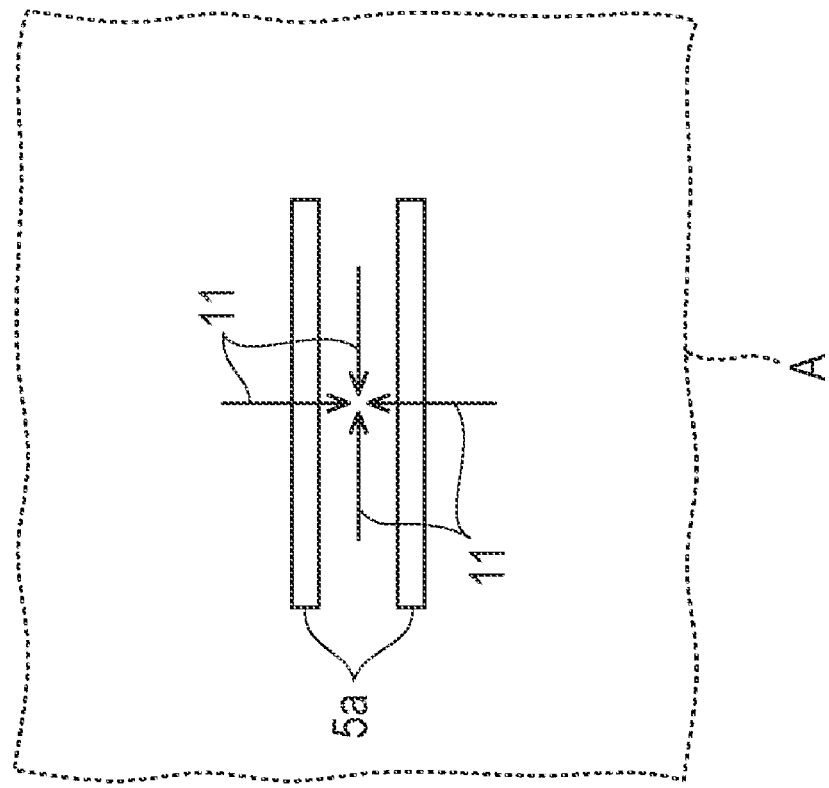

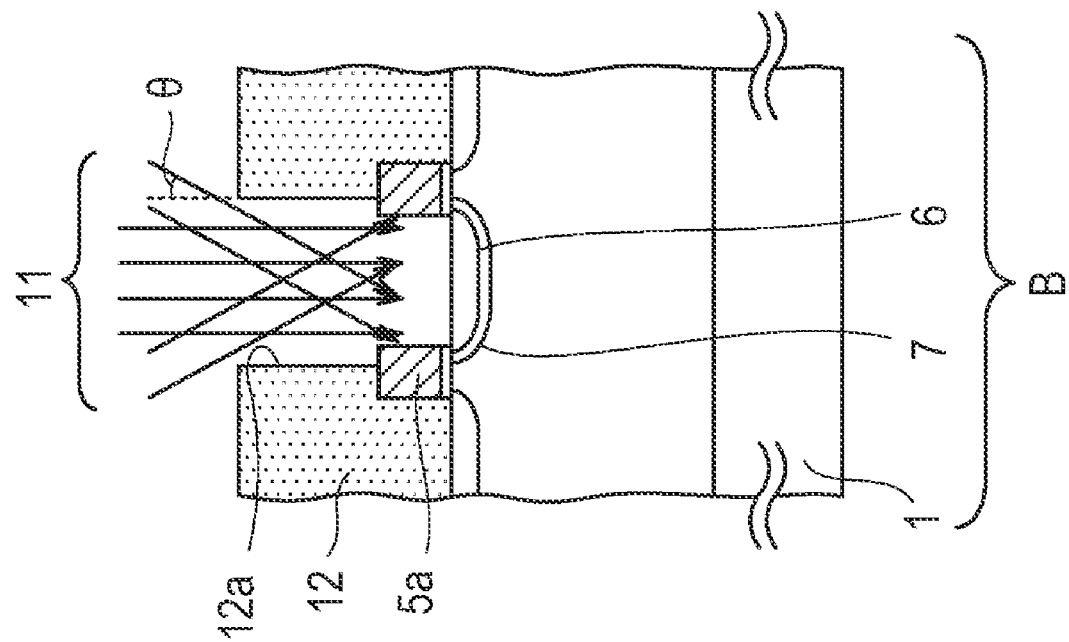
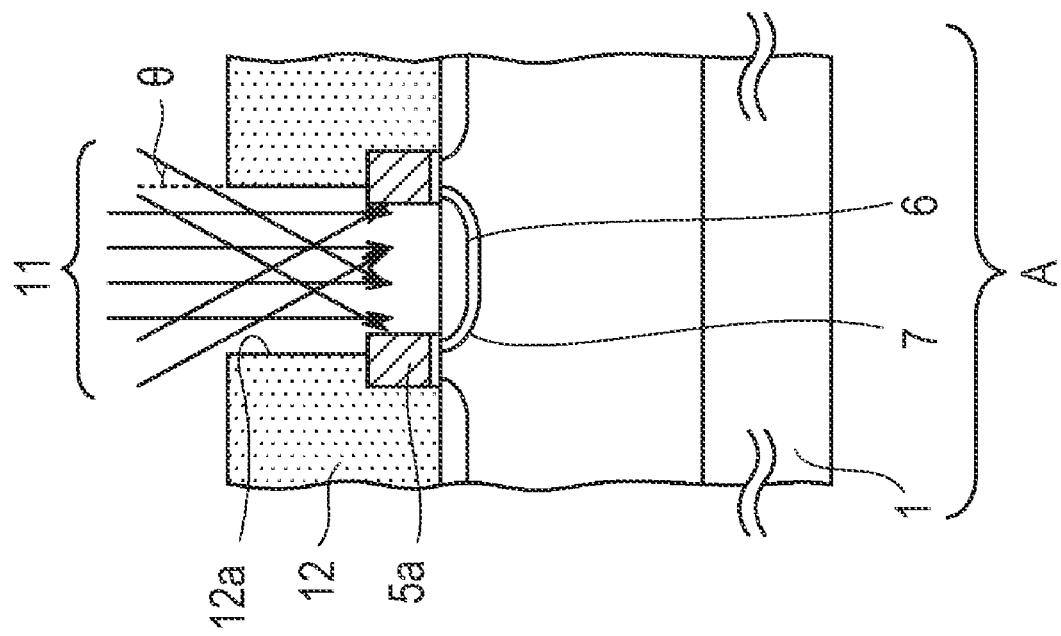

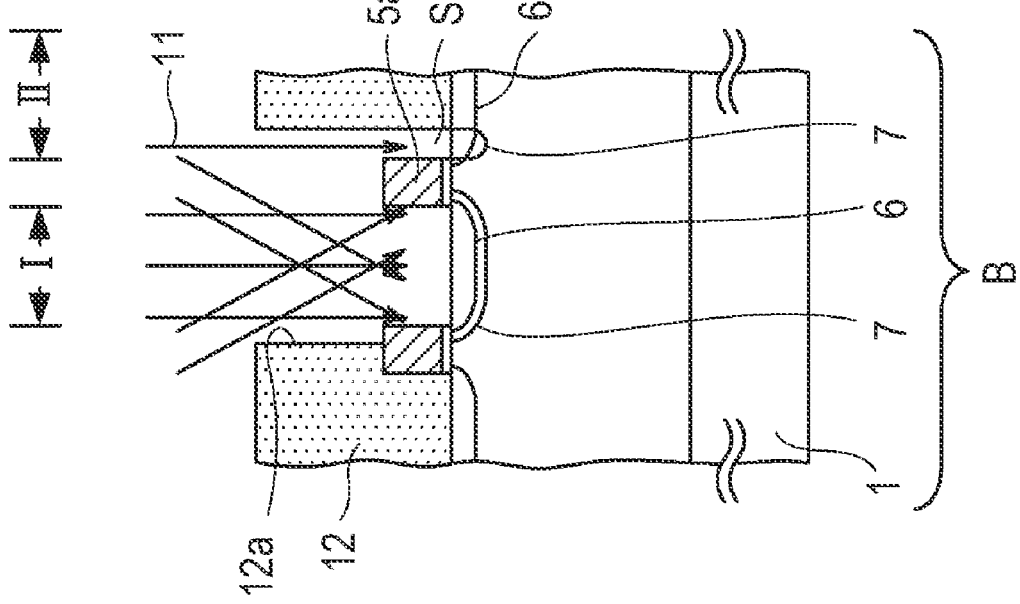
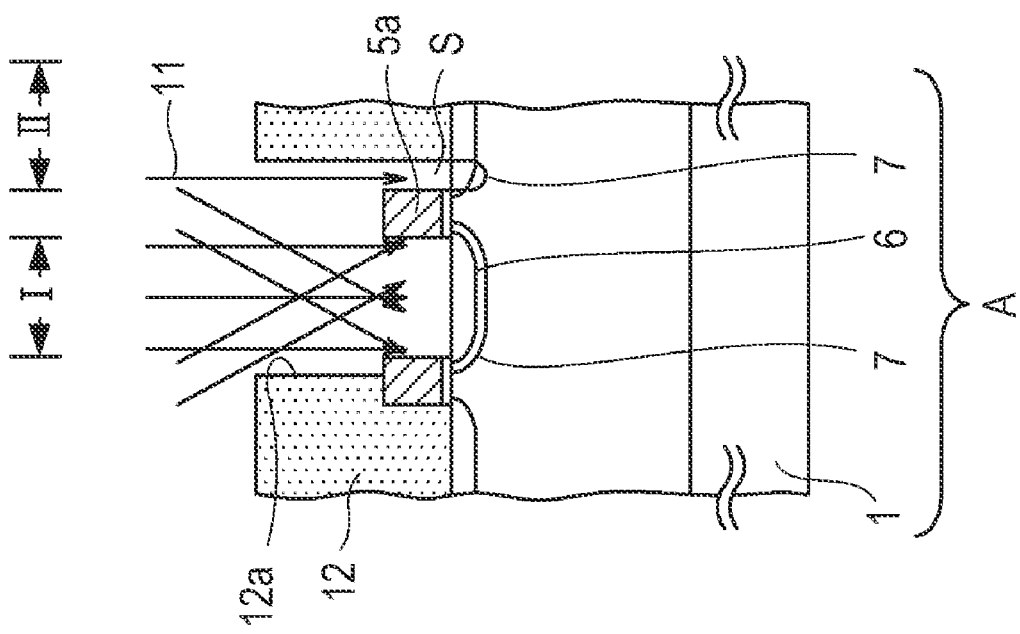

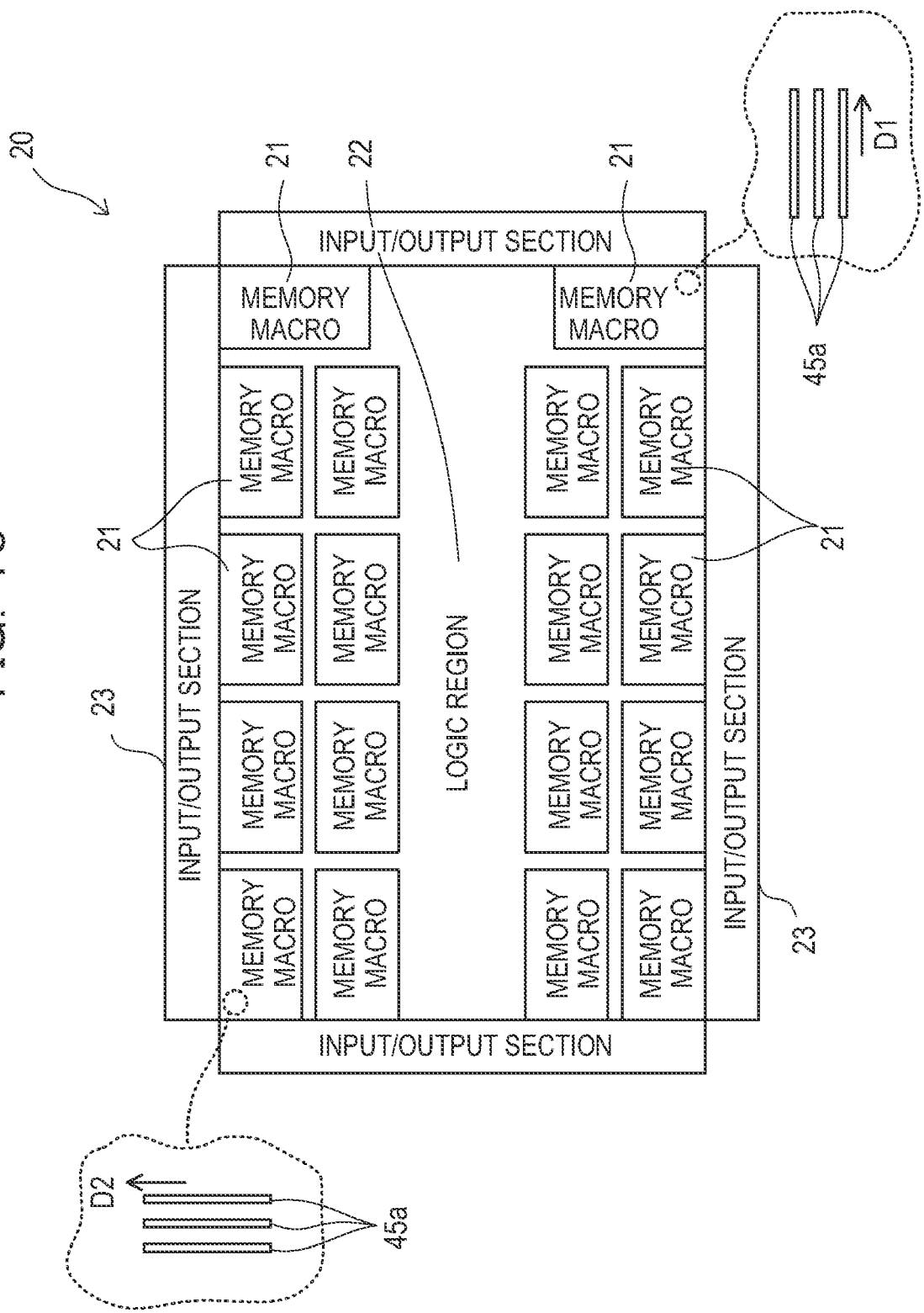

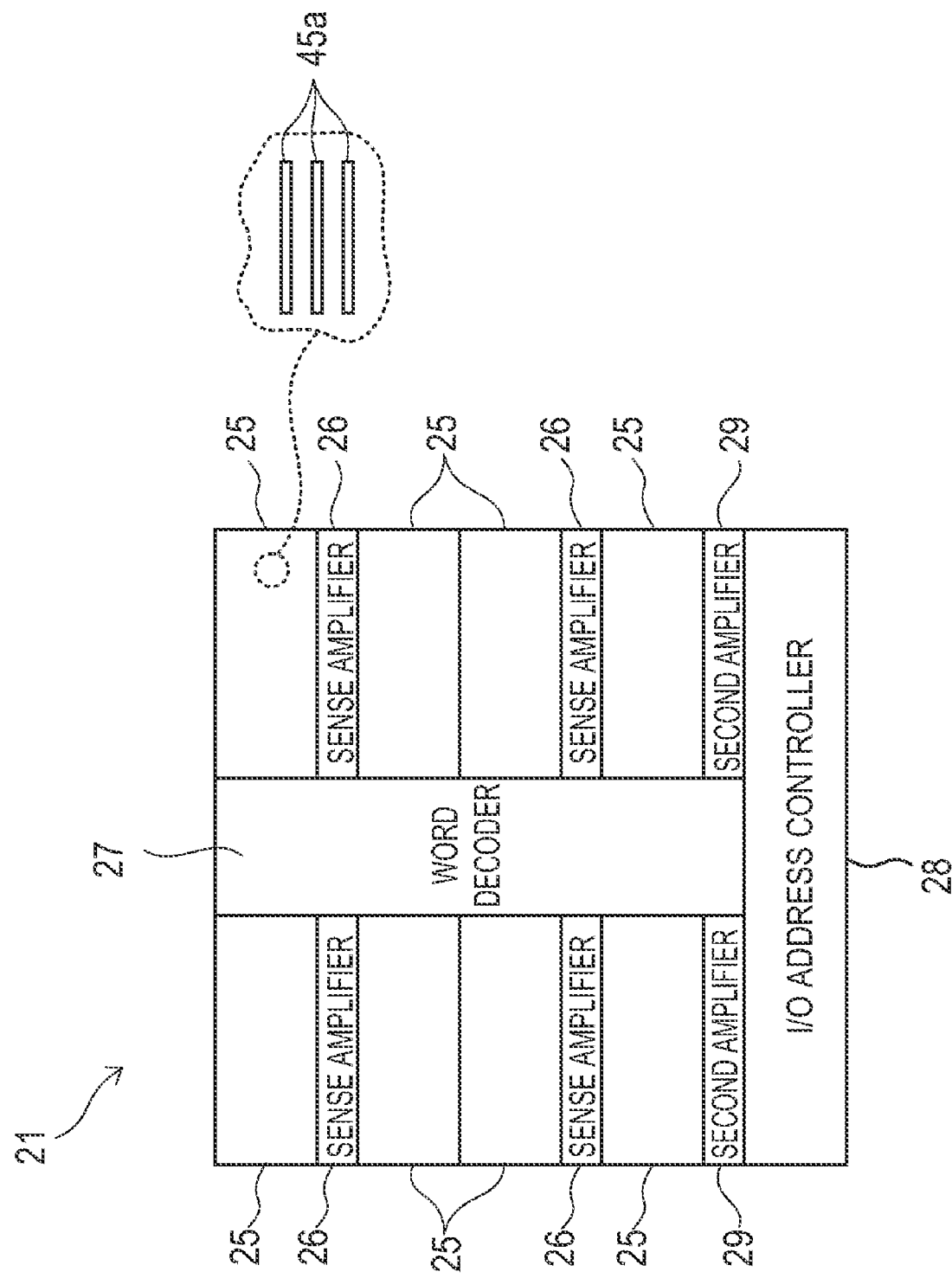

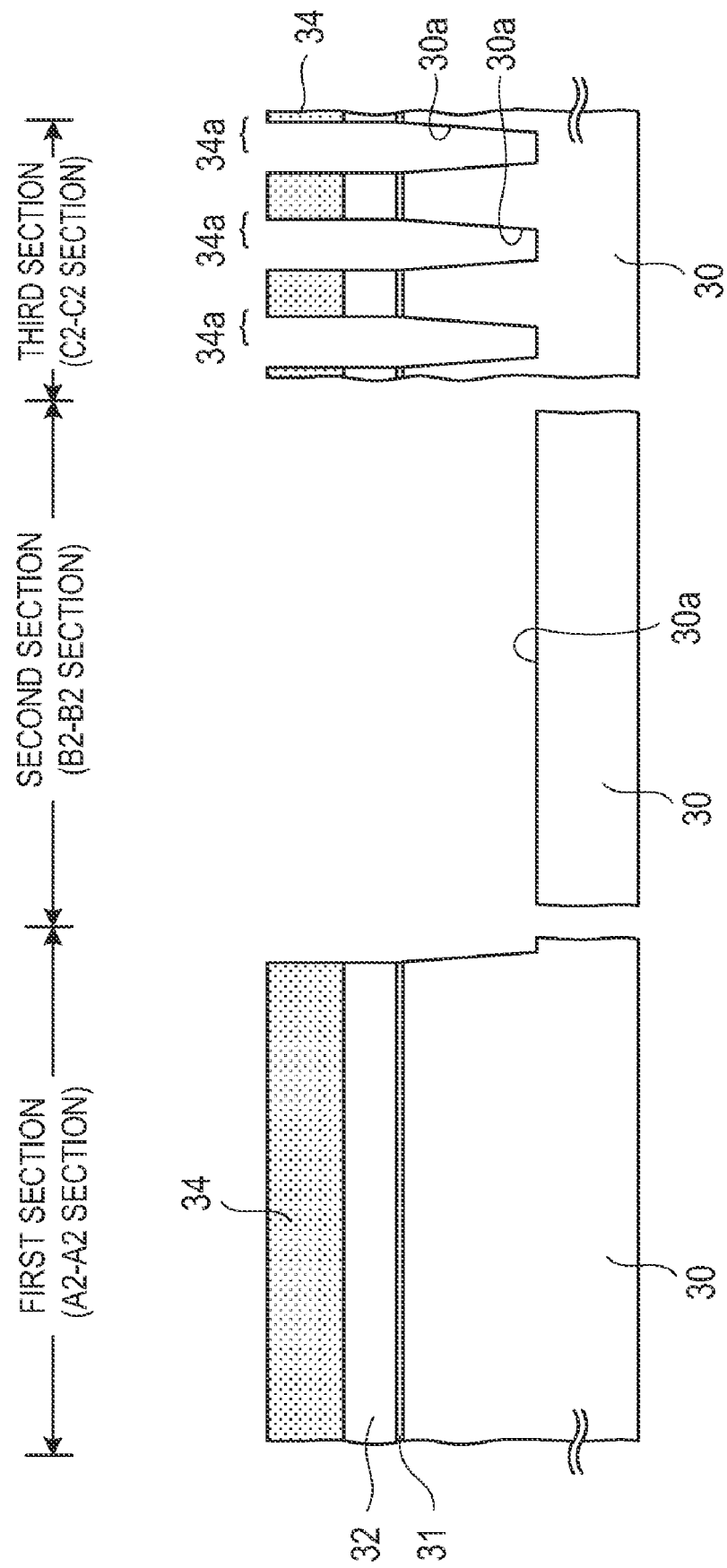

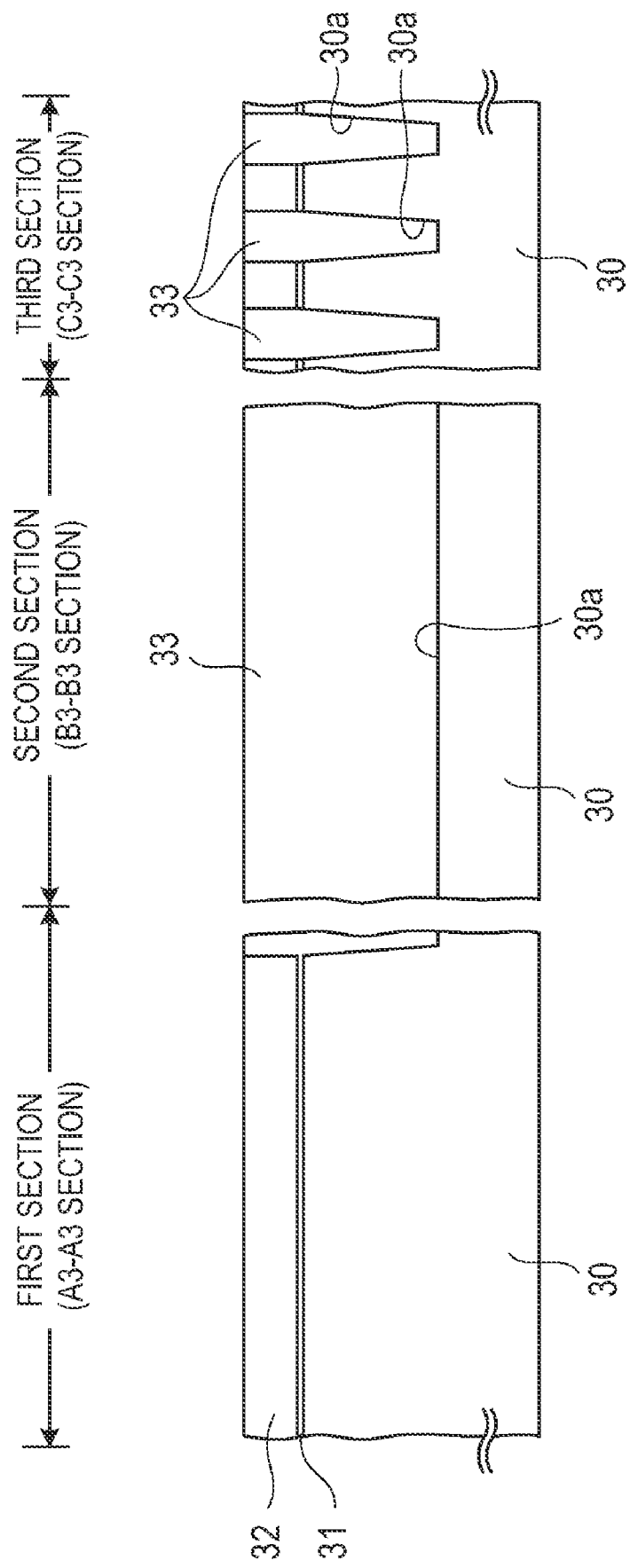

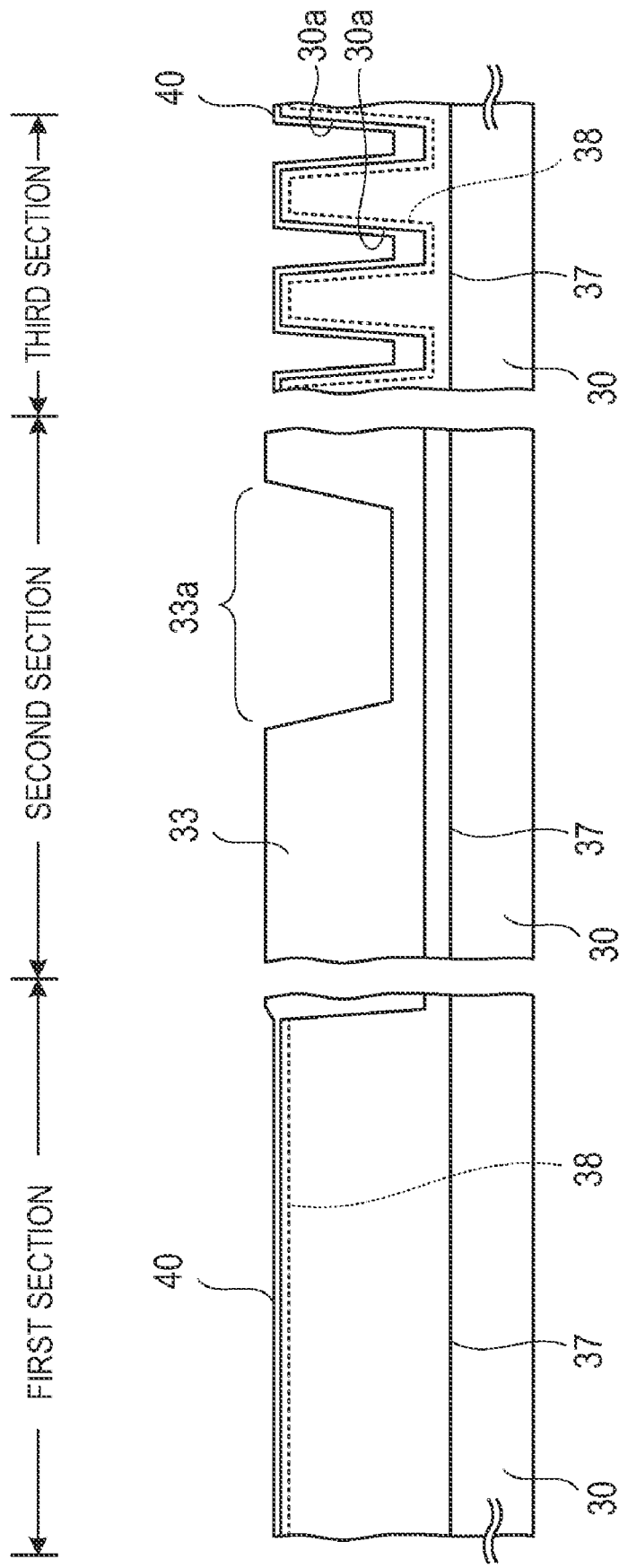

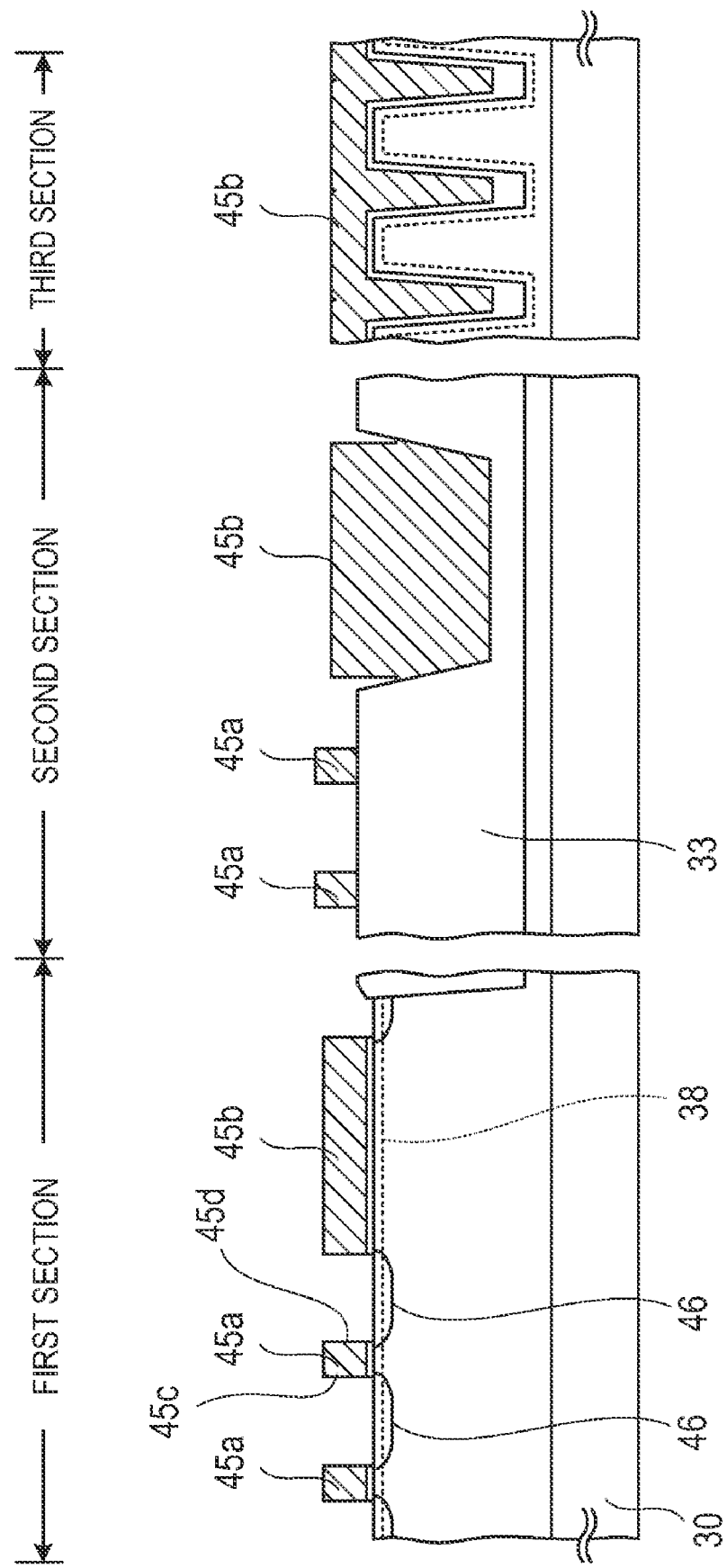

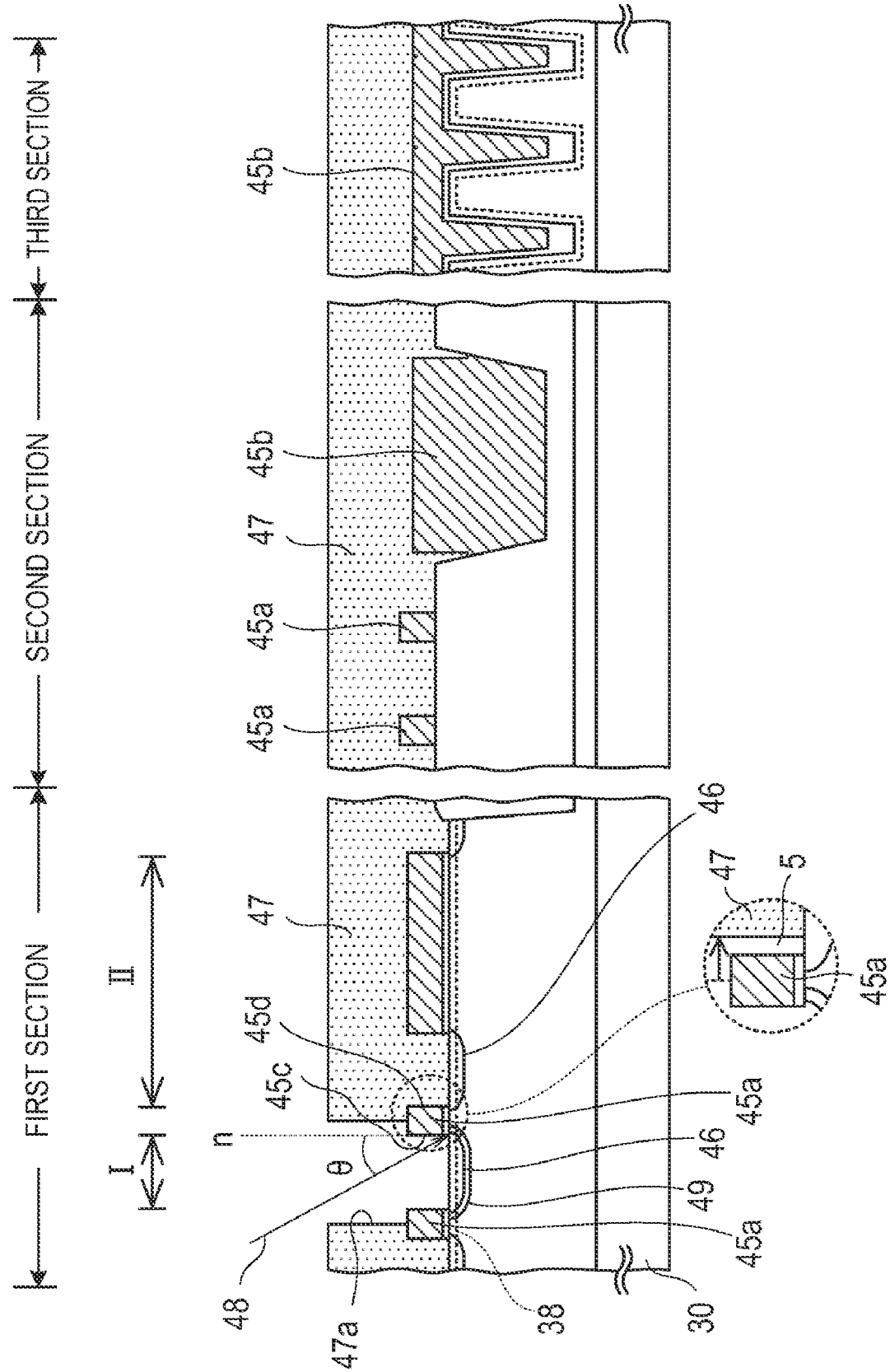

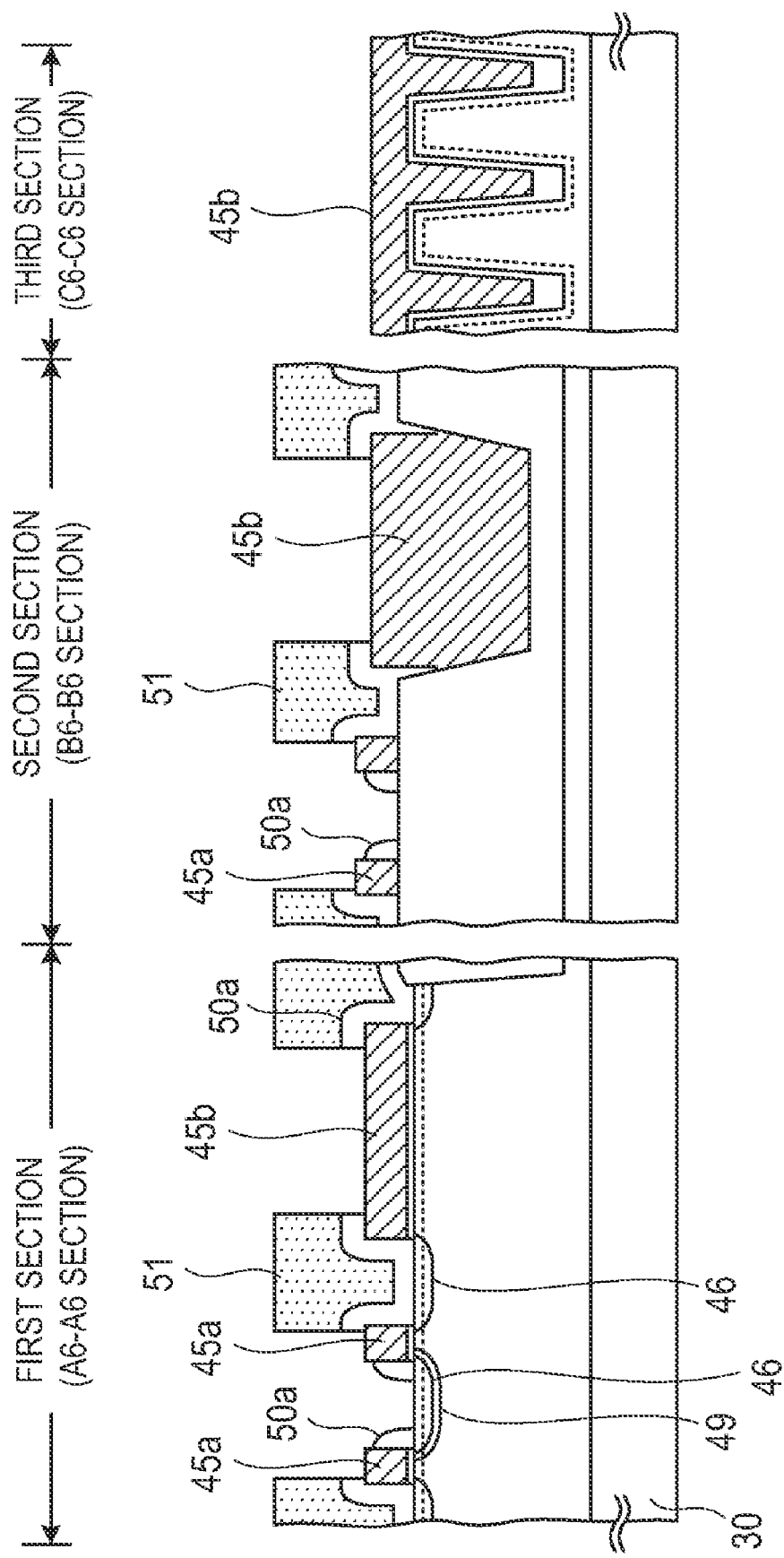

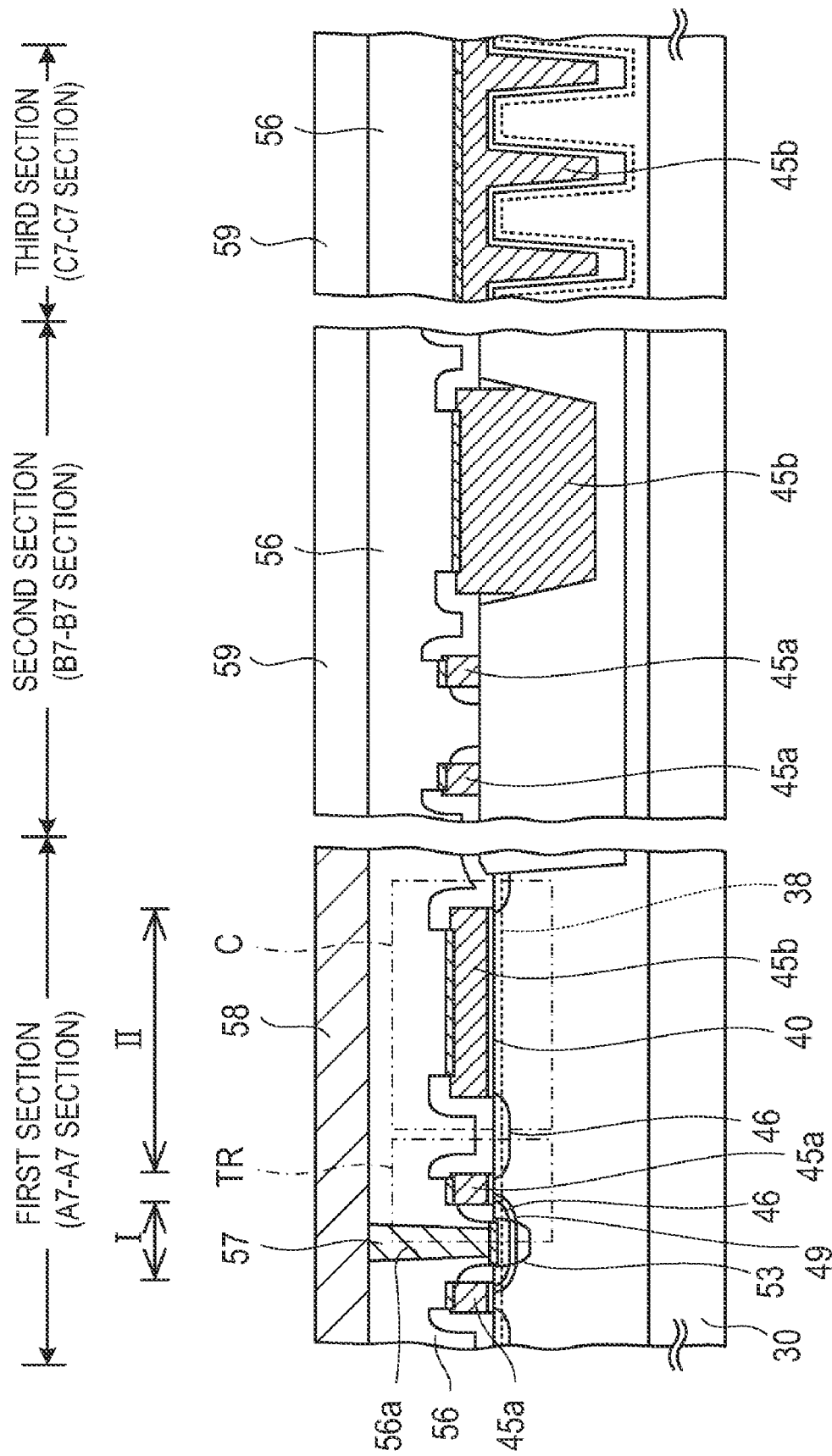

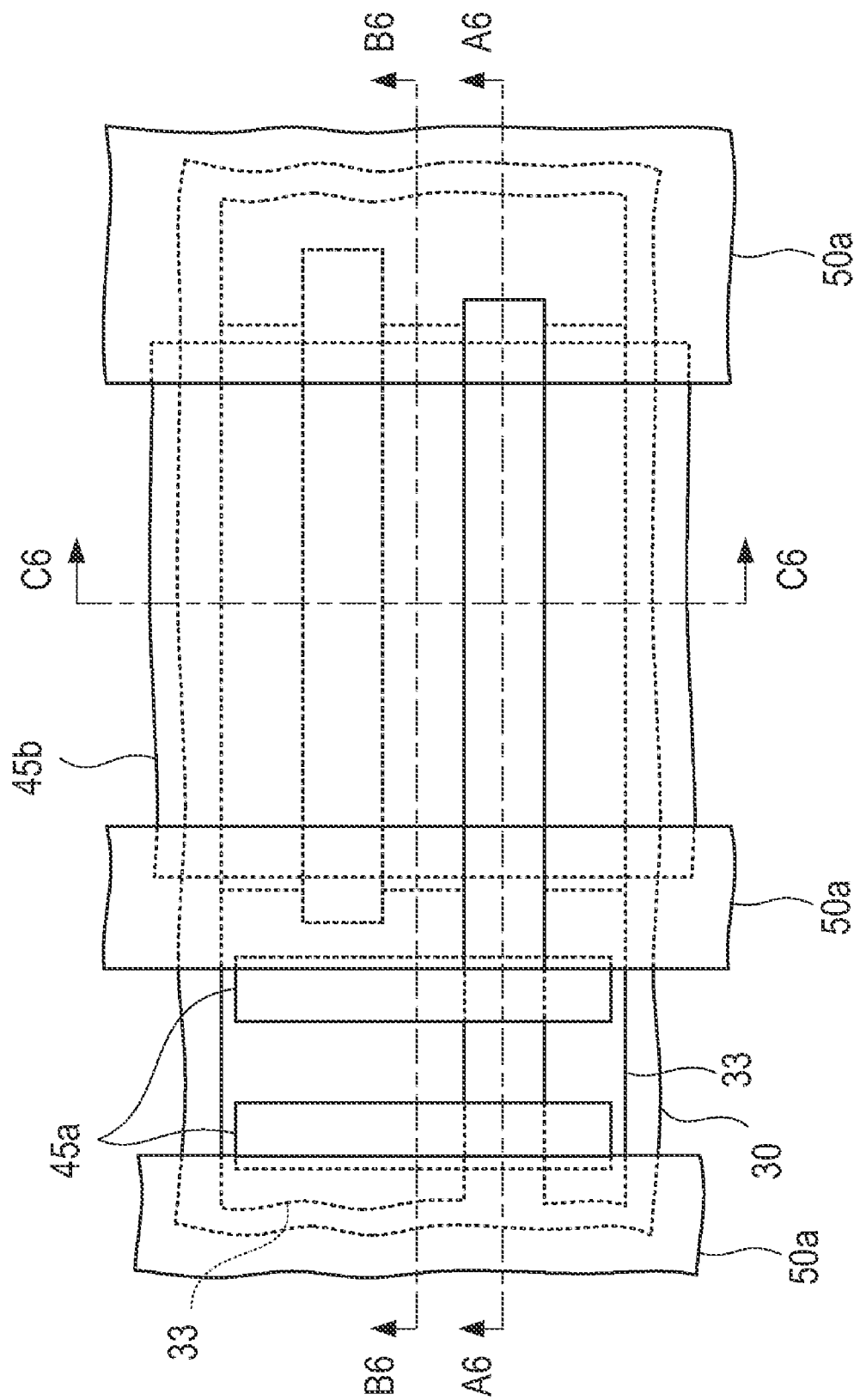

FIG. 16

| | ION IMPLANTING CONDITIONS | SAMPLE A | SAMPLE B | SAMPLE C | SAMPLE D |
|---|---|---|---|---|---|
| n WELL IMPLANTATION | IONIC SPECIES: P$^+$, ACCELERATION ENERGY: 360keV, DOSE AMOUNT: $3.00\times10^{13}$cm$^{-2}$, TILT ANGLE: 0° | ○ | ○ | ○ | ○ |
| IMPLANTATION OF CHANNEL REGION 38 (FIRST TIME) | IONIC SPECIES: As$^+$, ACCELERATION ENERGY: 100keV, DOSE AMOUNT: $1.50\times10^{12}$cm$^{-2}$, TILT ANGLE: 0° | ○ | ○ | ○ | ○ |
| IMPLANTATION OF CHANNEL REGION 38 (SECOND TIME) | IONIC SPECIES: As$^+$, ACCELERATION ENERGY: 100keV, DOSE AMOUNT: $1.20\times10^{13}$cm$^{-2}$, TILT ANGLE: 7° | ○ | ○ | ○ | |
| | IONIC SPECIES: As$^+$, ACCELERATION ENERGY: 100keV, DOSE AMOUNT: $3.30\times10^{12}$cm$^{-2}$, TILT ANGLE: 7° | | | | ○ |
| IMPLANTATION OF SOURCE/DRAIN EXTENSION 46 | IONIC SPECIES: B$^+$, ACCELERATION ENERGY: 0.5keV, DOSE AMOUNT: $1.60\times10^{14}$cm$^{-2}$, TILT ANGLE: 0° | ○ | ○ | ○ | |
| | IMPLANTATION ON BOTH SIDES | | | | |
| IMPLANTATION OF POCKET REGION 49 | IONIC SPECIES: P$^+$, ACCELERATION ENERGY: 30keV, DOSE AMOUNT: $2.00\times10^{12}$cm$^{-2}$, TILT ANGLE: 28°, TWIST ANGLE: ω1=0°, ω2=90°, ω3=180°, ω4=270° | ○ | ○ | | |
| | IMPLANTATION ONLY IN BIT CONTACT REGION | | | | |
| | IONIC SPECIES: P$^+$, ACCELERATION ENERGY: 30keV, DOSE AMOUNT: $6.00\times10^{12}$cm$^{-2}$, TILT ANGLE: 30°, TWIST ANGLE: ω1=45°, ω2=135°, ω3=225°, ω4=315° | | | ○ | |
| | IMPLANTATION ONLY IN BIT CONTACT REGION | | | | |
| | IONIC SPECIES: P$^+$, ACCELERATION ENERGY: 30keV, DOSE AMOUNT: $9.00\times10^{12}$cm$^{-2}$, TILT ANGLE: 30°, TWIST ANGLE: ω1=45°, ω2=135°, ω3=225°, ω4=315° | | | | ○ |

$h_{Res} = 0.295 \mu m$     $L_3 = 0.03 \mu m$
$h_{WL} = 0.11 \mu m$       $W_2 = 0.20 \mu m$
$L_1 = 0.09 \mu m$
$L_2 = 0.06 \mu m$ $h_{WL} = 0.11 \mu m$
$L_1 = 0.084 \mu m$
$W_1 = 0.017 \mu m$ $h_{Res} = 0.295 \mu m$ $L_1 = 0.096 \mu m$ $L_2 = 0.06 \mu m$ $W_4 = 0.2 \mu m$ $L_1 = 0.084 \mu m$
$L_3 = 0.013 \mu m$

SEMICONDUCTOR DEVICE MANUFACTURING METHOD

CROSS-REFERENCE TO RELATED APPLICATIONS

This application is based upon and claims the benefit of priority of the prior Japanese Patent Application No. 2008-306677, filed on Dec. 1, 2008 the entire contents of which are incorporated herein by reference.

FIELD

The present invention relates to a method of manufacturing a semiconductor device.

BACKGROUND

Recently, with the high integration of semiconductor devices such as LSIs, the gate length of a MOS transistor has continued to decrease. The decrease in gate length contributes to miniaturization of a semiconductor device while promoting short channel effects within the MOS transistor, thereby causing reduction in threshold voltage of the MOS transistor. Such phenomenon as decrease in gate length and reduction in threshold voltage is called a roll-off phenomenon. In order to provide high performance semiconductor devices, it is desired to suppress the roll-off phenomenon.

As an effective means of suppressing the roll-off phenomenon, there is known a method of performing a pocket implantation into a semiconductor substrate below a gate electrode.

The pocket implantation refers to ion-implanting the same conductive type impurity as a channel impurity obliquely with respect to a gate electrode after the gate electrode is formed. This method can suppress a depletion layer from extending from a drain, thereby preventing the short channel effects.

Such pocket implantation is considered to be effective for a logic-mixed memory where a logic region and a memory region are formed in one and the same chip. Not only a cell capacitor for accumulating charges but also a transfer transistor for reading the charges from the cell capacitor is formed in the memory region of the logic-mixed memory. The pocket implantation can be applied to the transfer transistor.

In this case, it is desirable that the pocket implantation suppress the roll-off phenomenon of the transfer transistor as well as can allow the cell capacitor to hold the charges for a long period of time.

As described above, conventionally, it has been desired to provide a semiconductor device manufacturing method wherein the pocket implantation can suppress the roll-off phenomenon as well as can allow the cell capacitor to hold the charges for a long period of time.

SUMMARY

According to one aspect of the invention, a method of manufacturing a semiconductor device having a first memory cell array region and a second memory cell array region, the method includes forming an active region on a surface layer of a semiconductor substrate;

forming a first conductive type channel region in the active region;

forming a gate insulating film on the semiconductor substrate in the channel region;

forming a first word line extending in a first direction on the gate insulating film in the first memory cell array region, and forming a second word line extending in a second direction crossing the first direction on the gate insulating film in the second memory cell array region;

forming a resist pattern covering part of an upper surface of the first word line so as to put, in an exposed state, one side surface of the first word line and a bit contact region of the semiconductor substrate; and ion-implanting an impurity having the same conductive type as the first conductive type into the active region of the bit contact region side using the resist pattern as a mask, wherein the ion implantation into the active region is performed from a direction that is inclined from a direction vertical to the surface of the semiconductor substrate and is oblique with respect to both the first direction and the second direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 3 is a sectional view illustrating a method of forming the pocket region of the semiconductor device according to the preliminary matters;

FIG. 4 is a sectional view illustrating a case where a positional misalignment occurs between a resist pattern and a word line in the semiconductor device according to the preliminary matters;

FIGS. 5A and 5B are a plan view illustrating word lines extending in different directions in the semiconductor device according to the preliminary matters;

FIGS. 6A and 6B are sectional views schematically illustrating that if two word lines have different extending directions, ion implanting angles are also different accordingly in the semiconductor device according to the preliminary matters;

FIGS. 7A and 7B are plan views illustrating a case where ion implantation is performed four times each from four different directions in the semiconductor device according to the preliminary matters;

FIGS. 8A and 8B are sectional views illustrating when ion implantation is performed as illustrated in FIGS. 7A and 7B, respectively;

FIGS. 9A and 9B are sectional views illustrating that a pocket region is formed below a space between a word line and a resist pattern in the semiconductor device according to the preliminary matters;

FIG. 10 is a plan view illustrating a chip layout of the semiconductor device in accordance with a first embodiment;

FIG. 11 is a plan view illustrating a plane layout of a memory macro of the semiconductor device in accordance with the first embodiment;

FIG. 13A to 13G are each a plan view of a respective manufacturing process of the semiconductor device in accordance with the first embodiment;

FIG. 16 is a table listing process conditions for the samples used for research in the first embodiment;

DETAILED DESCRIPTION OF THE EMBODIMENTS (1) Preliminary Matters

Before describing the present embodiments, preliminary matters to serve as a base for the present embodiments will be described.

Figure 1:
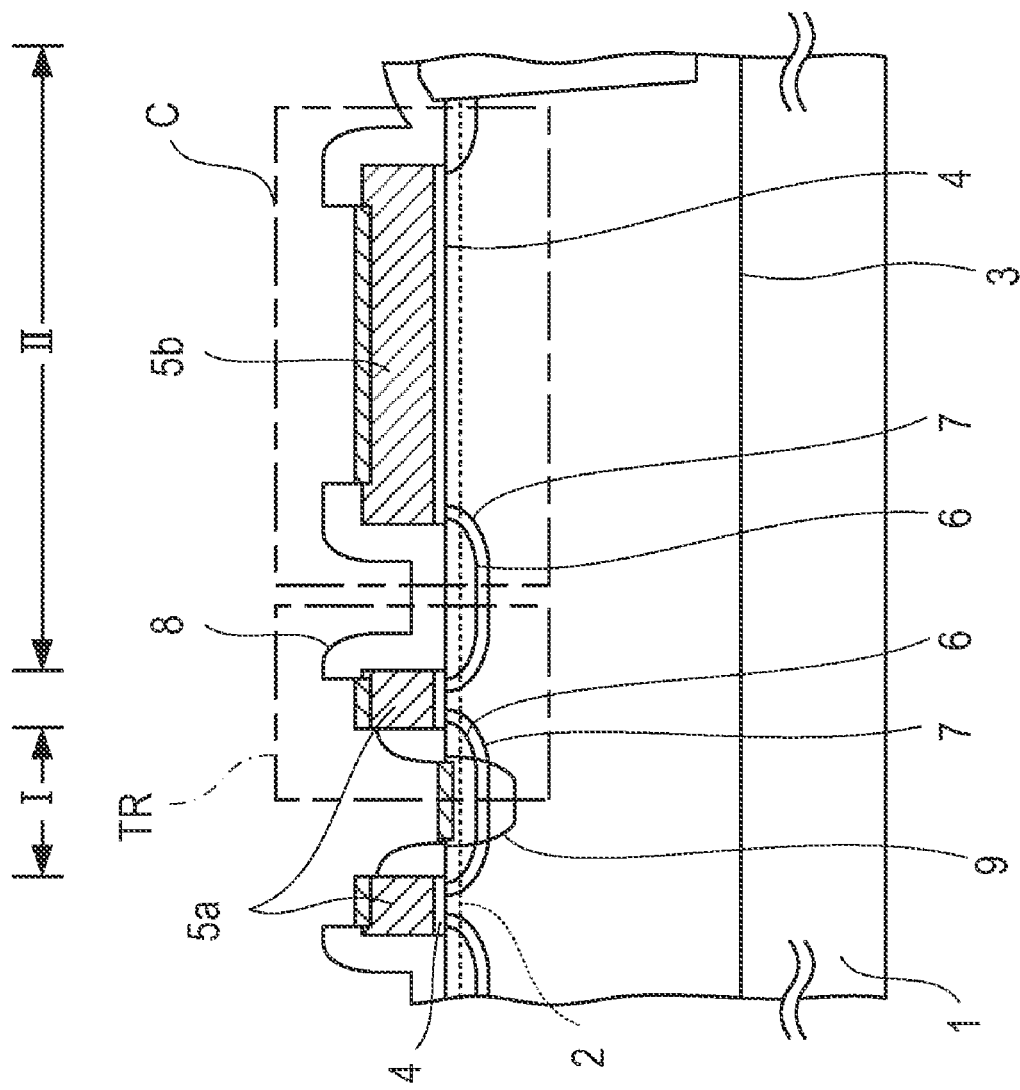
FIG. 1 is a sectional view of a semiconductor device according to preliminary matters.

FIG. 1 is a sectional view of the semiconductor device according to the preliminary matters.

This semiconductor device is a logic-mixed memory. FIG. 1 illustrates part of the memory cell array region of the logic-mixed memory.

The memory cell array region is roughly divided into a bit contact region I connected to bit lines and a storage region II where a cell capacitor C is formed.

As illustrated in FIG. 1, this semiconductor device includes a silicon substrate 1 on which an n-well 3 is formed. Word lines 5a and a capacitor upper electrode 5b are formed on the silicon substrate 1 via a gate insulating film 4.

Of them, the two word lines 5a are formed in the memory cell array region, being spaced in parallel to each other. Moreover, the word lines 5a and the capacitor upper electrode 5b are made of polysilicon.

The word lines 5a serves as a gate electrode of a transfer transistor TR. A source/drain extension 6 and a pocket region 7 are formed on the silicon substrate 1 of both sides thereof.

Of them, the pocket region 7 is formed by ion-implanting, into the silicon substrate 1, an n-type impurity which is the same conductive type impurity as that of an n-type channel region 2 of the transfer transistor TR. The source/drain extension 6 is formed by ion-implanting a p-type impurity.

Further, a sidewall spacer 8 is formed so as to cover the side surfaces of the word line 5a and the capacitor upper electrode 5b. In addition, a p-type source/drain region 9 connected to a bit line is formed on the silicon substrate 1 between the two word lines 5a.

In such a logic-mixed memory, the channel region 2 formed below the capacitor upper electrode 5b serves as a lower electrode of the capacitor C, and the charges accumulated in the capacitor C are read by the transfer transistor TR.

Since the pocket region 7 is formed so as to extend from both sides of the word line 5a to below thereof, the roll-off phenomenon is hard to occur even if the gate length of the transfer transistor TR is reduced, allowing the threshold voltage of the transfer transistor TR to be maintained at a high level.

The pocket region 7 is formed so as to extend from both the bit contact region I and the storage region II to below the word line 5a by an oblique ion implantation where the ion implanting direction is oblique with respect to the substrate 1.

Note that if the pocket region 7 is formed on the storage region II side, junction leakage occurs due to a sharp pn junction between the n-type pocket region 7 and the p-type source/drain extension 6. Then, the charges in the capacitor C leak to the substrate 1 side, thus reducing the holding time of the charges in the capacitor C.

Therefore, it is considered to be preferable that the pocket region 7 is not formed on the storage region II side in order to give priority to the charge holding time over the suppression of the roll-off phenomenon.

Figure 2:
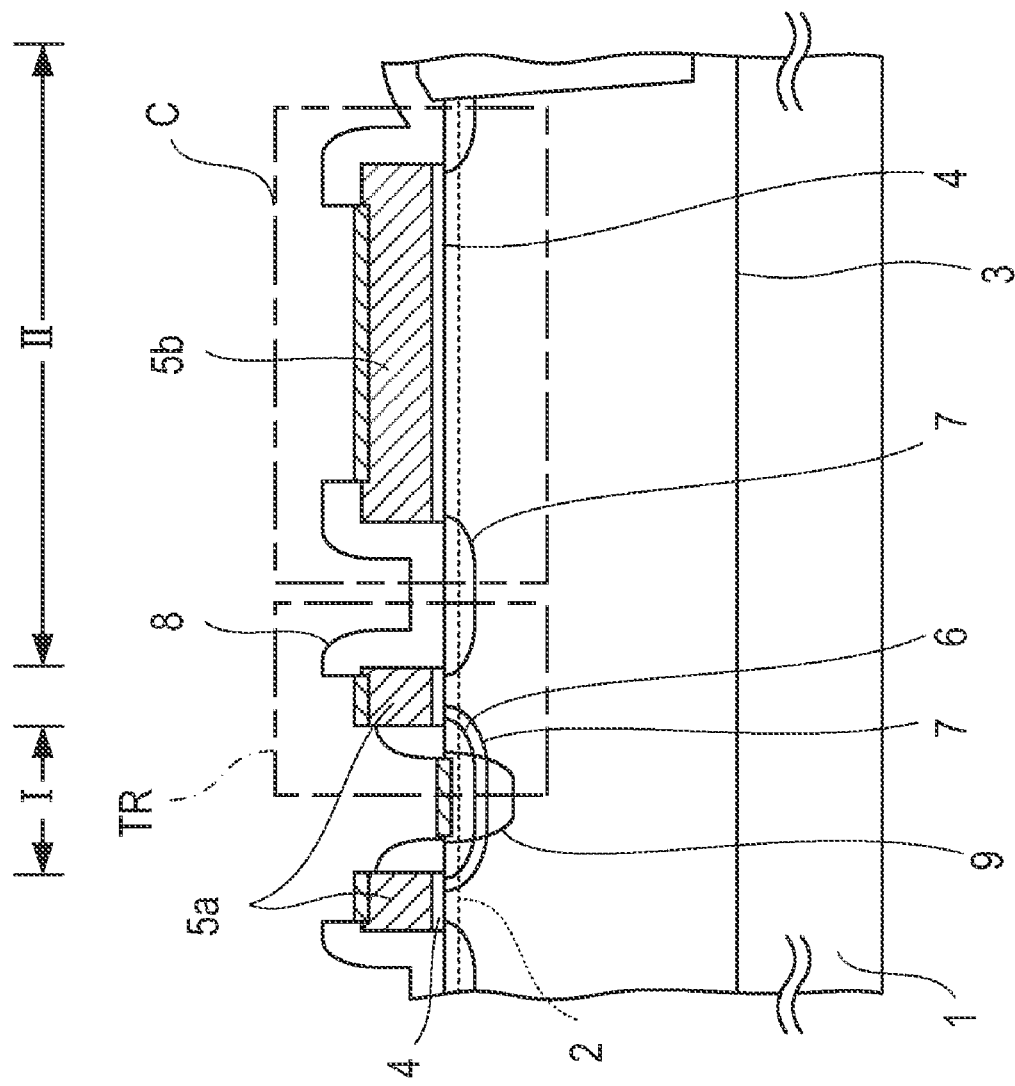
FIG. 2 is a sectional view illustrating a case where a pocket region is formed only in a bit contact region in the semiconductor device according to the preliminary matters.

FIG. 2 is a sectional view of the semiconductor device where the pocket region 7 on the bit contact region I side is formed and the pocket region on the storage region II side is omitted. It may be noted that the same reference numerals or characters as those of FIG. 1 are assigned to the components in FIG. 2, and the description thereof is omitted.

Next, a method of forming a pocket region 7 on the bit contact region I side will be described.

FIG. 3 is a sectional view illustrating the method of forming the pocket region 7.

In order to omit the pocket region 7 on the storage region II side as described above, a resist pattern 12 may be used to cover the storage region II on the silicon substrate 1 as illustrated in FIG. 3.

Then, the pocket region 7 may be formed only on the bit contact region I side of both sides of the word line 5a by ion-implanting an n-type impurity 11 obliquely into the silicon substrate 1 through a window 12a of the resist pattern 12.

Meanwhile, in an actual manufacturing process of a semiconductor device, a positional misalignment may occur between the resist pattern 12 and the word line 5a due to a manufacturing variation or the like.

FIG. 4 is a sectional view illustrating a case where such a positional misalignment occurs.

In the example of FIG. 4, a positional misalignment occurs between the resist pattern 12 and the word line 5a, and a space S is generated therebetween.

Even in such a case, shadowing effects by the word line 5a may be obtained by a sufficiently large angle (implant angle) θ between the vertical direction with respect to the surface of the silicon substrate 1 and the ion implanting direction, thereby preventing a pocket region 7 from being formed in the storage region II through the space S.

Meanwhile, the word line 5a requiring the suppression of the roll-off phenomenon does not always extend in one direction on the silicon substrate 1, and a plurality of word lines 5a may extend in different directions depending on the type of the semiconductor device.

FIGS. 5A and 5B are plan views schematically illustrating the word lines 5 a extending in different directions.

In this example, the extending directions of the word lines 5a are different by 90° in each of a first region A and a second region B.

In such a case, even if the impurity 11 is ion-implanted obliquely into the silicon substrate 1, the implant angles for implanting an impurity below the word line 5a are different for each of the regions A and B.

FIGS. 6A and 6B are sectional views schematically illustrating such different implant angles. FIGS. 6A and 6B correspond to the sectional view near the word lines 5a in each of the regions A and B of FIGS. 5A and 5B, respectively.

As illustrated in FIG. 6A, in the region A, the impurity 11 is ion-implanted below the word line 5a at a predetermined implant angle $\theta$.

In contrast to this, as illustrated in FIG. 6B, in the region B, the implant angle is 90° when viewed from the side of the silicon substrate 1, and thus pocket implantation below the word line 5a may not be performed.

If the extending directions of the word lines 5a differ inside the substrate surface as described above, pocket implantation may not be performed for all the word lines 5a at the same implant angle simply by performing an oblique ion implantation, and the characteristics fluctuate between the transistors.

FIGS. 7A and 7B are plan views schematically illustrating a case where ion implantation is performed four times each from four different directions in order to achieve the same implant angle for the word lines 5a in both regions A and B.

In this example, the impurity 11 is ion-implanted into the silicon substrate 1 by changing the ion-implanting twist angle by 90°, starting at the extending direction of the word line 5a in both regions A and B.

FIGS. 8A and 8B are sectional views schematically illustrating such ion implantation. FIGS. 8A and 8B correspond to the sectional views near the word lines 5a in each of the regions A and B of FIGS. 7A and 7B, respectively.

As illustrated in FIGS. 8A and 8B, if the twist angle is changed in this manner, two times out of four times, the impurity 11 may be ion-implanted at a predetermined implant angle $\theta$ in each of the regions A and B.

Note that for the remaining two times, the ion implanting angle becomes 90° when viewed from the side of the silicon substrate 1.

At this time, there is no particular problem unless a positional misalignment occurs between the resist pattern 12 and the word line 5a. However, as illustrated in FIGS. 9A and 9B, if a positional misalignment occurs and the space S is generated therebetween, the pocket region 7 is formed in the silicon substrate 1 on the storage region II side through the space S.

If that happens, as described with reference to FIG. 1, the sharp pn junction is formed between the n-type pocket region 7 and the p-type source/drain extension 6 on the storage region II side. Then, junction leakage due to the pn junction causes the charges in the capacitor C to leak to the substrate 1 side, thus reducing the holding time of the charges in the capacitor C.

Therefore, if a positional misalignment occurs between the resist pattern 12 and the word line 5a, it is difficult to selectively form a pocket region only in the silicon substrate 1 on the bit contact region I side simply by performing ion-implantation four times.

In view of the above findings, the present inventors have envisioned the embodiments as described below.

(2) First Embodiment

The present embodiment manufactures, as a semiconductor device, a logic-mixed memory where a logic region and a memory region are formed in one and same chip.

FIG. 10 is a plan view illustrating a chip layout of the semiconductor device.

As illustrated in this figure, the semiconductor device 20 includes a plurality of memory macros 21, a logic region 22 and input/output sections 23.

Of them, each of the memory macros 21 is a design unit of a memory region, having a rectangular planar shape as illustrated in the figure. The semiconductor device 20 having a memory region according to the needs of the customer or the market may be obtained by arranging an appropriate number of the memory macros 21 in a chip.

The method of arranging the memory macros 21 in the chip is not particularly limited, but the entire chip size may be reduced by arranging some of the memory macros 21 rotated by 90° from the others as illustrated in the figure.

FIG. 11 is a plan view illustrating a plane layout of the memory macro 21.

The memory macro 21 has a predetermined number (e.g., 8) of a predetermined unit (e.g., 1 Mb) of memory cell array regions 25 as well as sense amplifiers 26, a word decoder 27, and an I/O address controller 28.

Of them, the word decoder 27 selects a cell in the memory cell array region 25, and a memory signal read from the cell is amplified by the sense amplifier 26. Then, the output from the sense amplifier 26 is amplified by a second amplifier 29 and then is inputted to the I/O address controller 28.

The I/O address controller 28 has a control circuit controlling, for example, a chip enable signal and a chip I/O signal.

In such a memory macro 21, the word lines 45a in the memory cell array region 25 are formed so as to extend in a predetermined direction in the memory macro 21.

Therefore, if a memory macro 21 is rotated and arranged in order to reduce the chip size as illustrated in FIG. 10, groups of the word lines 45a in the respective memory macros 21 extend in different directions.

For example, in FIG. 10, the word lines 45a in the lower right memory macro 21 extend in a first direction D1 in parallel to the horizontal direction on the paper, while the word lines 45a in the upper left memory macro 21 extend in a second direction D2 in parallel to the vertical direction on the paper, with the directions D1 and D2 being orthogonal to each other.

Hereinafter, the description will be given to an effective method in which, when a plurality of word lines 45a extend in mutually crossing directions, a pocket region is formed in a region at one side of each word line 45a.

Figure 12A:
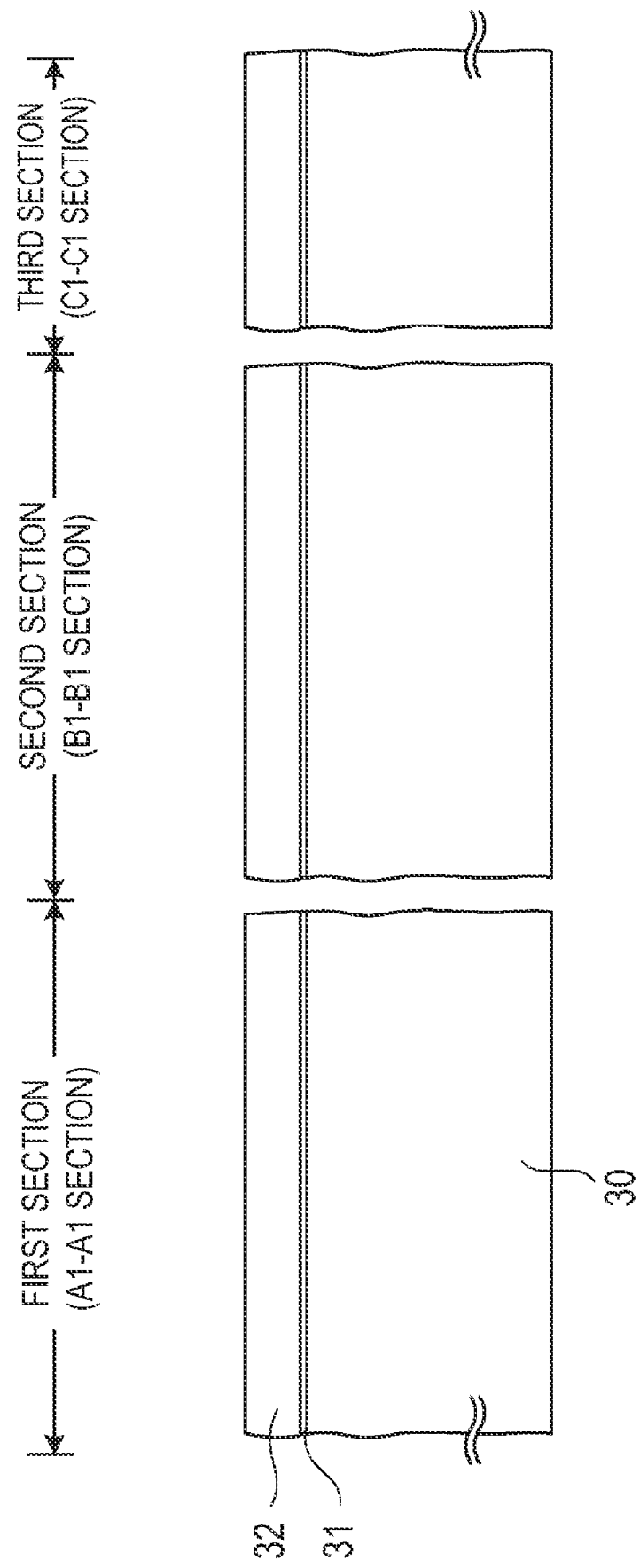
FIGS. 12A to 12P are each a sectional view of a respective manufacturing process of the semiconductor device in accordance with the first embodiment.

FIGS. 12A to 12P are each a sectional view of a respective manufacturing process of the semiconductor device manufacturing method. In addition, FIG. 13A to 13G each are a plan view of a respective manufacturing process of the semiconductor device. Note that these sectional views and plan views correspond to some of the memory macros 21 illustrated in FIG. 10, but the following processes are simultaneously performed on all the memory macros 21.

When the semiconductor device is manufactured, first, as illustrated in FIG. 12A, the surface of a silicon substrate 30 is thermally oxidized to form an initial oxide film 31 with a thickness of 5 to 20 nm.

Then, a silicon nitride film 32 is formed on the initial oxide film 31. The film forming conditions of the silicon nitride film 32 are not particularly limited, but the present embodiment uses a thermal CVD method at a substrate temperature of 600 to 800° C. to form a thickness of 50 to 200 nm.

Figure 13A:
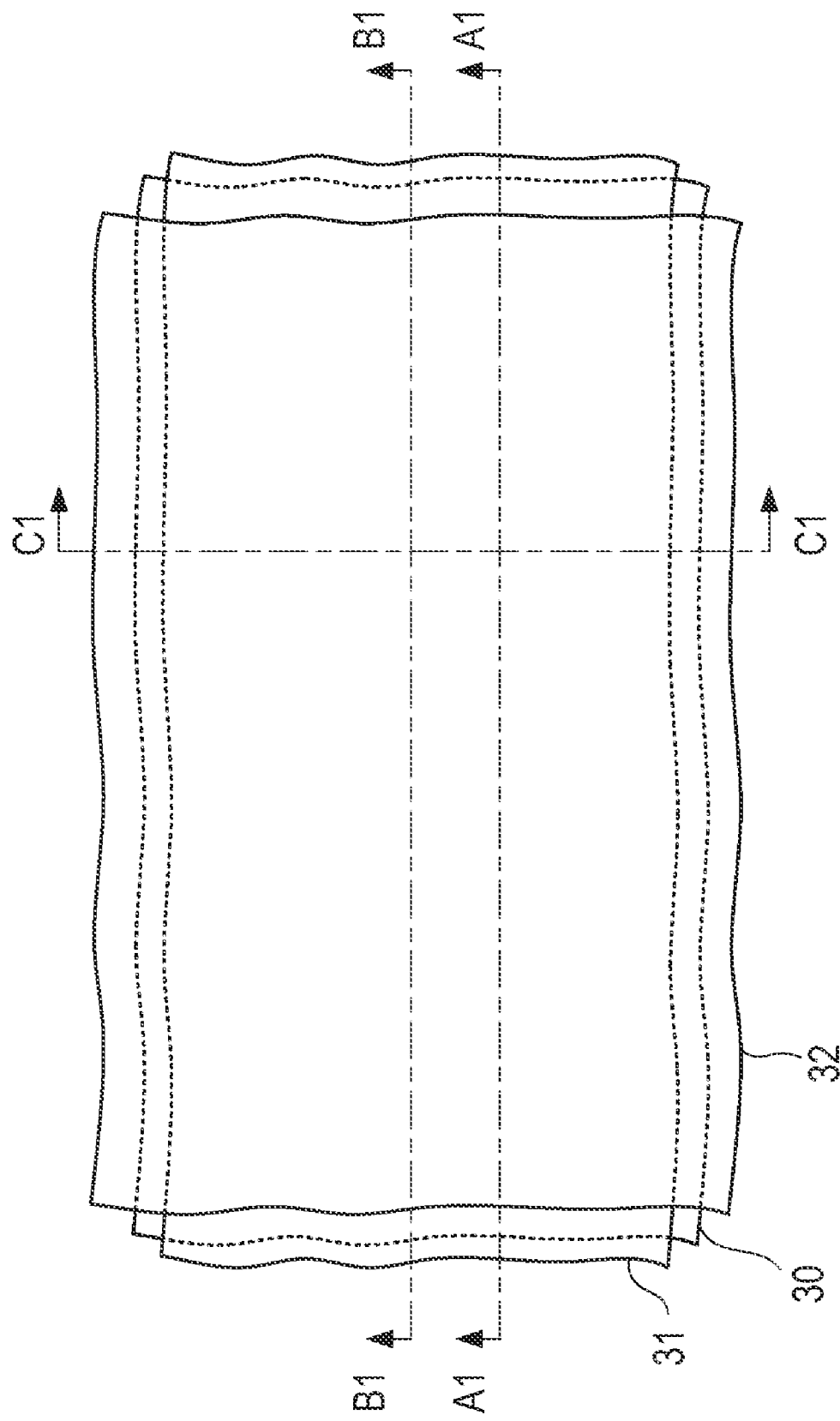

Note the first to third sections of FIG. 12A are sections along the A1-A1 line, the B1-B1 line, and the C1-C1 line of FIG. 13A respectively.

Of them, the A1-A1 line and the B1-B1 line are in parallel to the extending direction of the bit lines, and the C1-C1 line is in parallel to the extending direction of the word line perpendicular to the bit lines.

Next, as illustrated in FIG. 12B, a first resist pattern 34 is formed by applying photoresist on the entire upper surface of the silicon substrate 30, exposing and developing it.

Then, the silicon nitride film 32, the initial oxide film 31, and the silicon substrate 30 are dry-etched through a window 34a of the first resist pattern 34 to form an element isolation trench 30a with a depth of about 150 to 350 nm in the silicon substrate 30.

The silicon substrate 30 in a portion where the element isolation trench 30a is not formed becomes an active region where an impurity diffused region such as a channel region will be formed by the subsequent process.

After the etching is finished, the first resist pattern 34 used as a mask is removed by ashing, and a natural oxide film on the surface of the silicon substrate 30 is removed by hydrofluoric acid. Note that subsequently, SPM (Sulfuric acid/hydrogen Peroxide Mixture) or APM (Ammonia/hydrogen Peroxide Mixture) may be used to clean the surface of the silicon substrate 30.

Moreover, in the above, the element isolation trench 30a is formed by using the first resist pattern 34 as the mask, but the first resist pattern 34 may be removed after the silicon nitride film 32 is dry-etched. In that case, the initial oxide film 31 and the silicon substrate 30 are dry-etched by using the silicon nitride film 32 as the mask.

Figure 13B:
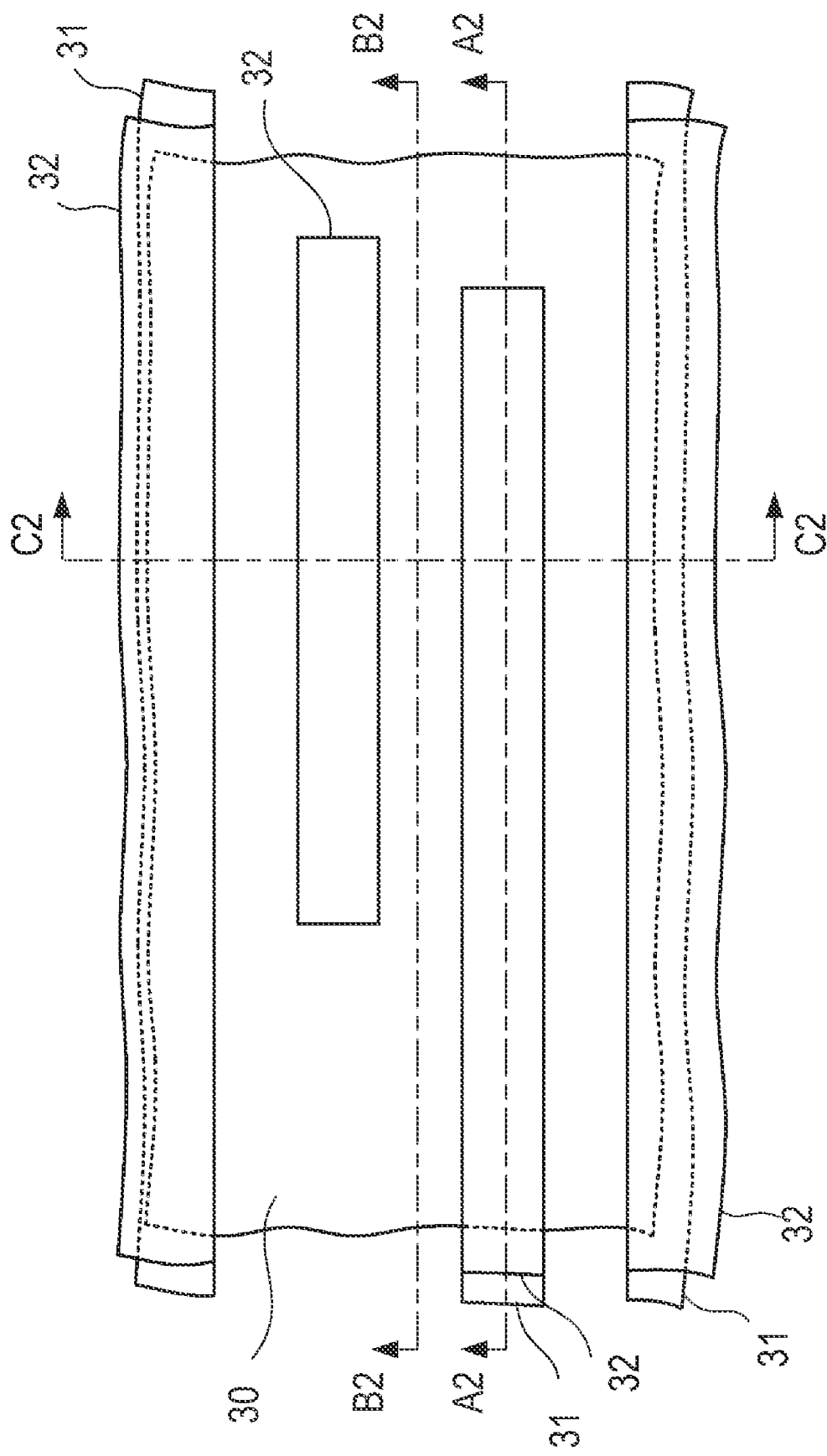

FIG. 13B is a plan view after the above process is finished, and each sectional view of the previous FIG. 12B corresponds to the sections along the A2-A2 line, the B2-B2 line, and the C2-C2 line of FIG. 13B respectively.

Then, as illustrated in FIG. 12C, a silicon oxide film with a thickness of 300 to 500 nm is formed on the entire upper surface of the silicon substrate 30 as an element isolation insulating film 33 by an HDP (High Density Plasma) CVD method, and the element isolation trench 30a is completely buried by the element isolation insulating film 33.

It may be noted that the element isolation insulating film 33 may be formed by a plasma CVD method using a TEOS gas instead of the HDP CVD method. In addition, before the element isolation insulating film 33 is formed, for the purpose of repairing damage to the inner surface of the element isolation trench 30a received when the element isolation trench 30a is formed by dry etching, a thermal oxide film with a thickness of about 2 to 10 nm may be formed by thermally oxidizing the inner surface.

Afterward, while using the silicon nitride film 32 as a polishing stopper film, the element isolation insulating film 33 is polished by a CMP (Chemical Mechanical Polishing) method to leave the element isolation insulating film 33 in the element isolation trench 30a.

Figure 13C:
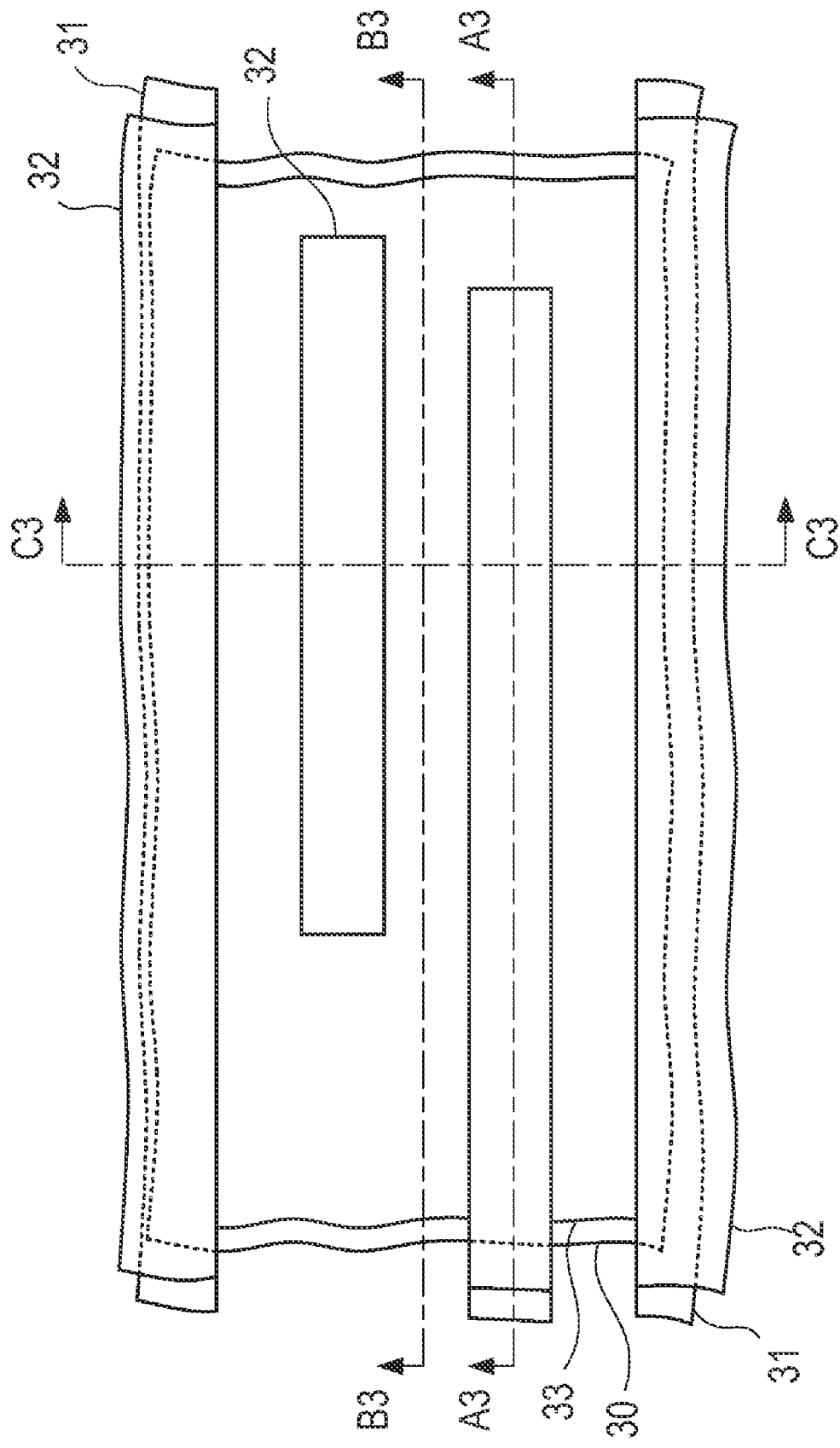

FIG. 13C is a plan view after the above process is finished, and each sectional view of the previous FIG. 12C corresponds to the sections along the A3-A3 line, the B3-B3 line, and the C3-C3 line of FIG. 13C respectively.

Figure 12D:
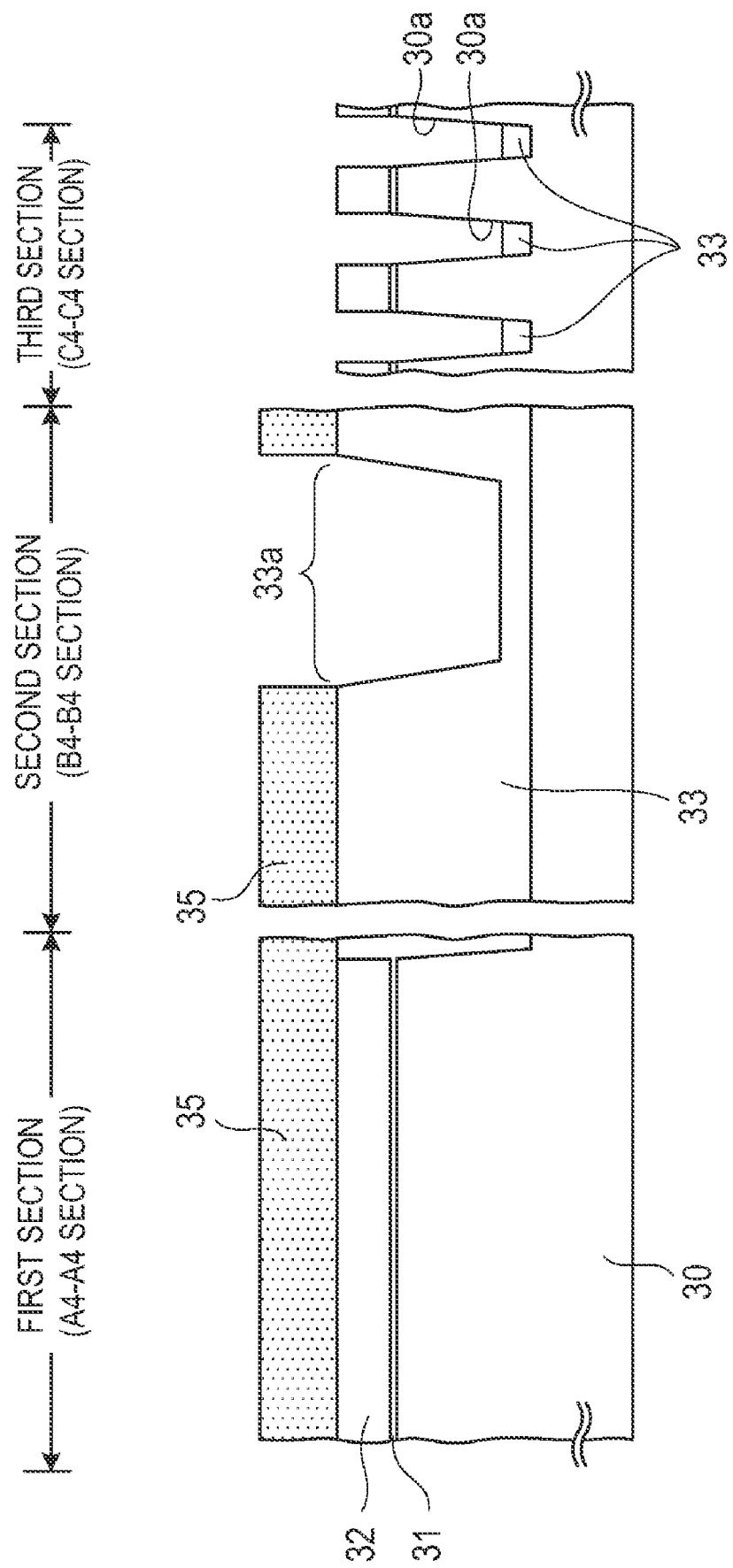

Next, as illustrated in FIG. 12D, a second resist pattern 35 is formed by applying photoresist on the entire upper surface of the silicon substrate 30, exposing and developing it.

Then, the element isolation insulating film 33 is dry-etched by using the second resist pattern 35 as the mask to form a trench 33a in the element isolation insulating film 33.

When the etching is finished, the inner surface of the element isolation trench 30a in the portion where the element isolation insulating film 33 is removed is exposed in the third section in parallel to the word line, and the element isolation insulating film 33 with a thickness of about 50 to 150 nm is left on the bottom surface of the element isolation trench 30a.

Figure 13D:
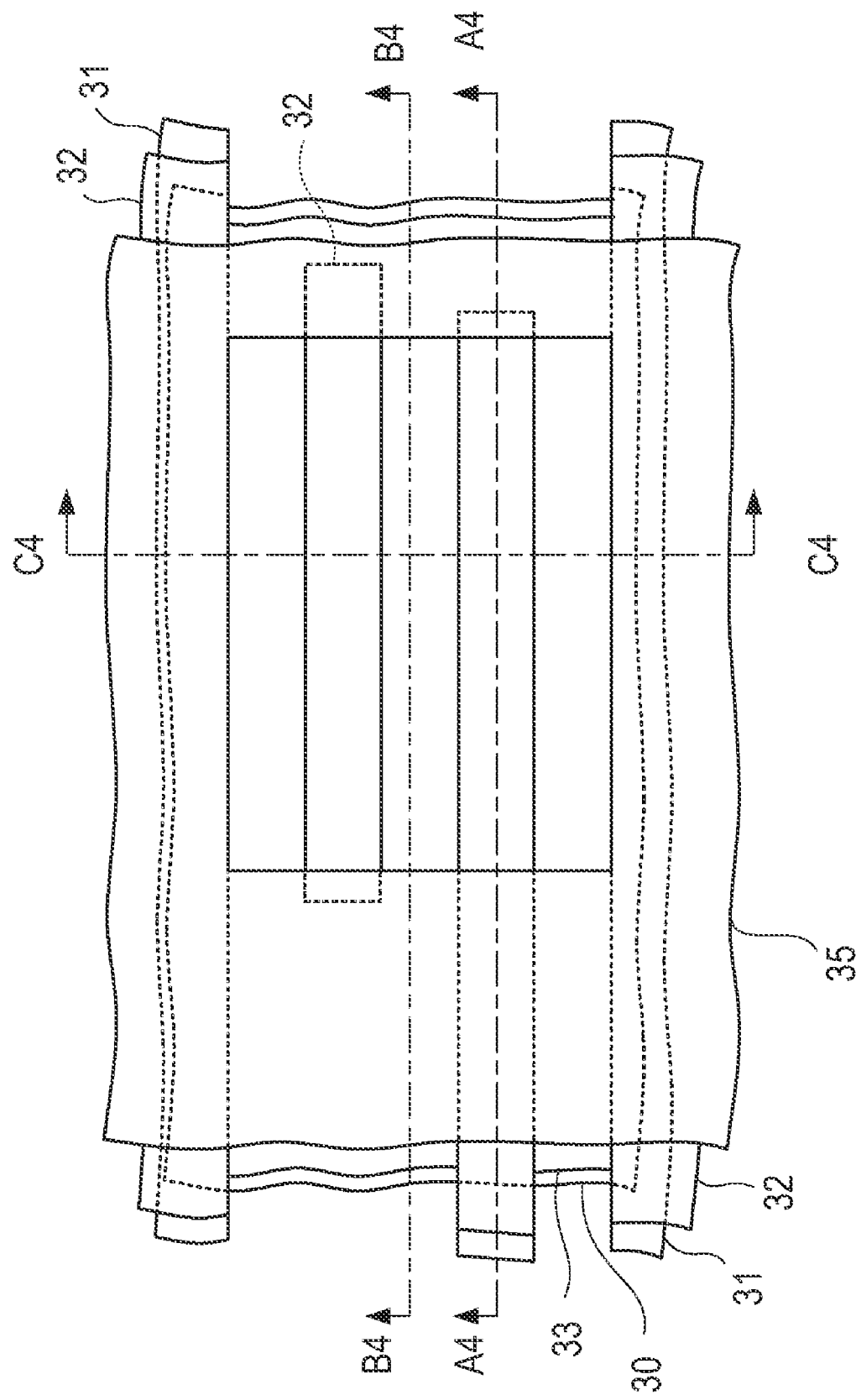

FIG. 13D is a plan view after the above process is finished, and each sectional view of the previous FIG. 12D corresponds to the sections along the A4-A4 line, the B4-B4 line, and the C4-C4 line of FIG. 13D respectively.

Afterward, the second resist pattern 35 is removed by ashing.

Figure 12E:
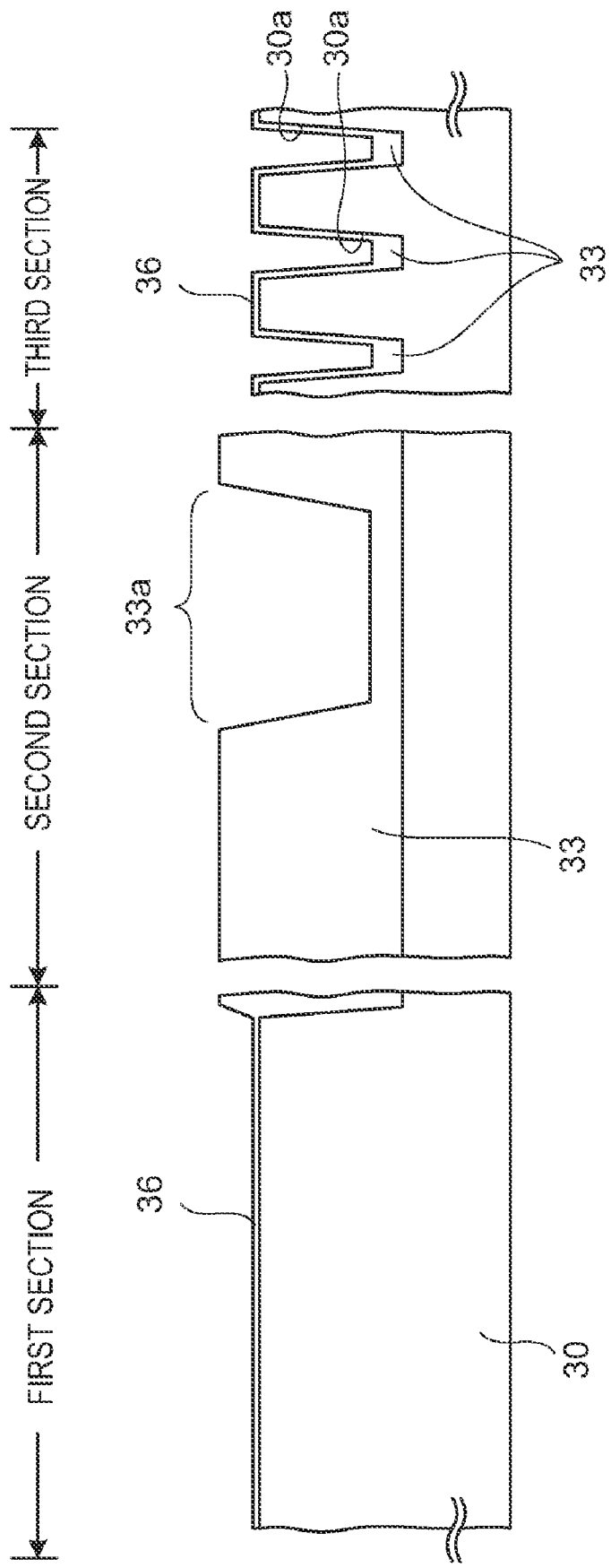

Next, the process until obtaining a sectional structure illustrated in FIG. 12E will be described.

First, the silicon nitride film 32 is wet-etched by phosphoric acid, and further, the initial oxide film 31 thereunder is wet-etched by hydrofluoric acid and removed to expose a cleaning surface of the silicon substrate 30 in the active region. It may be noted that the silicon nitride film 32 may be etched by a mixed solution of phosphoric acid and hydrofluoric acid.

Afterward, the surface of the silicon substrate 30 is thermally oxidized again to form a sacrificial insulating film 36 with a thickness of 5 to 10 nm.

Figure 12F:
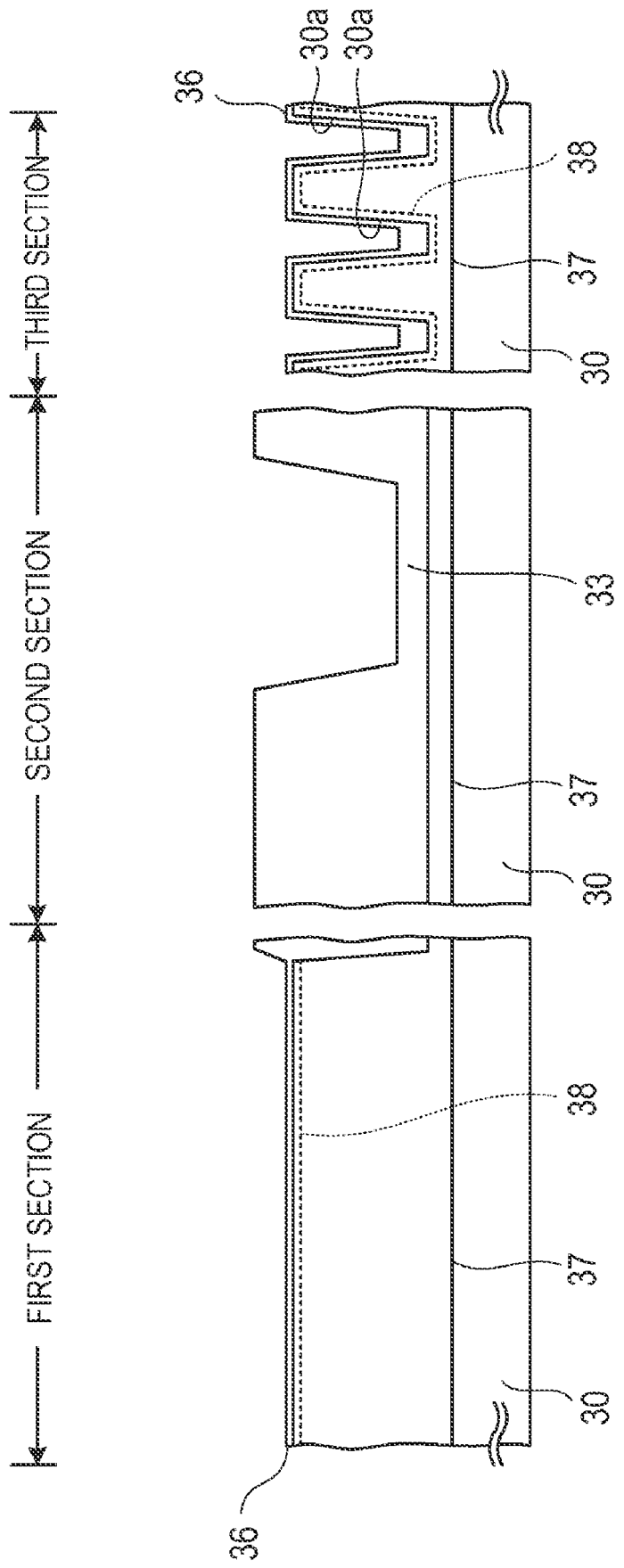

Then, as illustrated in FIG. 12F, while the sacrificial insulating film 36 is used as a through-film, P+ ions are implanted into the silicon substrate 30 as an n-type impurity to form an n-well 37. The ion implanting conditions are not particularly limited. The present embodiment assumes an acceleration energy of 360 KeV, a dose amount of $7.5 \times 10^{12}\,\text{cm}^{-2}$, and a tilt angle of 7°. In addition, the twist angle is assumed to be set in four directions: 22°, 112°, 202°, and 292°.

Afterward, As+ ions are implanted twice into the silicon substrate 30 as an n-type impurity to form a channel region 38 on a surface portion of the silicon substrate 30. The conditions for each ion implantation are as follows. For example, the conditions for the first ion implantation is an acceleration energy of 100 KeV, a dose amount of $1.2 \times 10^{12}\,\text{cm}^{-2}$, and a tilt angle of 0°; and the conditions for the second ion implantation is an acceleration energy of 100 KeV, a dose amount of $3.5 \times 10^{12}\,\text{cm}^{-2}$, and a tilt angle of 7°.

After the ion implantation is finished, the sacrificial insulating film 36 used as the through-film is wet-etched by hydrofluoric acid and removed.

Then, as illustrated in FIG. 12G, the surface of the silicon substrate 30 is thermally oxidized to form a gate insulating film 40 with a thickness of 2 to 7 nm.

It may be noted that in order to form several kinds of gate insulating films each having a different film thickness in a chip, the present process of thermally oxidization may be repeated for a predetermined number of times.

Figure 12H:
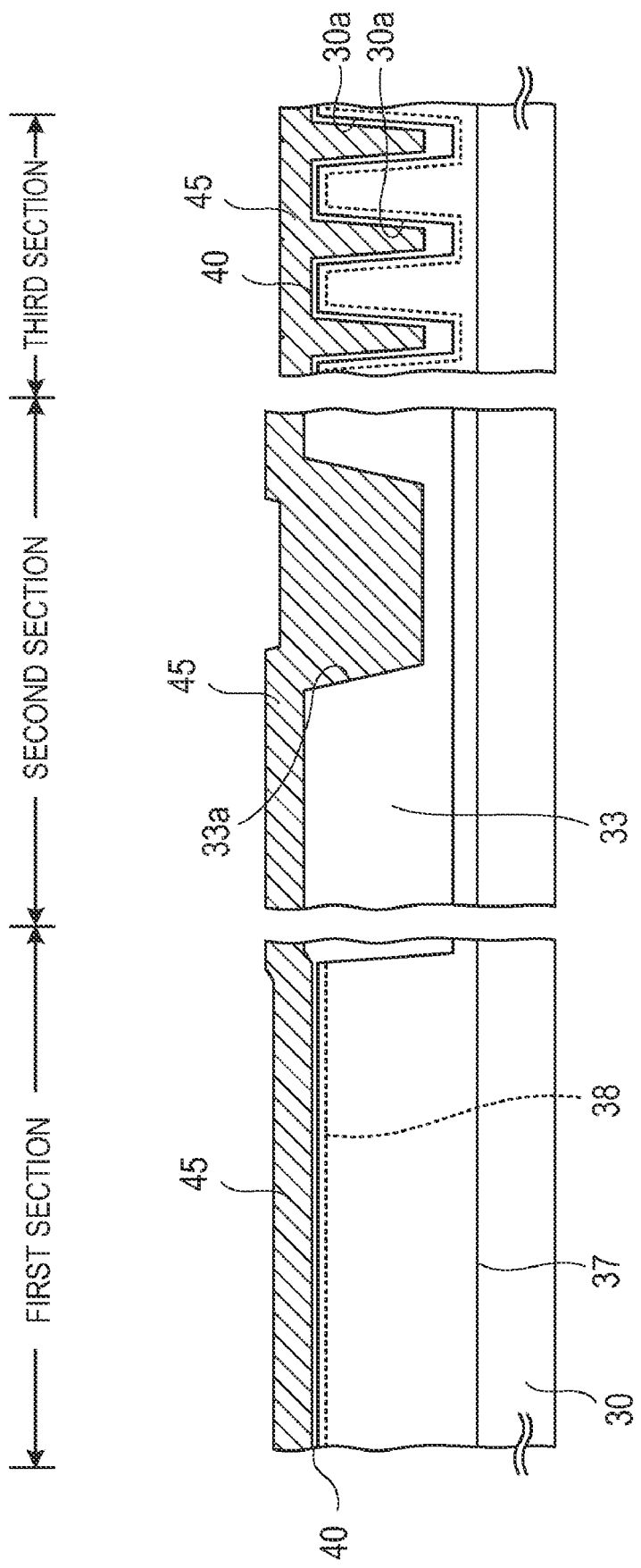

Next, as illustrated in FIG. 12H, a polysilicon film with a thickness of 70 to 150 nm is formed on each of the gate insulating film 40 and the element isolation insulating film 33 as a conductive film 45 by the CVD method.

It may be noted that for the purpose of activating the conductive film 45 in a portion formed in the trench 33a of the element isolation insulating film 33, a p-type impurity such as boron may be selectively ion-implanted into the portion.

Figure 12I:
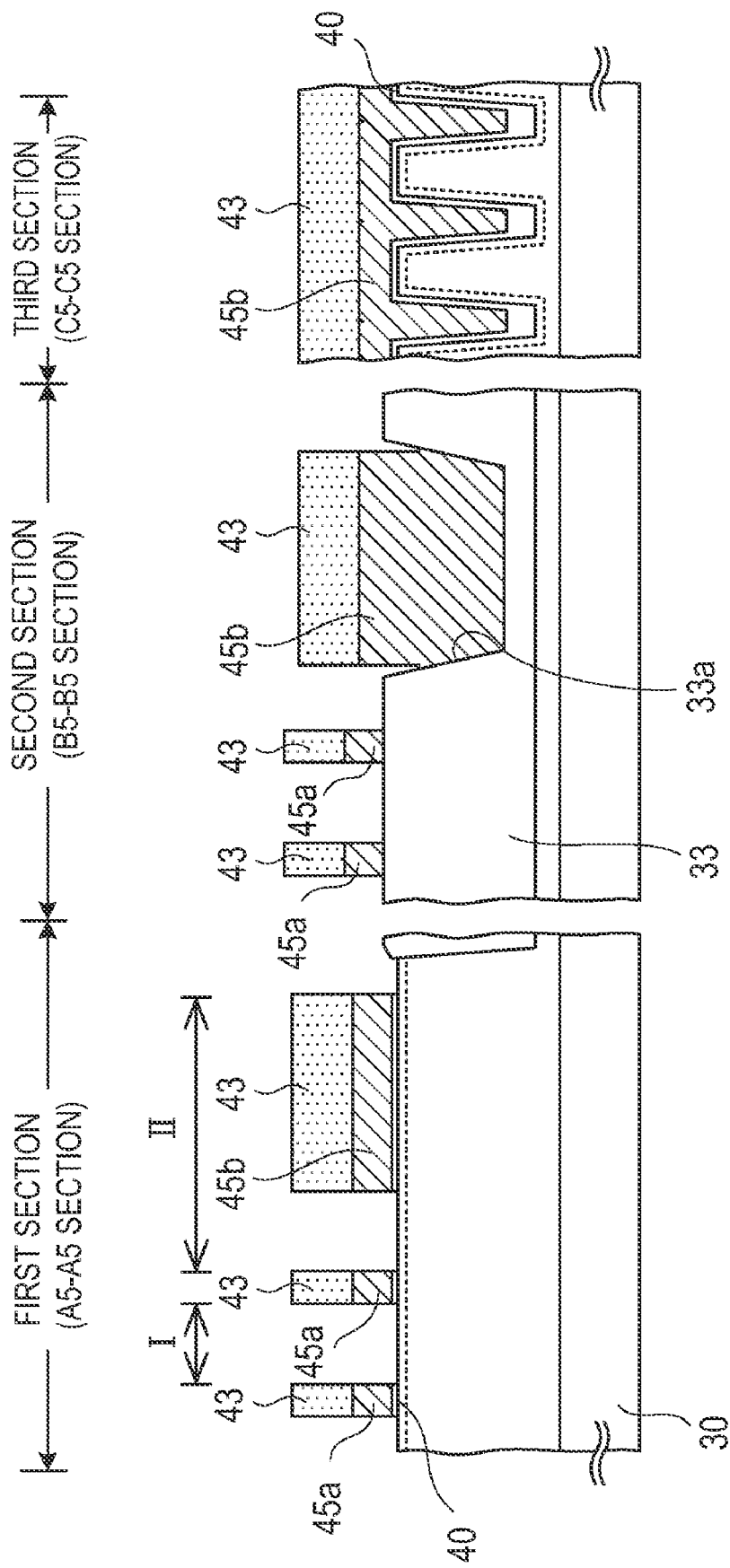

Next, as illustrated in FIG. 12I, a third resist pattern 43 is formed on the conductive film 45, and the conductive film 45 is dry-etched by using the third resist pattern 43 as a mask.

By doing so, two word lines 45a are formed facing each other with the bit contact region I therebetween, as well as a capacitor upper electrode 45b is formed in the storage region II.

Of them, the word lines 45a are formed in all the memory macros 21 in a chip illustrated in FIG. 10, with the extending directions D1 and D2 being different depending on the memory macro 21.

It may be noted that a silicon oxide film and a silicon nitride film may be formed on the conductive film 45 as a hard mask, and the films may be dry-etched by using the hard mask as a mask.

Afterward, the third resist pattern 43 is removed by ashing, and then, the gate insulating film 40 in the portion not covered with the word line 45a or the capacitor upper electrode 45b is wet-etched by hydrofluoric acid and removed.

Figure 13E:
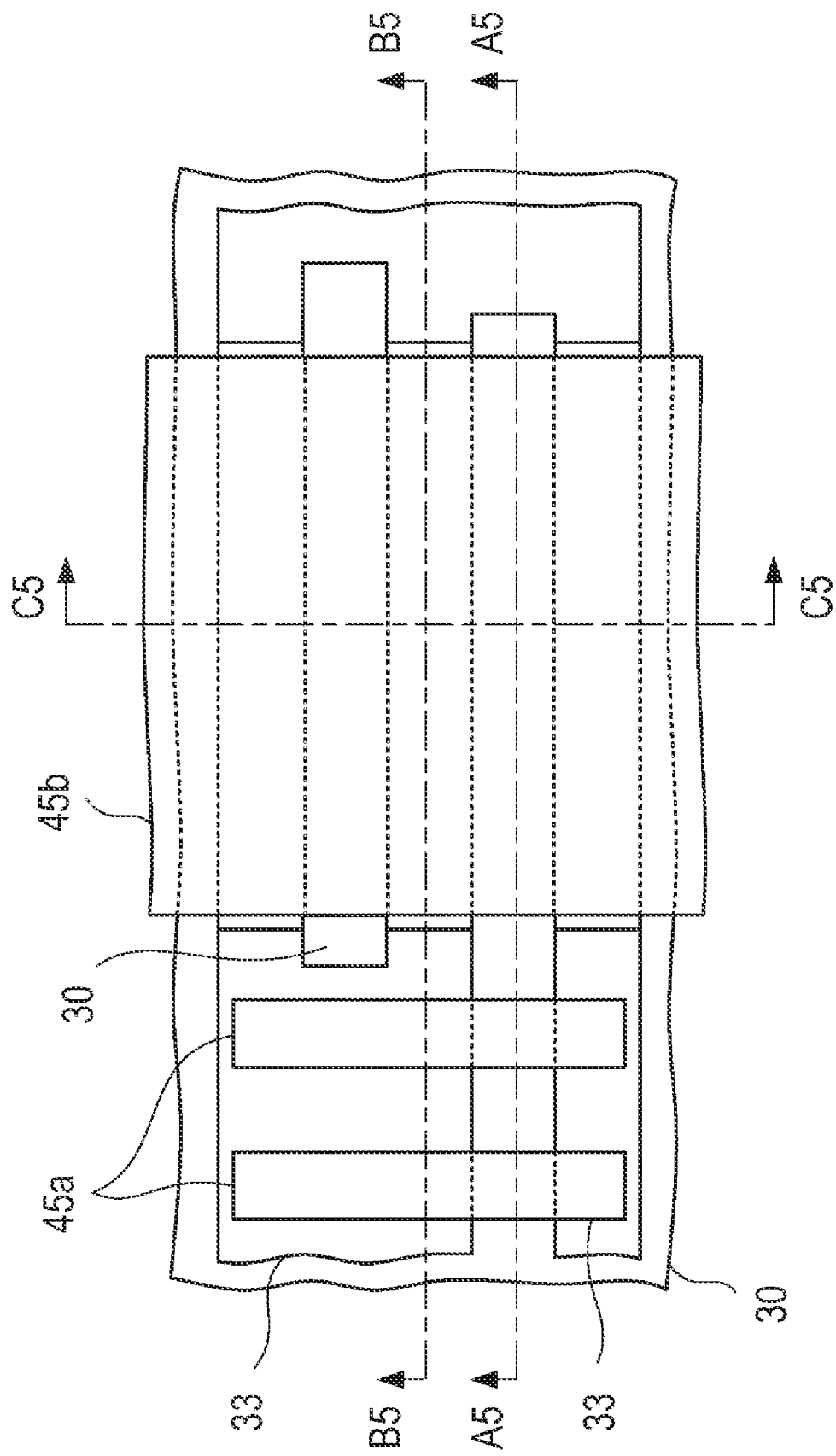

FIG. 13E is a plan view after the above process is finished, and each sectional view of the previous FIG. 12I corresponds to the sections along the A5-A5 line, the B5-B5 line, and the C5-C5 line of FIG. 13E respectively.

Then, as illustrated in FIG. 12J, a p-type impurity such as boron is ion-implanted into an active region of the silicon substrate 30 using the word line 45a and the capacitor upper electrode 45b as a mask. By doing so, a p-type source/drain extension 46 is formed in the silicon substrate 30 at a side of each of the side surfaces 45c and 45d of the word line 45a.

The ion implanting conditions are, for example, an acceleration energy of 0.5 KeV, a dose amount of $5.0 \times 10^{13}$ cm$^{-2}$, and a tilt angle of 0°. In addition, the twist angle is assumed to be set in four directions: 0°, 90°, 180°, and 270° starting at the extending direction of the word line 45a.

It may be noted that the ion-implantation uses a resist pattern covering the logic region 22 (see FIG. 10) as a mask, and after the ion-implantation is finished, the resist pattern is removed.

Next, the process until obtaining a sectional structure illustrated in FIG. 12K will be described.

First, a fourth resist pattern 47 is formed by applying photoresist with a thickness of about 0.32 μm on the entire upper surface of the silicon substrate 30, exposing and developing it. After development, the thickness of the developed fourth resist pattern 47 decreases below the original thickness to about 0.295 μm.

The fourth resist pattern 47 includes a side surface 45c of the word line 45a and a window 47a where the bit contact region I of the silicon substrate 30 at the side of the side surface 45c is exposed. Moreover, the fourth resist pattern 47 covers part of the upper surface of the word line 45a and the storage region II of the silicon substrate 30 at the side of the other side surface 45d of the word line 45a.

Then, P+ ions are implanted into the active region of the silicon substrate 30 as an n-type impurity 48 the same conductive type as that of the channel region 38 using the fourth resist pattern 47 as a mask.

Thereby, of the side surfaces 45c and 45d of the word line 45a, a pocket region 49 is formed in the active region on the bit contact region I side.

Moreover, at the ion implantation, the tilt angle θ is set to a value greater than 0° such as 30° so that the impurity 48 is implanted into the silicon substrate 30 from a direction inclined to the bit contact region I side from a direction n vertical to the surface of the silicon substrate 30. By doing so, the impurity 48 may be implanted below the word line 45a, and thus the short channel effects below the word line 45 a may be easily suppressed.

Note that FIG. 12K is a sectional view of some of the plurality of memory macros 21 (see FIG. 10), but the other memory macros 21 rotated by 90° on the substrate have the same sectional view as that of FIG. 12K.

Here, as illustrated by a dotted line circle of FIG. 12K, the space S may be generated between the word line 45a and the fourth resist pattern 47 due to a positional misalignment of the fourth resist pattern 47.

In that case, as described with respect to FIG. 9, the impurity 48 is implanted into the silicon substrate 30 through the space S, and unfortunately, a pocket region 49 is also formed on the storage region II side. As described in the preliminary matters, if the pocket region 49 is formed on the storage region II side, there occurs a disadvantage of reducing the holding time of charges of a subsequently formed cell capacitor.

Figure 14A:
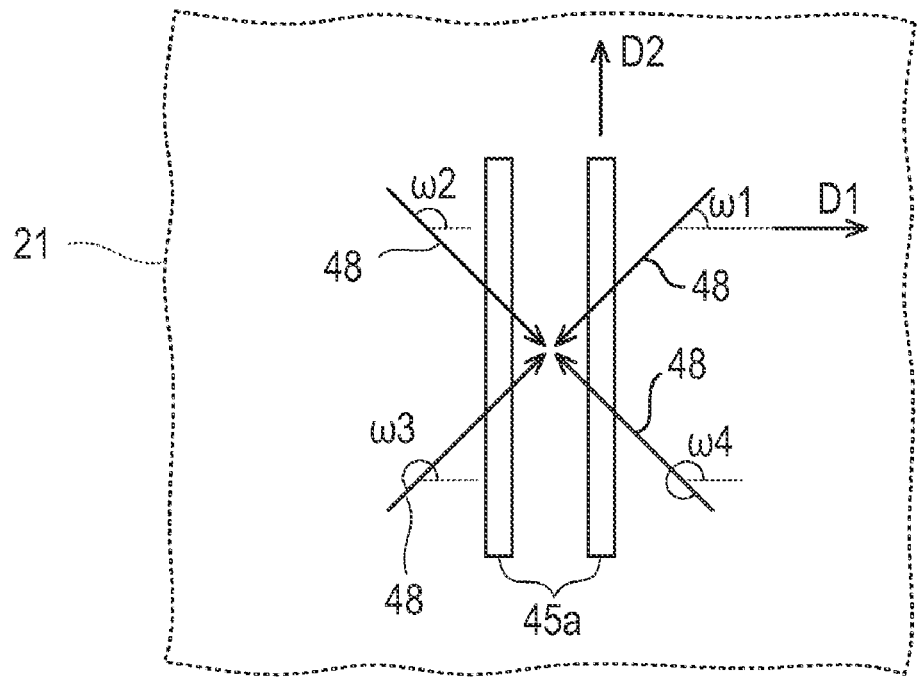
FIGS. 14A and 14B are plan views explaining a twist angle used when a pocket region is formed in the semiconductor device in accordance with the first embodiment.
Figure 14B:
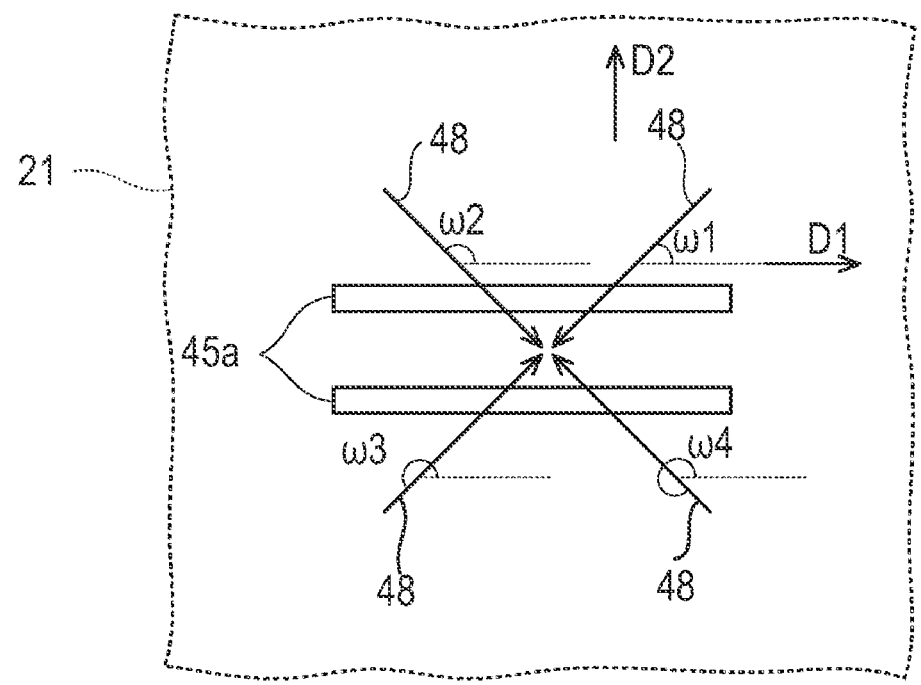

In light of this, the present embodiment uses the twist angle as illustrated in FIG. 14 to prevent the impurity 48 from being implanted into the space S.

FIG. 14 is a plan view explaining the twist angle of the ion implantation.

As described with respect to FIG. 10, the present embodiment arranges a plurality of memory macros 21 by rotating some of them by 90° from the other memory macros 21. Therefore, as illustrated in FIG. 14, the extending directions D1 and D2 of the word line 45a may be orthogonal to each other depending on the memory macro 21.

According to the present embodiment, when the pocket region 49 is formed, the impurity 48 is ion-implanted four times each by changing the twist angle. More specifically, at each ion implantation, the impurity 48 is implanted into the silicon substrate 30 from a direction oblique to the two directions D1 and D2.

In the example of FIG. 14, the tilt angles ω1 to ω4 are defined each corresponding to the first to fourth ion implantation respectively, starting at the first direction D1.

The twist angle ω1 of the first ion implantation is selected from the range 0°<ω1<90° so that the implantation direction of the impurity 48 is oblique to each of the directions D1 and D2.

Then, each of the other twist angles ω2 to ω4 is set so as to be larger by 90° than the previous twist angle.

According to the present embodiment, the twist angles ω1 to ω4 are set to 45°, 135°, 225°, and 325° respectively, and the ion implantation is performed each time with an acceleration energy of 30 KeV and a dose amount of $1.1 \times 10^{13}$ cm$^{-2}$.

When the impurity 48 is implanted obliquely with respect to the extending directions of the word lines 45a, this may prevent the risk that the impurity 48 is implanted into the silicon substrate 30 below the space S (see FIG. 12K) due to shadowing by the word line 45a and the fourth resist pattern 47.

Moreover, in the above, the implantation direction of the impurity 48 is set to be oblique with respect to both the two directions D1 and D2 so as to prevent the impurity 48 from being implanted into the silicon substrate 30 below the space S in each of the memory macros 21 as described above.

The pocket region 49 is formed in this manner, and then the fourth resist pattern 47 is removed.

Figure 12L:
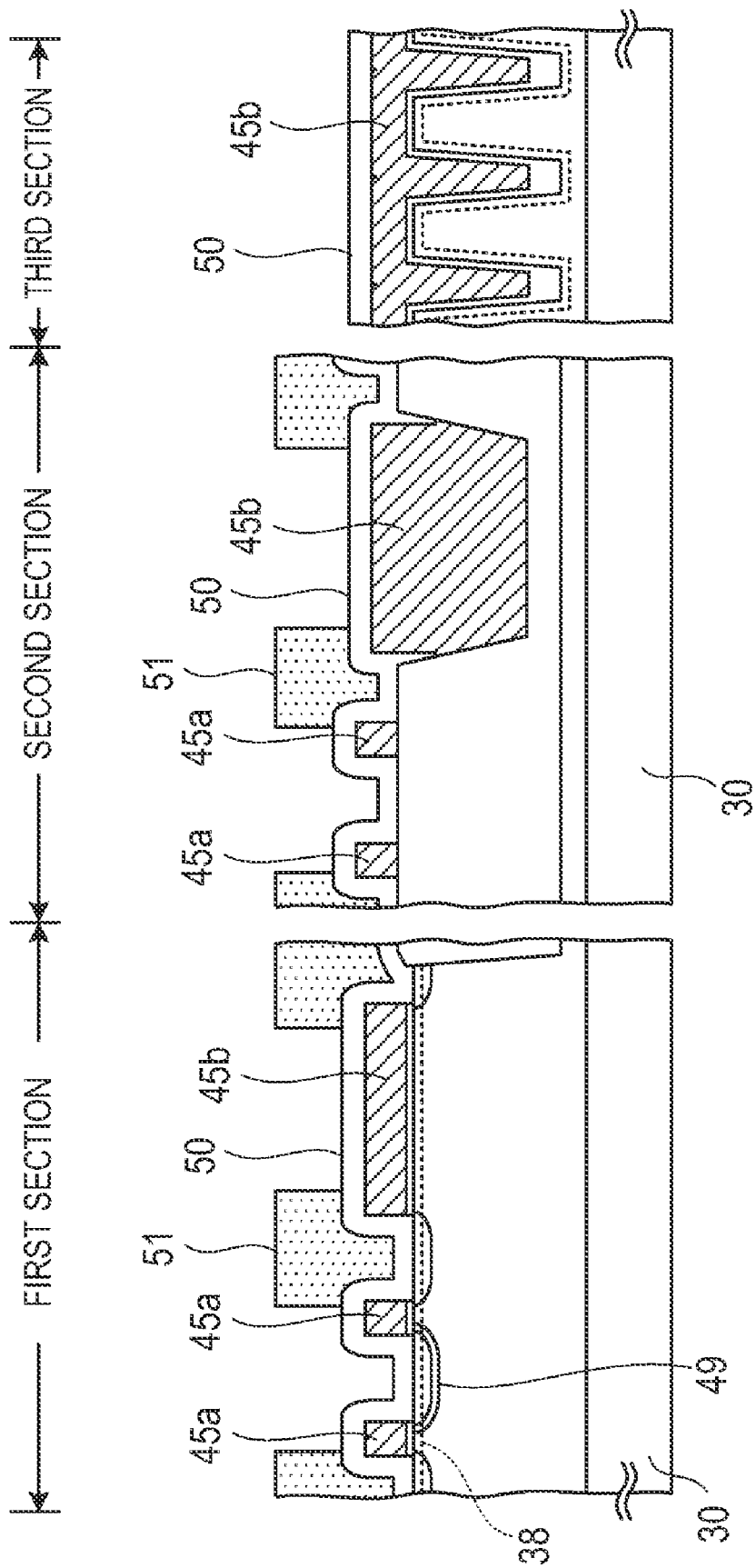

Next, the process until obtaining a sectional structure illustrated in FIG. 12L will be described.

RTA (Rapid Thermal Anneal) is performed at a substrate temperature of 900 to 1050° C. to activate the impurity in the channel region 38, the pocket region 49, and the like as well as to broaden an impurity profile in these regions.

Next, a silicon oxide film with a thickness of about 30 to 80 nm is formed on the entire upper surface of the silicon substrate 30 as a sidewall insulating film 50 by the CVD method.

It may be noted that the sidewall insulating film 50 is not limited to the silicon oxide film, but the sidewall insulating film 50 may be formed of a single layer silicon nitride film or a laminated film of a silicon oxide film and a silicon nitride film.

Afterward, photoresist is applied on the sidewall insulating film 50, and then, exposed and developed to form a fifth resist pattern 51.

Then, as illustrated in FIG. 12M, the sidewall insulating film 50 is dry-etched by using the fifth resist pattern 51 as a mask to form a sidewall spacer 50a at each side of the word line 45a and the capacitor upper electrode 45b.

Afterward, the fifth resist pattern 51 is removed.

It may be noted that a multilayer structured sidewall spacer 50a may be formed by repeating the formation and etching of the sidewall insulating film 50.

FIG. 13F is a plan view after the above process is finished, and each sectional view of the previous FIG. 12M corresponds to the sections along the A6-A6 line, the B6-B6 line, and the C6-C6 line of FIG. 13F respectively.

Figure 12N:
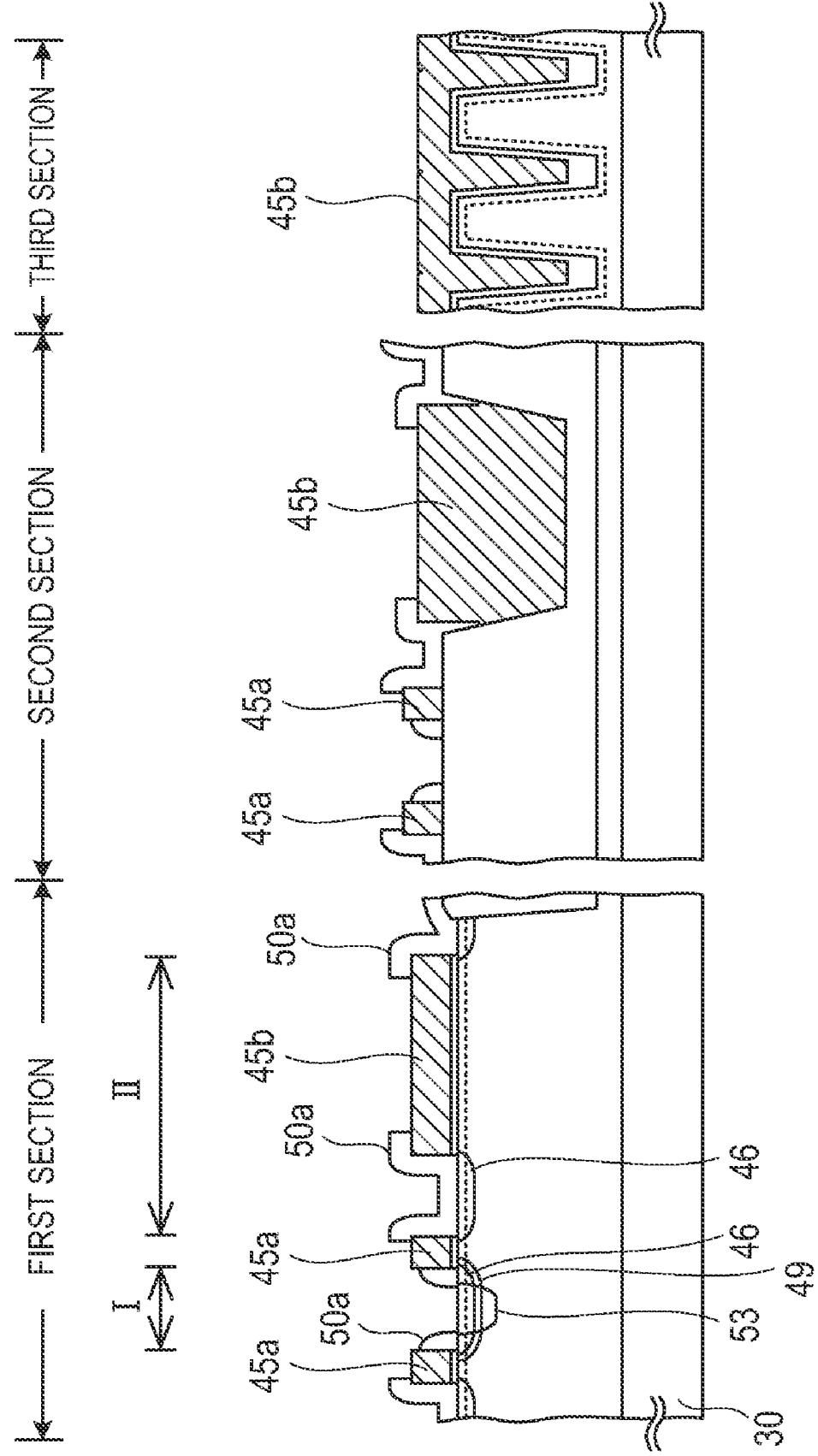

Then, as illustrated in FIG. 12N, the sidewall spacer 50a and the word line 45a are used as a mask to form a p-type source/drain region 53 by ion-implanting a p-type impurity into the silicon substrate 30 in the bit contact region I.

Figure 12O:
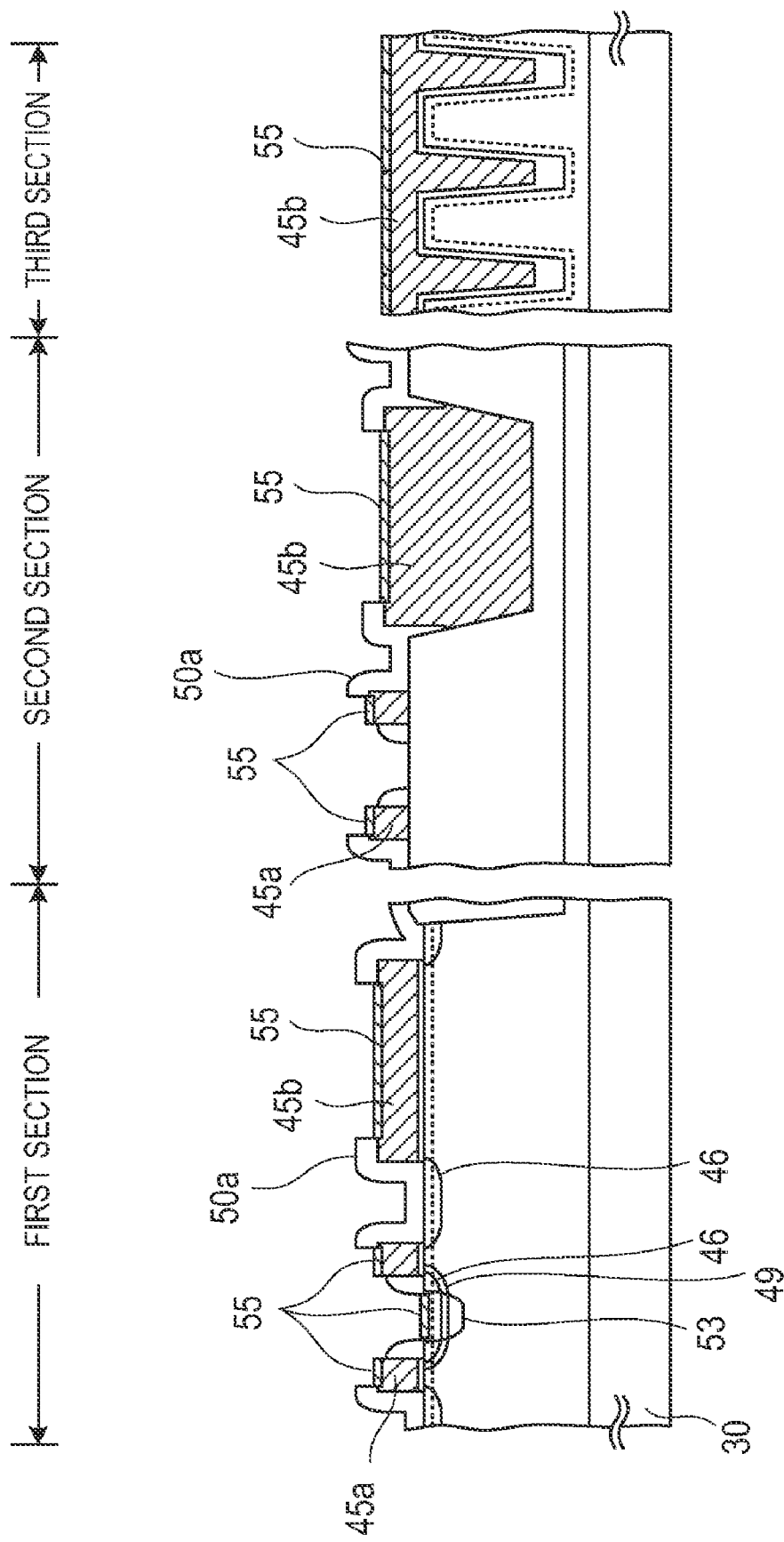

Next, the process until obtaining a sectional structure illustrated in FIG. 12O will be described.

First, a high melting point metal layer such as a cobalt layer and a nickel layer is formed on the entire upper surface of the silicon substrate 30 by a sputtering method, and then, is annealed and reacted with silicon to form a high melting point metallic silicide layer 55. Then, an unreacted high melting point metal layer on the sidewall spacer 50a and the like is removed by wet-etching to leave the high melting point metallic silicide layer 55 on the word line 45a, the capacitor upper electrode 45b, and the source/drain region 53. The high melting point metallic silicide layer 55 assures low resistance of the word line 45a and the like.

Next, the process until obtaining a sectional structure illustrated in FIG. 12P will be described.

First, a silicon oxide film is formed on the silicon substrate 30 as a first interlayer insulating film 56 by the CVD method. Then, the first interlayer insulating film 56 is patterned to form a contact hole 56a on the source/drain region 53. Note that although not illustrated, the contact hole 56a is also formed on the end portion of the capacitor upper electrode 45b.

Then, a contact plug 57 made mainly of tungsten is formed in a contact hole 56a. Further, a second interlayer insulating film 59 such as a silicon oxide film is formed on the upper surface of each of the contact plug 57 and the first interlayer insulating film 56.

Then, a wiring groove is formed in the second interlayer insulating film 59 by photolithography, and a copper film is formed inside the wiring groove as a bit line 58 by a damascene method.

Figure 13G:
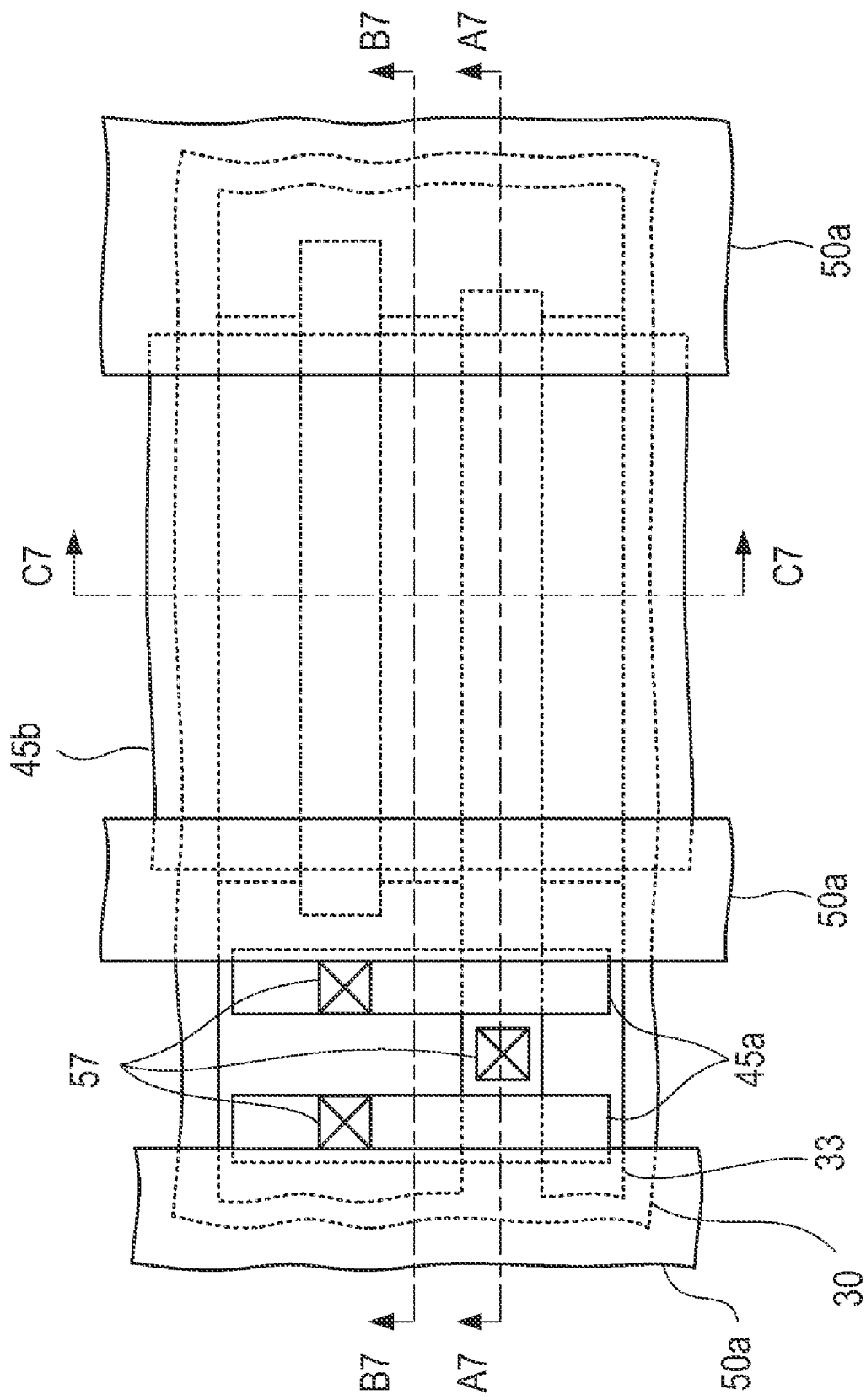

FIG. 13G is a plan view after the above process is finished, and each sectional view of the previous FIG. 12P corresponds to the sections along the A7-A7 line, the B7-B7 line, and the C7-C7 line of FIG. 13G respectively.

As illustrated in FIG. 13G, the extending direction of the bit line 58 is orthogonal to the extending direction of the word line 45a.

Thus, the basic structure of the semiconductor device in accordance with the present embodiment is completed.

According to the semiconductor device, as illustrated in FIG. 12P, the gate insulating film 40 under the capacitor upper electrode 45b serves as a capacitor dielectric film of the cell capacitor C. Moreover, the channel region 38 below the capacitor upper electrode 45b serves as the lower electrode of the cell capacitor C.

The word line 45a also serves as a gate electrode of the transfer transistor TR, and the source/drain extension 46 on the storage region II side of the transfer transistor TR is electrically connected to the lower electrode of the cell capacitor C.

Figure 15:
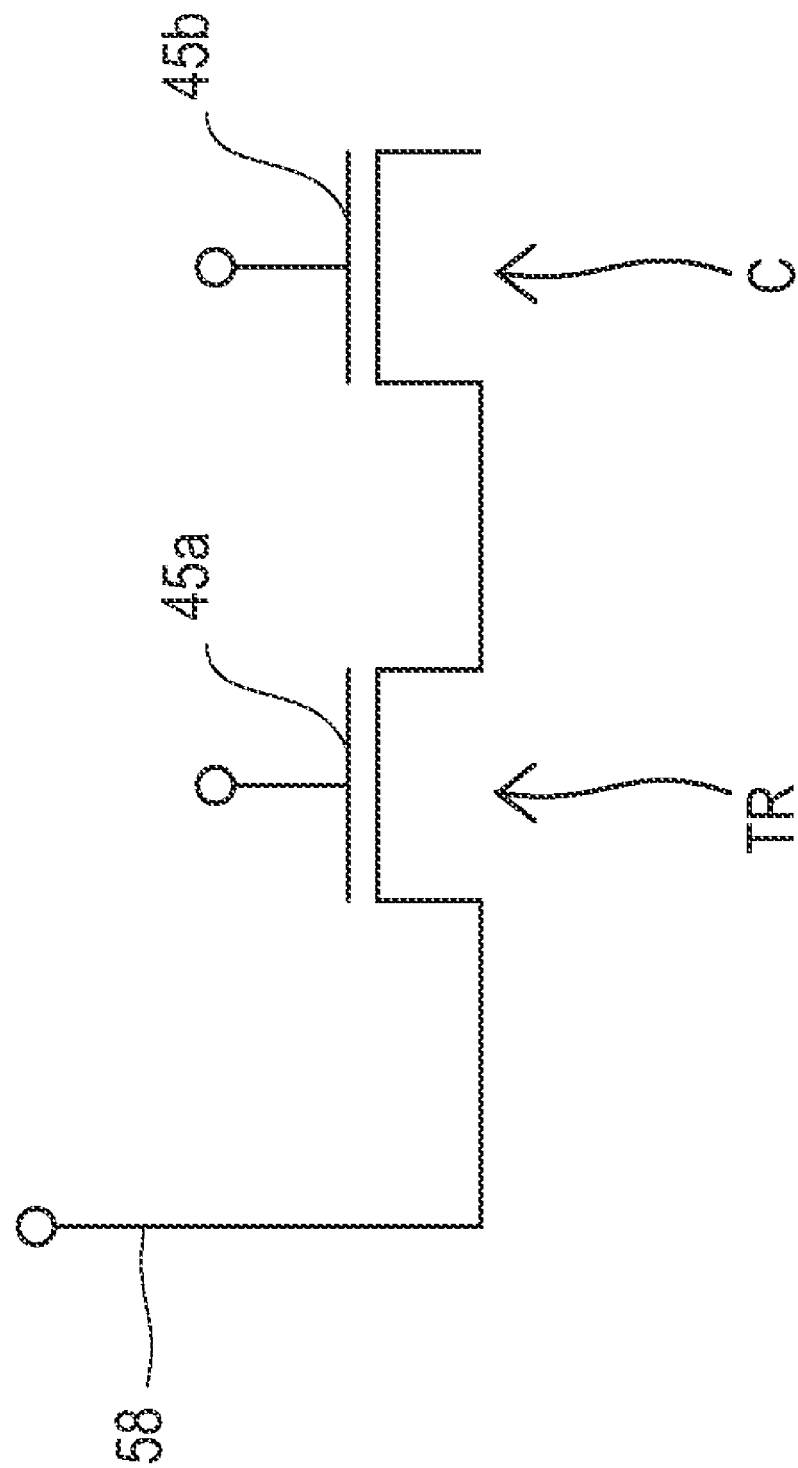
FIG. 15 is an equivalent circuit diagram of the semiconductor device in accordance with the first embodiment.

FIG. 15 is an equivalent circuit diagram of the semiconductor device.

Under actual usage, a predetermined potential is given to the upper electrode 45b of the cell capacitor C to put the channel region 38 thereunder in an ON state. The potential of the channel region 38 changes depending on whether the information written in the capacitor C is "1" or "0". Therefore, the information written in the capacitor C may be read by reading the potential through the transfer transistor TR.

According to the present embodiment described above, as illustrated in FIG. 12K, of the side surfaces 45c and 45d of the word line 45a, the pocket region 49 is formed only in the silicon substrate 30 in the bit contact region I, and the pocket region 49 is not formed in the storage region II.

For this reason, a sharp pn junction between the p-type source/drain extension 46 and the n-type pocket region 49 is not formed in the storage region II. Therefore, junction leakage due to a sharp pn junction does not occur in the storage region II, and thus the charges accumulated in the cell capacitor C may be held for a long time, thereby improving retention characteristics of the cell capacitor C.

Further, when the pocket region 49 is formed, as illustrated in FIG. 14, the twist angle $\omega 1$ is selected so as to implant the impurity 48 obliquely with respect to both the first and second directions D1 and D2 which are extending directions of the word lines 45a.

For this reason, even if the space S is generated between the word line 45a and the fourth resist pattern 47 (see FIG. 12K), the risk that the impurity 48 is implanted into the storage region II through the space S may be reduced by shadowing of the word line 45a and the fourth resist pattern 47.

Further, as described above, the impurity 48 is implanted obliquely with respect to both the two directions D1 and D2, which may suppress the impurity 48 from being implanted below the space S of each memory macro 21, and may form the pocket region 49 only in the bit contact region I.

Hereinafter, a result of the experiment conducted to confirm the effects of the present embodiment will be described.

FIG. 16 lists the process conditions of the samples used for this experiment.

In this experiment, four silicon substrates 30 were used as the samples A to D. A process marked with a circle in FIG. 16 is performed on each silicon substrate 30 under the corresponding condition listed.

Of these samples, the samples A and B are for reference, and unlike the present embodiment, the pocket region 49 is formed on both sides of the word line 45a. Note that when the pocket region 49 is formed, for the samples A and B, the twist angle is selected so as to be perpendicular or parallel to the extending direction of the word line.

In contrast to this, for samples C and D, like the present embodiment, the pocket region 49 is formed only in the bit contact region I on a side of the word line 45a. Moreover, when the pocket region 49 is formed, for the samples C and D, the twist angle is selected so as to be oblique with respect to the extending direction of the word line.

Note that when the pocket region 49 is formed, the dose amount for the sample D is greater than that for the sample C.

Figure 17:
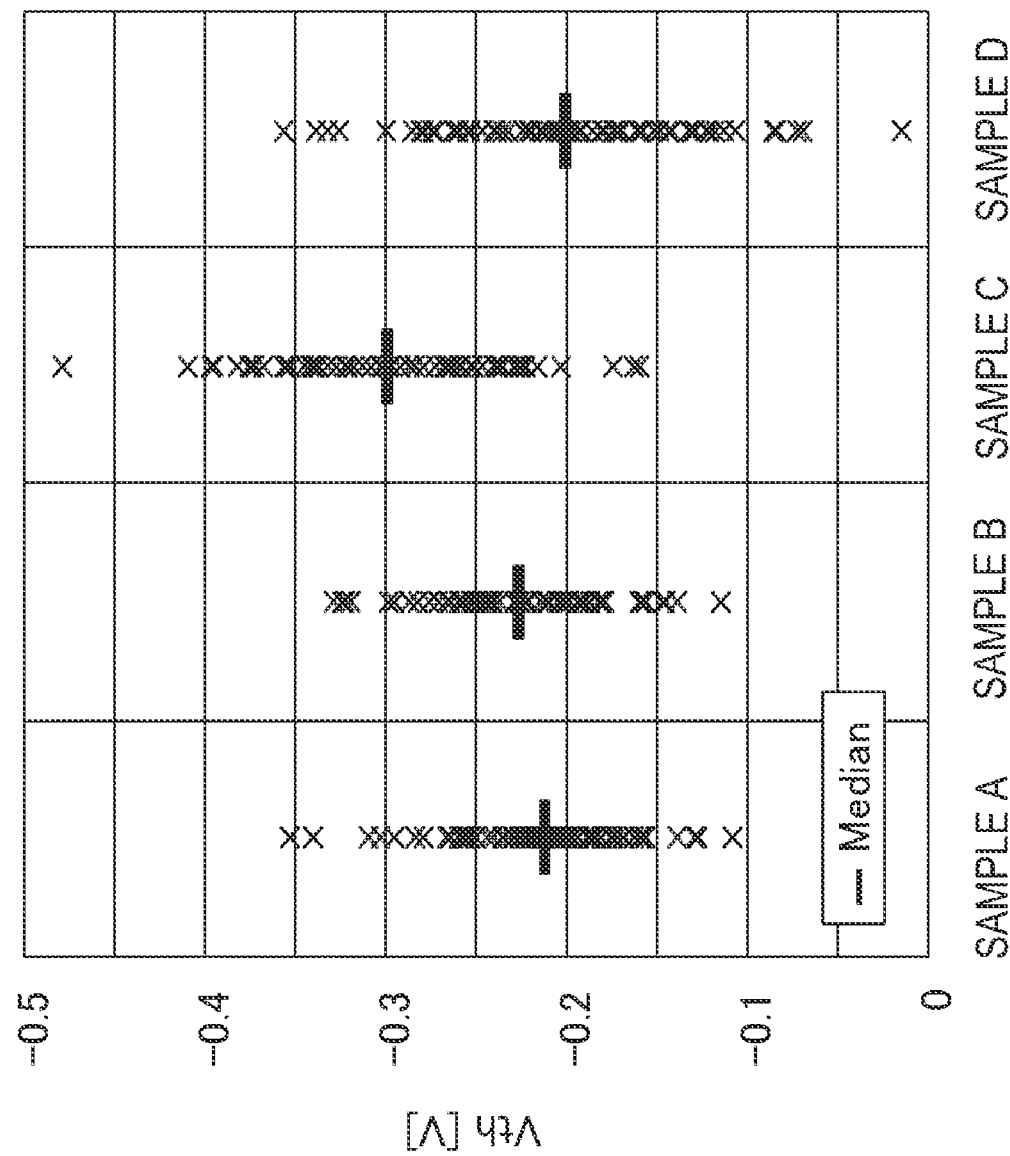
FIG. 17 is a drawing obtained by experimentation utilizing threshold voltages of transfer transistors formed from each sample of FIG. 16.

FIG. 17 is a drawing obtained by experimentation utilizing a threshold voltage Vth of the transfer transistor TR formed on each of the samples A to D under the aforementioned conditions. Note that this experiment was made on each of the plurality of transfer transistors TR formed on the silicon substrate 30.

The threshold voltage decreases by the short channel effects, and thus serves as one of the indicators to see whether or not the short channel effects is suppressed by the pocket region 49.

As illustrated in FIG. 17, in the sample C where the pocket region 49 is formed in a side of the word line 45a, the threshold voltage thereof was higher than that of the reference samples A and B. Therefore, it is assumed that in the sample C, an n-type impurity was implanted in the pocket region 49 in high concentration and the pocket region 49 worked well in suppressing the short channel effects.

Note that such a high concentration of the pocket region 49 provides a sharp pn junction between the p-type source/drain extension 46 and the n-type pocket region 49, and thus there is concerned about a shorter holding time of the charges in the cell capacitor C.

On the other hand, the threshold voltage of the sample D was lower than that of the reference samples A and B. Therefore, it is assumed that in the sample D, the pocket region 49 did not worked very well in suppressing the short channel effects and the impurity concentration of the pocket region 49 was low. Such a low concentration provides a moderate pn junction between the p-type source/drain extension 46 and the n-type pocket region 49, and thus there may be expected a longer holding time of the charges in the cell capacitor C.

In light of this, the holding time of the charges in the cell capacitor C is examined for each of the samples A to D.

Figure 18:
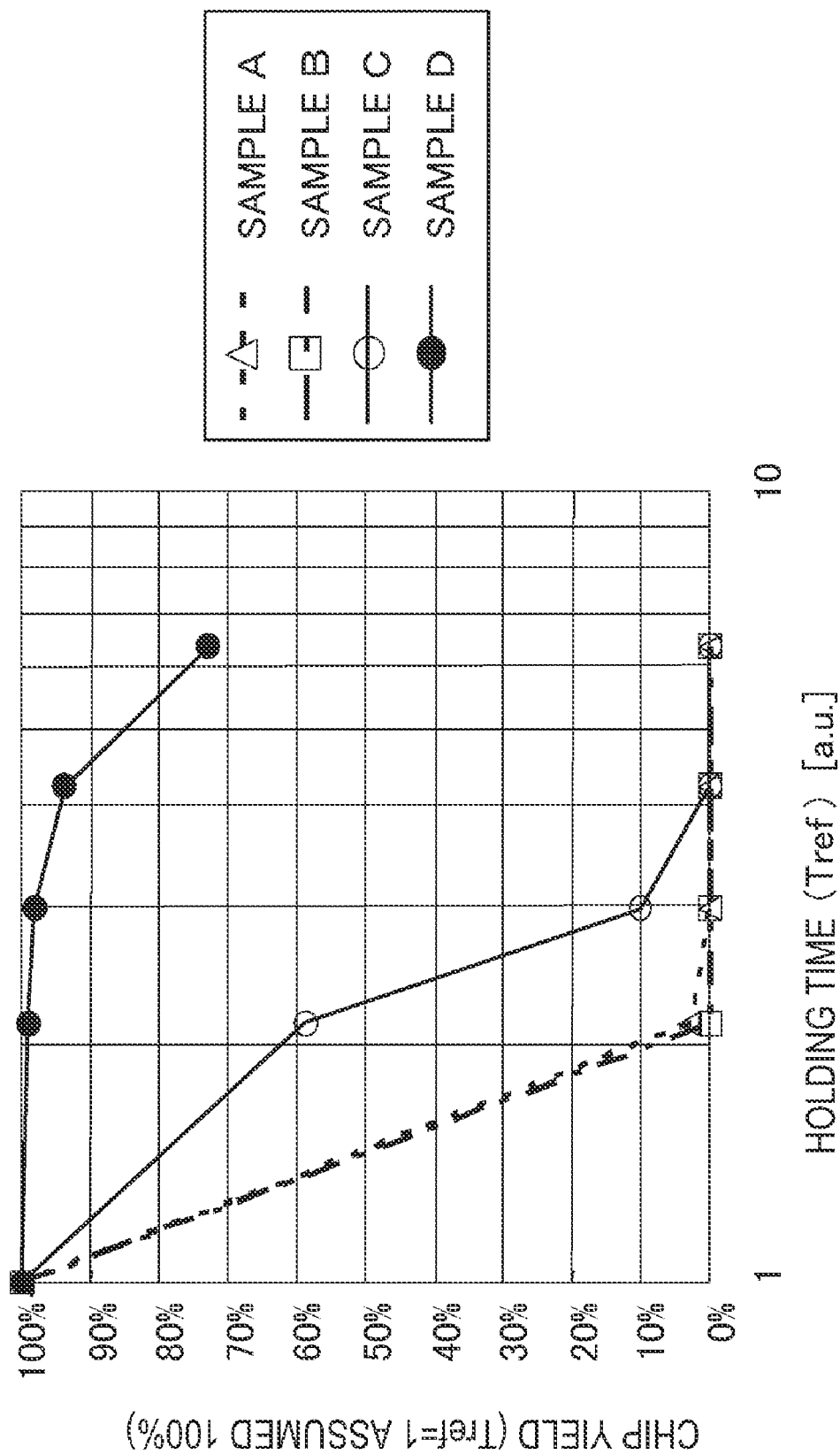
FIG. 18 is a graph obtained by experimentation of holding times of charges in cell capacitors formed from each sample of FIG. 16.

The experimental result is illustrated in FIG. 18.

The horizontal axis of FIG. 18 represents the holding time (Tref) of charges in an arbitrary unit. Note that the holding time in this experiment refers to the time from reading an amount of charge accumulated in a cell capacitor until reading next one.

The vertical axis of FIG. 18 represents chip yield. In this experiment, it is assumed that the holding time (Tref) is 1 when the chip yield is 100%.

As illustrated in FIG. 18, the samples A and B, where the pocket region 49 is formed on both sides of the word line 45a, indicate that the yield decreases rapidly when the holding time becomes long. It may be considered that since the pocket region 49 is formed also on the storage region II side, leakage current occurs in the pn junction between the pocket region 49 and the source/drain extension 46, which causes the charges to flow out of the cell capacitor C.

On the other hand, the trend of decreasing yield is suppressed in the samples C and D according to the present embodiment, where the pocket region 49 is formed only on the bit contact region I side, and the twist angle is selected so as to be oblique with respect to the extending direction of the word line. In particular, the sample D exhibits the remarkable effects thereof.

Accordingly, it has been confirmed that the pocket region 49 is formed only on the bit contact region I side, and an impurity of the pocket region 49 is implanted obliquely with respect to the extending direction of the word line, which are effective in increasing the holding time and in improving the refresh characteristics of the cell capacitor C.

(3) Second Embodiment

In the first embodiment, when the pocket region 49 is formed in the process of FIG. 12K, the tilt angle θ is set to a value greater than 0°. In addition, regarding the twist angle ω, as illustrated in FIG. 14, the angles ω1 to ω4 are used so as to implant an impurity obliquely with respect to both the first and second directions D1 and D2 where the word lines 45a extend.

This reduces the risk that even if the word lines 45a extend in two directions D1 and D2 in a chip, the impurity 48 used to form the pocket region 49 is implanted into the space S (see FIG. 12K). Therefore, the pocket region 49 may be formed only in the bit contact region I which is a side of each of the two word lines 45a, each extending in different directions.

The present embodiment calculates the allowable range of the tilt angle θ to prevent the impurity 48 from being implanted into the space S.

It may be noted that the same reference numerals or characters as those described in the first embodiment are assigned to the components in FIGS. 19 to 25, and the description thereof is omitted.

Figure 19A:
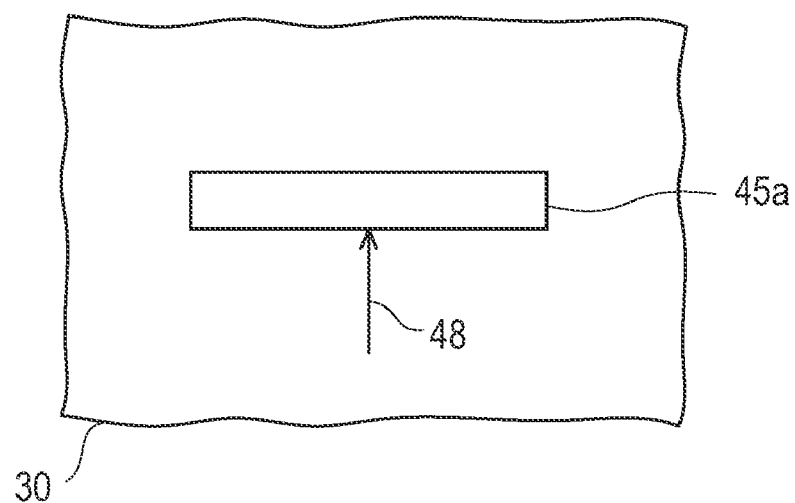
FIG. 19A is a plan view illustrating the directions where an impurity is implanted in a second embodiment.

FIG. 19A is a plan view illustrating the direction where the impurity 48 is implanted. In this example, on the basis of the direction orthogonal to the extending direction of the word line 45a, the twist angle ω is set to 0°.

Figure 19B:
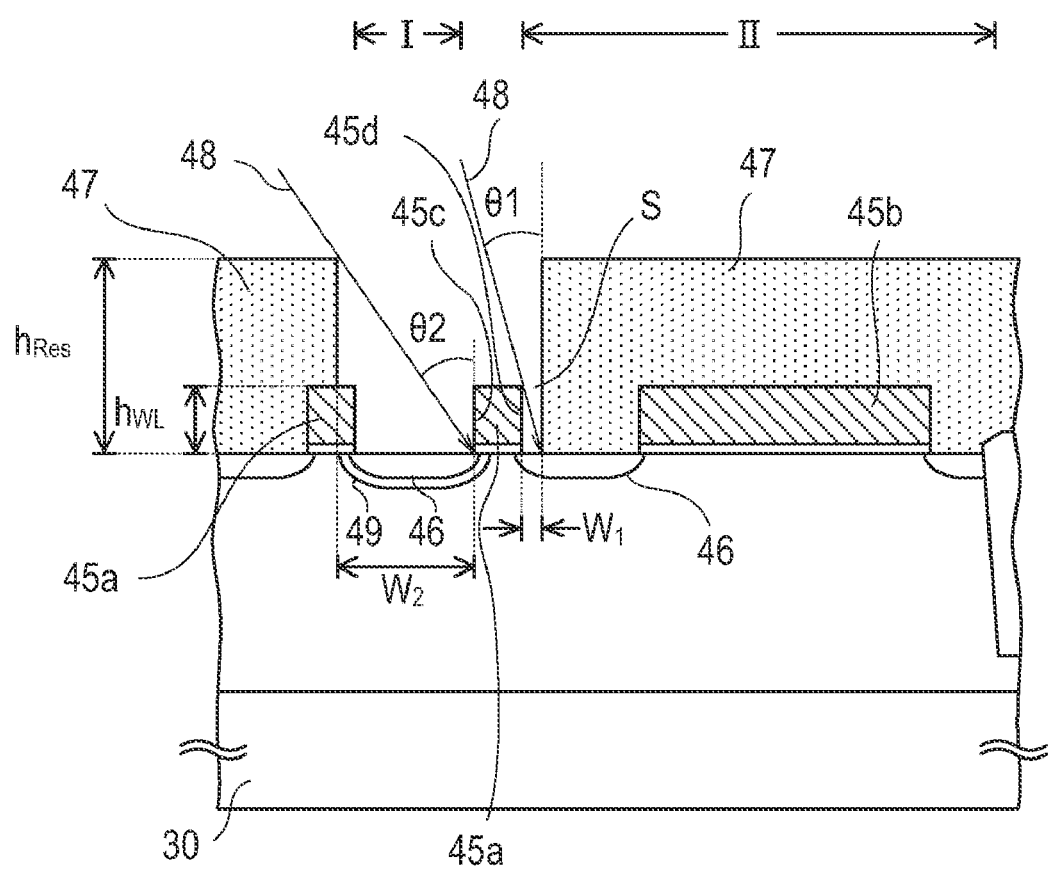
FIG. 19B is a sectional view schematically illustrating how to calculate the allowable range of a tilt angle at a twist angle of 0°.

FIG. 19B is a sectional view schematically illustrating how to calculate the allowable range of the tilt angle θ in the case of the twist angle ω set to 0° in this manner.

In FIG. 19B, hRes denotes the height of the fourth resist pattern 47 and hWL denotes the height of the word line 45a.

In addition, W1 denotes the width of the space S which occurs in the storage region II side due to a positional misalignment between the fourth resist pattern 47 and the word line 45a. W2 denotes the distance between the mutually facing side surfaces of the word line 45a and the fourth resist pattern 47.

At this time, the minimum angle θ1 allowed for the tilt angle is a minimum tilt angle which may prevent the impurity 48 from being implanted into the silicon substrate 30 below the space S due to shadowing of the word line 45a.

The minimum angle θ1 is geometrically calculated by the following expression (1) from FIGS. 19A and 19B.

[Expression 1]

$$\theta_1 = \arctan\left(\frac{W_1}{h_{WL}}\right) \qquad (1)$$

At ion implantation, it is preferable to set the tilt angle in a range of the minimum angle θ1 or more by assuming the space S between the side surfaces of the word line 45a and the fourth resist pattern 47 due to a manufacturing error such as a positional misalignment. This assures that at ion implantation, the shadow of the word line 45a reaches the side surface of the fourth resist pattern 47 in the space S, and thus the impurity 48 is not implanted into the storage region II, thereby reducing the risk of unnecessarily forming the pocket region 49 in the storage region II.

On the other hand, the maximum angle θ2 allowed for the tilt angle is a maximum tilt angle which allows the impurity 48 to be implanted into the bit contact region I at a side of the word line 45a without being affected by the shadowing of the fourth resist pattern 47.

The maximum angle θ2 is geometrically calculated by the following expression (2) from FIG. 19B.

[Expression 2]

$$\theta_2 = \arctan\left(\frac{W_2}{h_{Res}}\right) \quad (2)$$

When the tilt angle is set in a range of the maximum angle θ2 or less, at ion implantation, the shadow of the fourth resist pattern 47 does not reach the side surface 45c of the word line 45a and thus the pocket region 49 may be formed so as to extend from the bit contact region I side to below the word line 45a.

Figure 20:
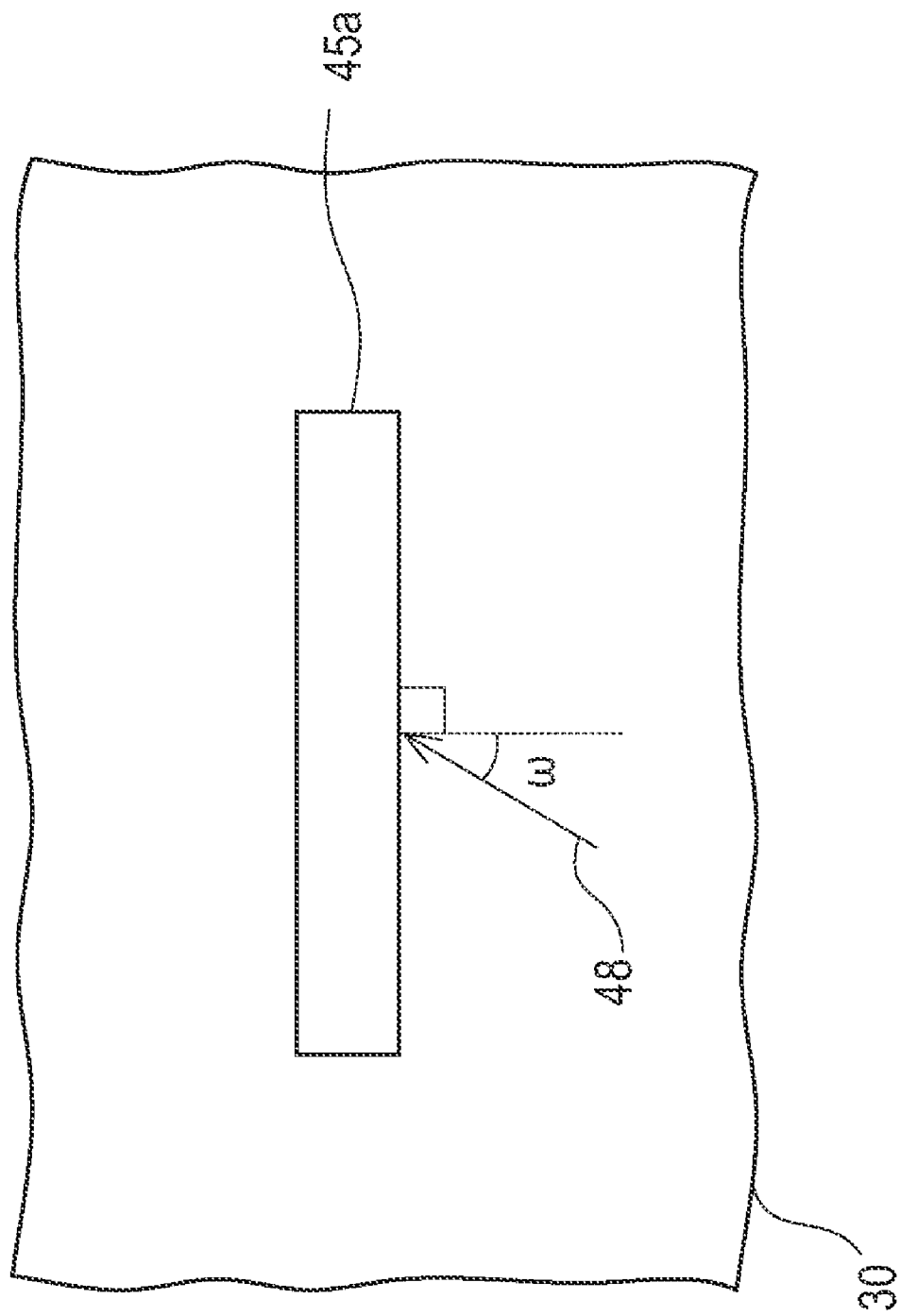
FIG. 20 is a plan view schematically illustrating a case where the tilt angle is set to be greater than 0° in the second embodiment.

Next, as illustrated in the plan view of FIG. 20, consideration is made on a case where the tilt angle ω is set to be greater than 0°.

In this case, W1 and W2 in FIG. 19B are equivalent to W1/cos ω and W2/cos ω respectively. Accordingly, the minimum angle θ1 and the maximum angle θ2 of the tilt angle are calculated by the following expressions (3) and (4) obtained from the expressions (1) and (2) respectively.

[Expression 3]

$$\theta_1 = \arctan\left(\frac{W_1}{h_{WL} \cdot \cos\omega}\right) \quad (3)$$

[Expression 4]

$$\theta_2 = \arctan\left(\frac{W_2}{h_{Res} \cdot \cos\omega}\right) \quad (4)$$

Figure 21A:
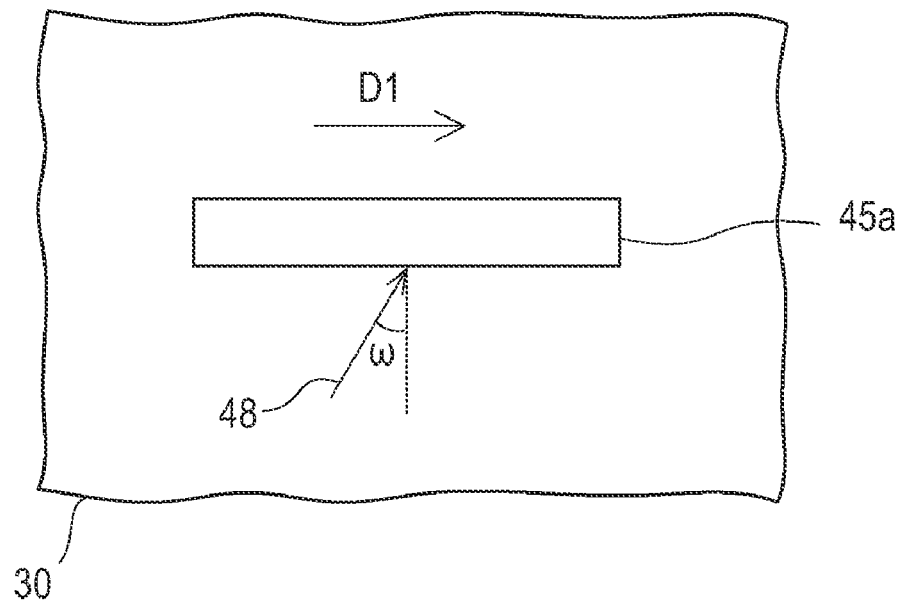
FIGS. 21A and 21B are plan views schematically illustrating that word lines in a chip have two extending directions perpendicular to each other in the second embodiment.
Figure 21B:
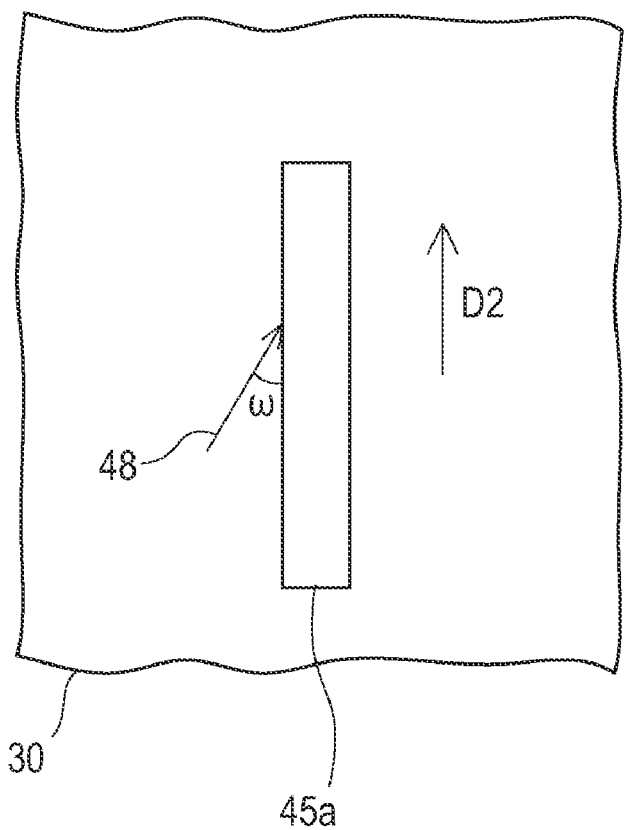

As illustrated in the plan view of FIGS. 21A and 21B, the extending directions of the word lines 45a in a chip have two mutually orthogonal directions D1 and D2. In this case, the minimum angle is calculated by the expression (3) for each of the word lines 45a extending in directions D1 and D2, and the maximum value of them is used as the minimum angle θ1 of the tilt angle. Accordingly, the minimum angle θ1 is represented by the following expression (5).

[Expression 5]

$$\theta_1 = \max\left[\arctan\left(\frac{W_1}{h_{WL} \cdot \cos\omega}\right), \arctan\left(\frac{W_1}{h_{WL} \cdot \cos\left(\frac{\pi}{2} - \omega\right)}\right)\right] \quad (5)$$

In contrast, regarding the maximum angle θ2 of the tilt angle in this case, the maximum angle is calculated by the expression (4) for each of the word lines 45a extending in directions D1 and D2, and the minimum value of them may be calculated by the following expression (6).

[Expression 6]

$$\theta_2 = \max\left[\arctan\left(\frac{W_2}{h_{Res} \cdot \cos\omega}\right), \arctan\left(\frac{W_2}{h_{Res} \cdot \cos\left(\frac{\pi}{2} - \omega\right)}\right)\right] \quad (6)$$

In the actual mass production process, it is preferable to select the tilt angle θ in a range θ1<<θ<<θ2 in order to insure the manufacturing margin by considering manufacturing variations of the ion implanting directions.

It is understood from the expressions (5) and (6) that there is no solution when the twist angle ω is near 0° which is turned to θ1>θ2. Accordingly, it is preferable to set the twist angle ω to be near 45° which is turned to θ1<<θ<<θ2.

Next, on the basis of the parameters used in the actual mass production process, the minimum angle θ1 and the maximum angle θ2 of the tilt angle are calculated.

Figure 22:
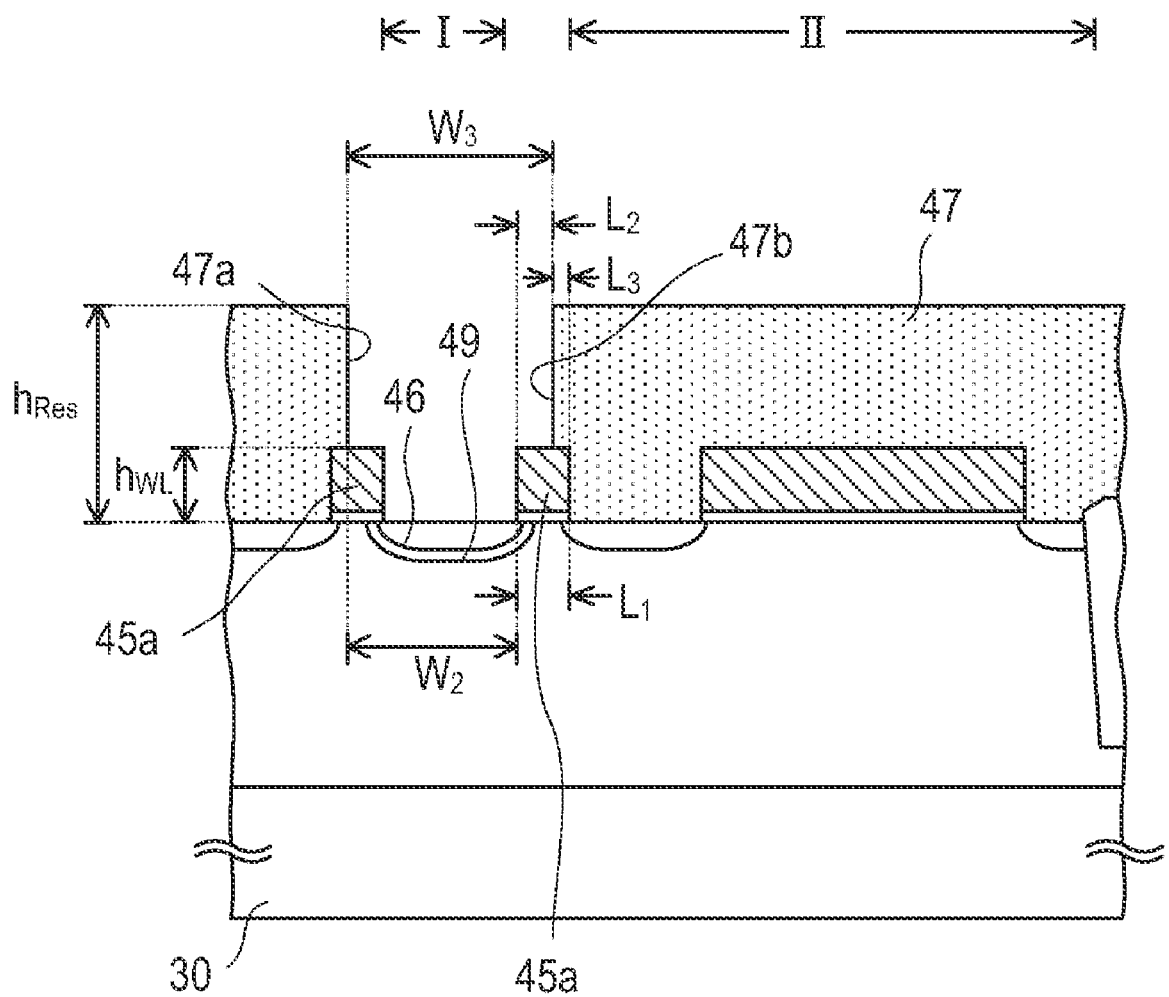
FIG. 22 is a sectional view schematically illustrating design parameters used in the second embodiment.

Hereinafter, the design parameters illustrated in the sectional view of FIG. 22 are used for calculation. Note that in FIG. 22, W3 denotes the width of the window 47a of the fourth resist pattern 47; and L1 denotes the gate length of the word line 45a. Further, L3 denotes the length of the overlapped portion of the word line 45a and the fourth resist pattern 47; and L2 denotes the length of a portion of the word line 45a which portion is exposed to the window 47a.

The example of FIG. 22 assumes a design arrangement where there is no positional misalignment between the fourth resist pattern 47 and the word line 45a.

According to the designed layout of the fourth resist pattern 47, as illustrated in FIG. 22, L2 is not equal to L3. More specifically, the side surface 47b of the fourth resist pattern 47 is shifted closer to the storage region II side from the center of the word line 45a. This is to surely form the pocket region 49 below the word line 45a by preventing the word line 45a from being completely covered with the fourth resist pattern 47 even if a positional misalignment of the fourth resist pattern 47 occurs.

However, in practice, the fourth resist pattern 47 may be shifted right or left as a whole with respect to the word line 45a, or the width W3 of the window 47a may be greater than the design value.

The positional misalignment of the fourth resist pattern 47 in the horizontal direction is typically about 0.04 μm. In addition, the width W3 of the window 47a is typically about 0.035 μm greater than the design value. Accordingly, the positional misalignment of the fourth resist pattern 47 with respect to the word line 45a is expected to about 0.044 μm $(=((0.040)^2+(0.0175)^2)^{1/2} \mu m)$.

Figure 23:
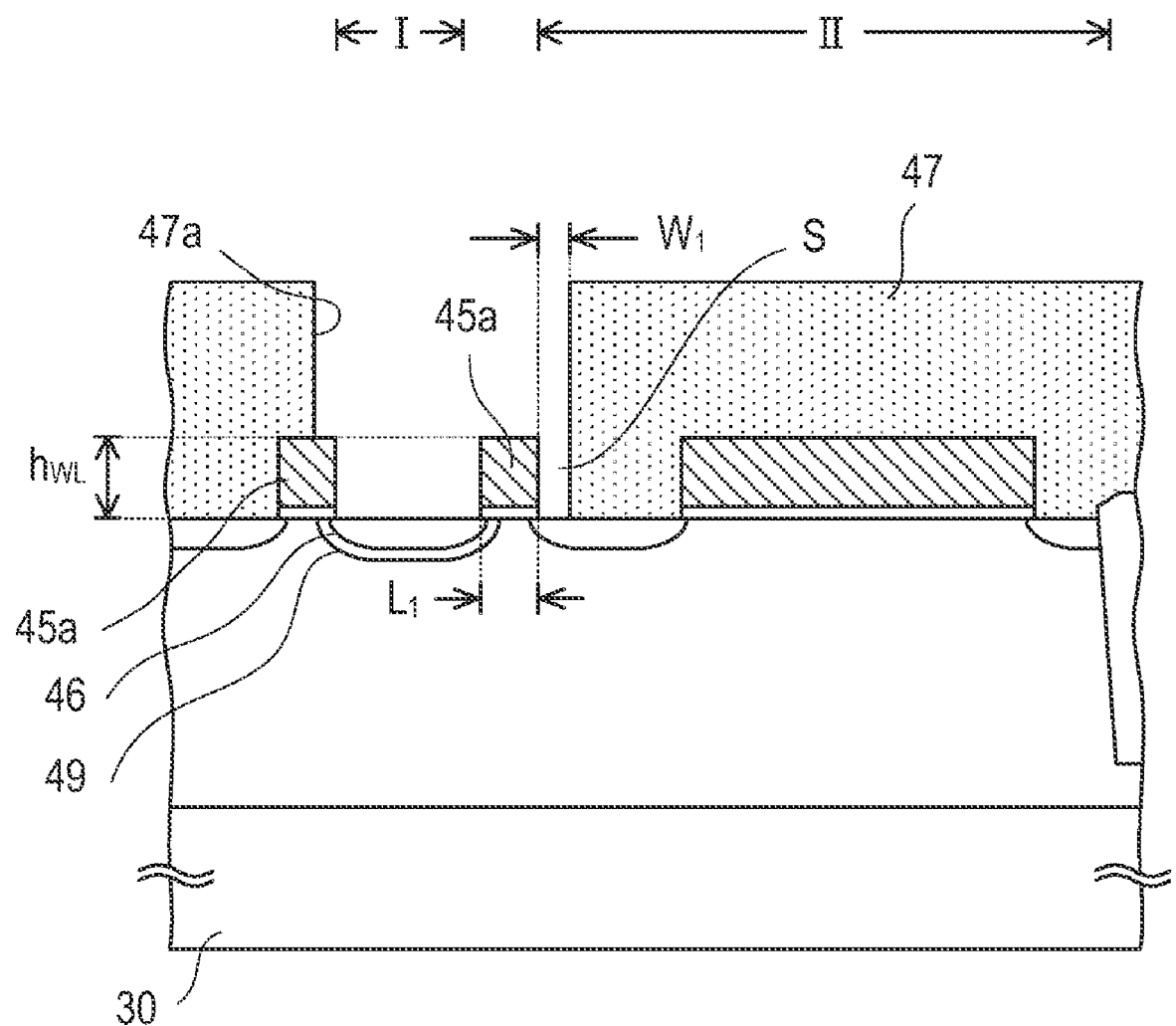
FIG. 23 is a sectional view for calculating a maximum value estimated for a space between a word line and a resist pattern in the second embodiment.

FIG. 23 is a sectional view for calculating a maximum value estimated for the width W1 of the space S. The maximum value is used to calculate the minimum angle θ1 of the tilt angle.

In this example, the gate length L1 of the word line 45a is assumed to be 0.084 μm, which is smaller by a maximum thin width (0.006 μm) estimated in manufacturing than a target value of 0.09 μm.

In this case, if the word line 45a becomes thinner equally from both side surfaces, the side surface of the word line 45a is farther by 0.006/2 μm from the side surface of the fourth resist pattern 47 in the space S.

As described above, the positional misalignment of the fourth resist pattern 47 with respect to the word line 45a is expected to be 0.044 μm. Therefore, the side surface of the word line 45a is farther by 0.044 μm+0.006/2 μm from the side surface of the fourth resist pattern 47 in the space S.

As illustrated in FIG. 22, the overlapped length L3 of the third resist pattern 43 and the word line 45a is 0.03 μm as the target value, and thus the maximum value estimated for the width W1 of the space S is 0.017 μm (0.044 μm+0.006/2 μm−0.03 μm).

Figure 24:
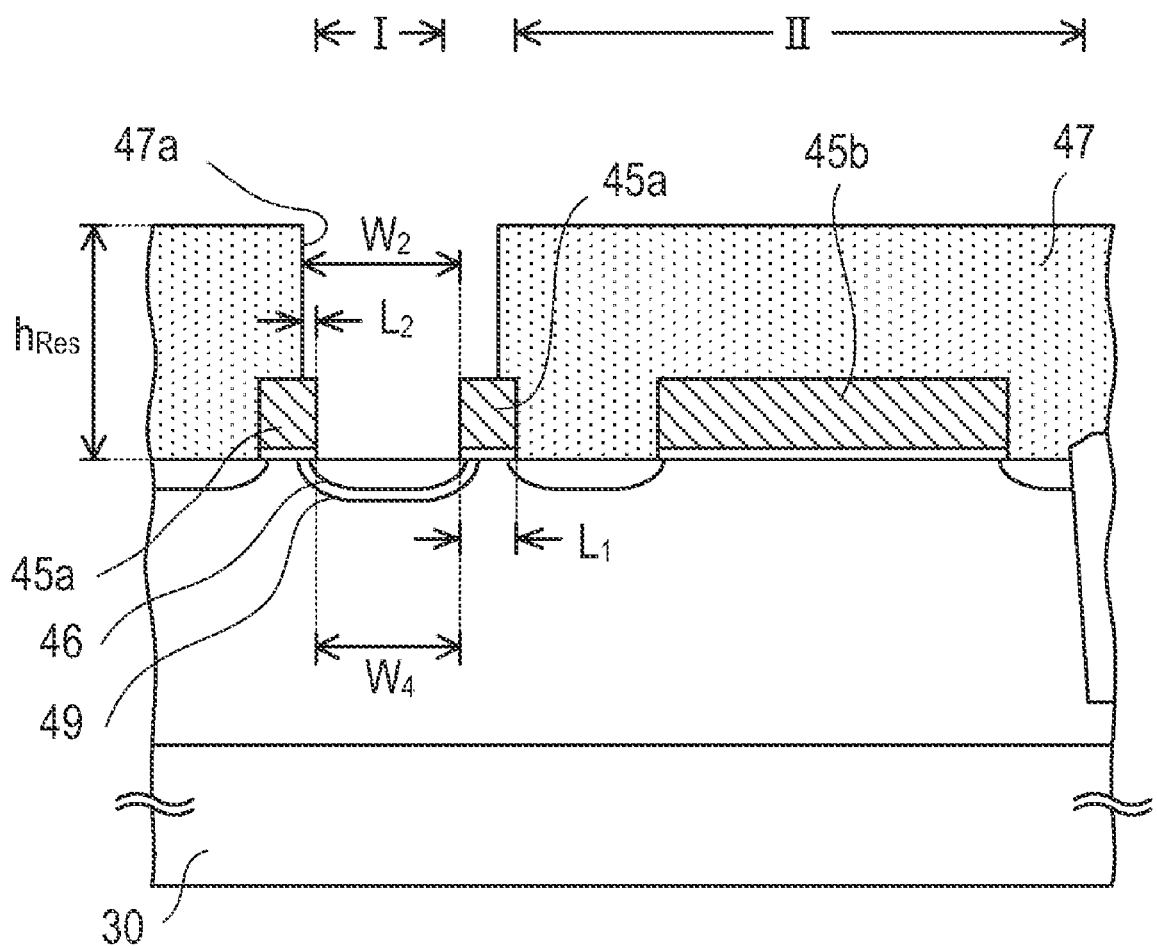
FIG. 24 is a sectional view for calculating a minimum value estimated for a space between a side surface of the word line and a side surface of the resist pattern in the second embodiment.

FIG. 24 is a sectional view for calculating a minimum value estimated for distance W2. The minimum value is used to calculate the maximum angle θ2 of the tilt angle.

In this example, the gate length L1 of the word line 45a is assumed to be 0.096 μm, which is larger by a maximum thick width (0.006 μm) estimated in manufacturing than a target value of 0.09 μm.

In this case, if the word line 45a becomes thicker equally from both side surfaces, the distance W2 becomes smaller by 0.006/2 μm. The decrease of the distance W2 includes the above calculated amount (0.044 μm) of the positional misalignment of the fourth resist pattern 47 with respect to the word line 45a.

Accordingly, the minimum value of the distance W2 becomes 0.213 μm which is obtained by subtracting the above sum of 0.006/2 μm and 0.044 μm from the sum of the design value (0.20 μm) of the distance W4 between the adjacent word lines 45a and the design value (0.06 μm) of the length L2.

Figure 25:
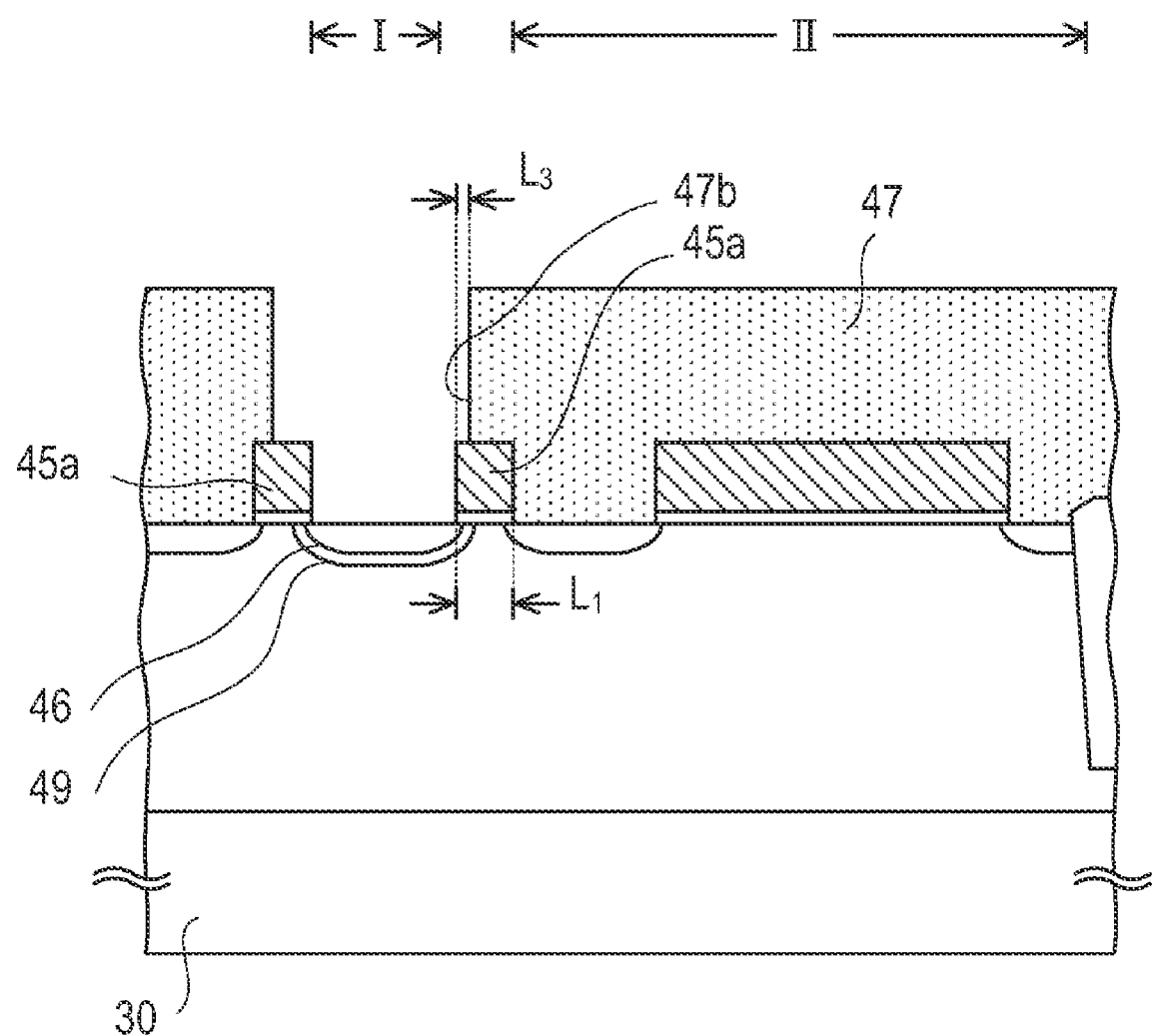
FIG. 25 is a sectional view schematically illustrating a case where the side surface of the resist pattern is positioned closer to the bit contact region than the center of the word line due to a positional misalignment in the second embodiment.

FIG. 25 is a sectional view illustrating a case where the side surface 47b of the fourth resist pattern 47 is positioned closer to the bit contact region I than the center of the word line 45a due to a positional misalignment of the fourth resist pattern 47 and the decrease in the gate length L1 of the word line 45a.

Note that this example assumes the case where the gate length L1 of the word line 45a is smaller by 0.006 μm than the design value of 0.09 μm and both side surfaces thereof are retracted each by 0.006 μm/2.

In this case, the length L3 becomes smaller than the design value of 0.06 μm. The decrease amount includes the above calculated positional misalignment amount (0.044 μm) of the fourth resist pattern 47 and a retracted amount (0.006 μm/2) of one side surface of the word line 45a. Accordingly, the length L3 becomes 0.013 μm (=0.06 μm−0.044 μm−0.003 μm).

It is understood from this result that the pocket region 49 may be formed below the word line 45a without the fourth resist pattern 47 falling off from the upper surface of the word line 45a to the bit contact region I side.

As described above, the maximum value estimated for the width W1 of the space S is 0.017 μm; and the minimum value estimated for the distance W2 is 0.213 μm.

In this case, assuming that the height hWL of the word line 45a is 0.11 μm, the height hRes of the fourth resist pattern 47 is 0.295 μm, and the twist angle ω is 45°, the minimum angle θ1 and the maximum angle θ2 of the tilt angle θ are determined as the following expression (7) obtained by expressions (5) and (6).

[Expression 7]

$$\theta_1 = \left[\arctan\left(\frac{0.017}{0.11 \cdot \cos 45°}\right)\right] \quad (7)$$
$$= 12.3° \ll \theta \ll \theta_2$$
$$= \left[\arctan\left(\frac{0.213}{0.295 \cdot \cos 45°}\right)\right]$$
$$= 45.6°$$

Here, a double inequality sign "≪" is used to consider manufacturing variations of the ion implanting direction as described above. In practice, the tilt angle θ may be within the range of the expression (7) allowing for some degrees from the minimum angle θ1 and the maximum angle θ2.

The twist angle ω1 of 45° and the tilt angle of 30° under the conditions described in the first embodiment satisfy the expression (7). Therefore, even if a positional misalignment or the like of the fourth resist pattern 47 occurs, the impurity 48 is not implanted into the silicon substrate 30 below the space S, and thus the pocket region 49 may be formed only on the bit contact region I side.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that various changes, substitutions, and alterations could be made hereto without departing from the spirit and scope of the invention.

What is claimed is:

1. A method of manufacturing a semiconductor device having a first memory cell array region and a second memory cell array region, the method comprising:
   forming an active region on a surface layer of a semiconductor substrate;
   forming a first conductive type channel region in the active region;
   forming a gate insulating film on the semiconductor substrate in the channel region;
   forming a first word line extending in a first direction on the gate insulating film in the first memory cell array region, and forming a second word line extending in a second direction crossing the first direction on the gate insulating film in the second memory cell array region;
   forming a resist pattern covering part of an upper surface of the first word line so as to put, in an exposed state, one side surface of the first word line and a bit contact region of the semiconductor substrate; and
   ion-implanting an impurity having the same conductive type as the first conductive type into the active region of the bit contact region side using the resist pattern as a mask,
   wherein the ion implantation into the active region is performed from a direction that is inclined from a direction vertical to the surface of the semiconductor substrate and is oblique with respect to both the first direction and the second direction.

2. The method of manufacturing the semiconductor device according to claim 1, wherein
   in the forming the resist pattern, in a state where one side surface of the second word line and the bit contact region of the semiconductor substrate are exposed, the resist pattern is formed so as to cover part of an upper surface of the second word line, and
   in the ion-implanting the impurity into the active region, the ion implantation is performed a plurality of times each by changing a twist angle.

3. The method of manufacturing the semiconductor device according to claim 2, wherein
   in the forming the first word line and the second word line, the first word line and the second word line are formed so that the first direction is orthogonal to the second direction, and
   in the ion-implanting the impurity in the active region, the ion implantation is performed four times each by changing the twist angle by 90°.

4. The method of manufacturing the semiconductor device according to claim 1, wherein
   in the ion-implanting the impurity in the active region, the angle of implanting the impurity with respect to the direction vertical to the surface of the semiconductor substrate, the angle is selected so that an area that implanting is blocked out by the resist pattern does not reach the first word line.

5. The method of manufacturing the semiconductor device according to claim 1, wherein
in the ion-implanting the impurity in the active region, when there is a space between surface in the first word line and the resist pattern in the first word line due to a manufacturing error, the direction of implanting the impurity with respect to the direction vertical to the surface of the semiconductor substrate is selected within a range so that the first word line shields the space from the ion-implanting.

6. The method of manufacturing the semiconductor device according to claim 1, wherein
an end side surface of the resist pattern is positioned over the center of the upper surface of the first word line.

7. The method of manufacturing the semiconductor device according to claim 1, wherein
the first memory cell array region and the second memory cell array region are included in a first memory macro and a second memory macro each having the same planar shape respectively, and the second memory macro is positioned at a rotation 90° different from the first memory macro within a substrate surface of the semiconductor substrate.

8. The method of manufacturing the semiconductor device according to claim 7, wherein
the planar shape of the first memory macro and the second memory macro is a rectangular shape.

9. The method of manufacturing the semiconductor device according to claim 1, further comprising:
forming an impurity diffused region having another conductive type opposite to the first conductive type in the semiconductor substrate adjacent to a side of the first word line; and
forming a cell capacitor electrically connected to the impurity diffused region.

10. The method of manufacturing the semiconductor device according to claim 9, wherein
the cell capacitor has a capacitor upper electrode formed over the gate insulating film on the semiconductor substrate in the active region, and
the gate insulating film below the capacitor upper electrode serves as a capacitor dielectric film, and the active region below the capacitor upper electrode serves as a capacitor lower electrode.

11. The method of manufacturing the semiconductor device according to claim 10, wherein
the capacitor upper electrode is formed concurrently with the forming the first word line and the second word line.

12. The method of manufacturing the semiconductor device according to claim 9, wherein
the first word line also serves as a gate electrode of a transfer transistor connected to the cell capacitor, and the impurity diffused region is a source/drain extension of the transfer transistor.

* * * * *